(12) United States Patent
Van Zyl

(10) Patent No.: US 11,804,362 B2
(45) Date of Patent: *Oct. 31, 2023

(54) FREQUENCY TUNING FOR MODULATED PLASMA SYSTEMS

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 14 days.

This patent is subject to a terminal disclaimer.

(21) Appl. No.: 17/177,874

(22) Filed: Feb. 17, 2021

(65) Prior Publication Data

US 2021/0175050 A1 Jun. 10, 2021

Related U.S. Application Data

(63) Continuation-in-part of application No. 16/934,257, filed on Jul. 21, 2020, now Pat. No. 11,515,123, (Continued)

(51) Int. Cl.
*H01J 37/32* (2006.01)

(52) U.S. Cl.
CPC .. *H01J 37/32183* (2013.01); *H01J 37/32165* (2013.01); *H01J 37/32935* (2013.01)

(58) Field of Classification Search
None
See application file for complete search history.

(56) References Cited

U.S. PATENT DOCUMENTS

| 3,733,608 A | 5/1973 | McGhay et al. |
| 5,499,201 A | 3/1996 | Wenger et al. |

(Continued)

FOREIGN PATENT DOCUMENTS

| JP | 2004-152606 | 5/2004 |
| JP | 2008-019494 | 1/2008 |

(Continued)

OTHER PUBLICATIONS

Park, Hye Lyun, Search Report and Written Opinion, Korean Intellectual Property Office, dated Jun. 3, 2022, Korea.

(Continued)

*Primary Examiner* — Srinivas Sathiraju
(74) *Attorney, Agent, or Firm* — Neugeboren O'Dowd PC

(57) ABSTRACT

Plasma processing and power supply systems and methods are disclosed. The plasma processing system comprises a high-frequency generator configured to deliver power to a plasma chamber and a low-frequency generator configured to deliver power to the plasma chamber. A filter is coupled between the plasma chamber and the high-frequency generator, and the filter suppresses mixing products of high frequencies produced by the high-frequency generator and low frequencies produced by the low-frequency generator. The plasma processing system also comprises means for frequency tuning the high-frequency generator using a probe signal that is concurrently applied with the power applied to the plasma chamber at the primary frequency.

20 Claims, 36 Drawing Sheets

Related U.S. Application Data which is a continuation-in-part of application No. 16/230,923, filed on Dec. 21, 2018, now Pat. No. 10,720,305.

(56) References Cited

U.S. PATENT DOCUMENTS

| | | | | |
|---|---|---|---|---|
| 5,643,364 | A * | 7/1997 | Zhao | H01J 37/32174 118/723 ER |
| 6,020,794 | A | 2/2000 | Wilbur | |
| 6,046,641 | A * | 4/2000 | Chawla | H03F 1/565 330/276 |
| 6,098,568 | A * | 8/2000 | Raoux | H01J 37/32082 156/345.44 |
| 6,136,388 | A * | 10/2000 | Raoux | H01J 37/32183 438/758 |
| 6,313,587 | B1 * | 11/2001 | MacLennan | H01J 61/025 315/307 |
| 6,391,147 | B2 * | 5/2002 | Imafuku | C23C 16/4483 315/111.21 |
| 6,537,421 | B2 | 3/2003 | Drewery | |
| 6,562,190 | B1 | 5/2003 | Kuthi et al. | |
| 6,587,019 | B2 * | 7/2003 | Chawla | H01J 37/32082 333/167 |
| 6,706,138 | B2 * | 3/2004 | Barnes | H01J 37/32082 156/345.23 |
| 6,887,339 | B1 * | 5/2005 | Goodman | H01J 37/32082 156/345.47 |
| 6,949,887 | B2 * | 9/2005 | Kirkpatrick | H05B 41/24 315/246 |
| 6,958,630 | B2 | 10/2005 | Wantanabe et al. | |
| 7,042,311 | B1 | 5/2006 | Hilliker et al. | |
| 7,049,751 | B2 | 5/2006 | Blackburn et al. | |
| 7,173,495 | B1 | 2/2007 | Kenny et al. | |
| 7,342,361 | B2 * | 3/2008 | Ellingboe | H01J 37/32082 315/111.41 |
| 7,409,649 | B2 * | 8/2008 | Chen | G06F 30/327 716/136 |
| 7,477,711 | B2 | 1/2009 | Kalavitis et al. | |
| 7,768,269 | B2 * | 8/2010 | Pipitone | H01J 37/32091 438/10 |
| 7,777,567 | B2 * | 8/2010 | Polizzo | H05H 1/46 315/111.21 |
| 7,839,223 | B2 | 11/2010 | Van Zyl | |
| 7,868,556 | B2 * | 1/2011 | Xia | H01J 37/32082 315/111.21 |
| 7,879,731 | B2 * | 2/2011 | Collins | H01J 37/32174 156/345.48 |
| 7,886,690 | B2 * | 2/2011 | Ellingboe | H01J 37/32082 315/111.21 |
| 7,967,944 | B2 * | 6/2011 | Shannon | H01J 37/32935 315/111.21 |
| 7,968,469 | B2 * | 6/2011 | Collins | H01J 37/32091 156/345.47 |
| 7,970,562 | B2 * | 6/2011 | van Zyl | G01R 19/0007 702/182 |
| 8,018,164 | B2 * | 9/2011 | Shannon | H05H 1/46 315/111.21 |
| 8,040,068 | B2 | 10/2011 | Coumou et al. | |
| 8,330,432 | B2 * | 12/2012 | van Zyl | H03H 7/40 322/36 |
| 8,576,013 | B2 | 11/2013 | Coumou | |
| 8,622,735 | B2 * | 1/2014 | Morrisroe | H01J 27/16 219/121.36 |
| 8,674,606 | B2 | 3/2014 | Carter et al. | |
| 8,741,095 | B2 * | 6/2014 | Koshimizu | H01J 37/32165 156/345.43 |
| 8,781,415 | B1 | 7/2014 | Coumou et al. | |
| 8,932,430 | B2 | 1/2015 | Srivastava et al. | |
| 8,952,765 | B2 | 2/2015 | Fish, II et al. | |
| 8,980,760 | B2 * | 3/2015 | Agarwal | H01J 37/32165 156/345.48 |
| 9,014,648 | B2 | 4/2015 | Gudem et al. | |
| 9,041,471 | B2 | 5/2015 | Coumou | |
| 9,059,678 | B2 * | 6/2015 | Long | H03H 7/40 |
| 9,088,267 | B2 | 7/2015 | Blackburn et al. | |
| 9,214,901 | B2 | 12/2015 | Owen | |
| 9,263,350 | B2 * | 2/2016 | Kapoor | H01J 37/32082 |
| 9,294,100 | B2 | 3/2016 | Van Zyl | |
| 9,478,397 | B2 | 10/2016 | Blackburn et al. | |
| 9,536,713 | B2 * | 1/2017 | Van Zyl | H01J 37/32935 |
| 9,578,731 | B2 | 2/2017 | Van Zyl | |
| 9,591,739 | B2 | 3/2017 | Bhutta | |
| 9,595,424 | B2 * | 3/2017 | Marakhtanov | H01F 38/14 |
| 9,596,744 | B2 * | 3/2017 | Leeser | H05H 1/46 |
| 9,635,750 | B2 | 4/2017 | Cheung et al. | |
| 9,721,759 | B1 * | 8/2017 | Karlquist | H01J 37/32183 |
| 9,761,414 | B2 * | 9/2017 | Marakhtanov | H01J 37/32532 |
| 9,773,643 | B1 * | 9/2017 | Singhal | C23C 16/045 |
| 9,840,776 | B2 * | 12/2017 | Kapoor | C23C 16/45536 |
| 9,854,659 | B2 | 12/2017 | Van Zyl | |
| 9,979,388 | B2 * | 5/2018 | Volokhine | H03F 3/193 |
| 9,984,859 | B2 * | 5/2018 | Marakhtanov | H03H 7/38 |
| 10,026,592 | B2 * | 7/2018 | Chen | H01J 37/32146 |
| 10,141,163 | B2 * | 11/2018 | Lill | H01J 37/32128 |
| 10,194,518 | B2 | 1/2019 | Van Zyl | |
| 10,224,184 | B2 * | 3/2019 | Van Zyl | H01J 37/32146 |
| 10,249,476 | B2 * | 4/2019 | Marakhtanov | H01J 37/32183 |
| 10,264,663 | B1 * | 4/2019 | Long | H01J 37/32183 |
| 10,312,064 | B2 | 6/2019 | Grede et al. | |
| 10,340,879 | B2 * | 7/2019 | Mavretic | H01J 37/32082 |
| 10,431,428 | B2 * | 10/2019 | Bhutta | H01L 21/31116 |
| 10,720,305 | B2 * | 7/2020 | Van Zyl | H01J 37/32165 |
| 10,741,363 | B1 * | 8/2020 | Burry | H03H 11/28 |
| 10,984,986 | B2 * | 4/2021 | Ulrich | H03H 7/40 |
| 11,074,350 | B2 * | 7/2021 | Huo | G06Q 30/06 |
| 11,150,283 | B2 * | 10/2021 | Ulrich | G01R 25/02 |
| 11,239,056 | B2 * | 2/2022 | Oehen | H01J 37/32899 |
| 11,280,811 | B2 * | 3/2022 | Enzinna | G01R 15/146 |
| 11,289,307 | B2 * | 3/2022 | Bhutta | H01J 37/32183 |
| 11,315,758 | B2 * | 4/2022 | Bhutta | H01L 21/28556 |
| 11,342,160 | B2 * | 5/2022 | Ulrich | H03H 7/40 |
| 11,342,161 | B2 * | 5/2022 | Ulrich | H01L 21/02274 |
| 11,515,123 | B2 * | 11/2022 | Van Zyl | H05H 1/46 |
| 2006/0066247 | A1 | 3/2006 | Koshiishi et al. | |
| 2006/0262889 | A1 | 11/2006 | Kalvaitis et al. | |
| 2007/0006972 | A1 | 1/2007 | Piptone et al. | |
| 2007/0247073 | A1 * | 10/2007 | Paterson | H01J 37/32091 315/111.21 |
| 2008/0180028 | A1 * | 7/2008 | Collins | H01L 21/6831 315/111.21 |
| 2008/0317974 | A1 * | 12/2008 | de Vries | H05H 1/46 315/111.21 |
| 2009/0255800 | A1 * | 10/2009 | Koshimizu | H01J 37/32091 422/186.29 |
| 2009/0315596 | A1 * | 12/2009 | Leming | H03B 21/00 327/119 |
| 2010/0194195 | A1 * | 8/2010 | Coumou | H01J 37/32174 307/24 |
| 2010/0258529 | A1 | 10/2010 | Mori | |
| 2010/0270141 | A1 * | 10/2010 | Carter | H01J 37/3299 422/105 |
| 2011/0272097 | A1 | 11/2011 | Koshiishi et al. | |
| 2012/0074844 | A1 * | 3/2012 | York | H03H 7/40 315/111.21 |
| 2013/0169359 | A1 | 7/2013 | Coumou | |
| 2013/0320852 | A1 * | 12/2013 | Kitano | H01J 37/32935 315/111.21 |
| 2014/0028389 | A1 | 1/2014 | Coumou | |
| 2014/0028398 | A1 * | 1/2014 | Owen | H03F 3/193 330/276 |
| 2014/0062305 | A1 | 3/2014 | Klein et al. | |
| 2014/0097908 | A1 | 4/2014 | Fisk, II et al. | |
| 2014/0155008 | A1 * | 6/2014 | Van Zyl | H01J 37/32155 455/120 |
| 2014/0159580 | A1 * | 6/2014 | Fritsch | H01J 37/32174 315/111.21 |
| 2014/0220913 | A1 * | 8/2014 | Coumou | H01J 37/32183 455/114.3 |
| 2014/0239813 | A1 * | 8/2014 | Van Zyl | H01J 37/32935 315/111.21 |

(56) References Cited

U.S. PATENT DOCUMENTS

| | | | | |
|---|---|---|---|---|
| 2014/0262031 | A1* | 9/2014 | Belostotskiy | H01J 37/3244 239/548 |
| 2014/0263181 | A1* | 9/2014 | Park | H01J 37/32146 216/68 |
| 2014/0305589 | A1* | 10/2014 | Valcore, Jr. | H01J 37/32183 118/712 |
| 2015/0007940 | A1* | 1/2015 | Kaneko | H01J 37/32229 118/723 AN |
| 2015/0270104 | A1* | 9/2015 | Van Zyl | H01J 37/32146 315/111.21 |
| 2015/0348854 | A1* | 12/2015 | Kapoor | C23C 16/45536 438/10 |
| 2016/0111259 | A1 | 4/2016 | Van Zyl | |
| 2016/0113103 | A1* | 4/2016 | Van Zyl | H05H 1/46 315/111.21 |
| 2016/0168701 | A1* | 6/2016 | Kapoor | C23C 16/45536 118/663 |
| 2016/0295677 | A1* | 10/2016 | Leeser | H05H 1/46 |
| 2017/0311431 | A1* | 10/2017 | Park | C23C 16/0245 |
| 2017/0330731 | A1* | 11/2017 | Van Zyl | H01J 37/32183 |
| 2018/0005801 | A1* | 1/2018 | Singhal | H01J 37/32568 |
| 2018/0025891 | A1* | 1/2018 | Marakhtanov | H01L 21/68735 438/714 |
| 2018/0025930 | A1* | 1/2018 | Augustyniak | H01L 21/67207 438/798 |
| 2018/0163302 | A1* | 6/2018 | Kapoor | H01L 21/0262 |
| 2018/0318459 | A1* | 11/2018 | Hancock | A61L 2/03 |
| 2019/0108976 | A1* | 4/2019 | Van Zyl | H01J 37/32183 |
| 2019/0116656 | A1* | 4/2019 | Long | H01J 37/32174 |
| 2019/0247050 | A1* | 8/2019 | Goldsmith | A61B 17/12181 |
| 2019/0287764 | A1* | 9/2019 | Long | H01J 37/321 |
| 2020/0058469 | A1* | 2/2020 | Ranjan | H01L 21/3065 |
| 2020/0203119 | A1* | 6/2020 | Van Zyl | H01J 37/32174 |
| 2020/0350140 | A1* | 11/2020 | Van Zyl | H01J 37/32165 |
| 2021/0086370 | A1* | 3/2021 | Zhang | B25J 9/0084 |
| 2021/0175050 | A1* | 6/2021 | Van Zyl | H01J 37/32165 |
| 2021/0383719 | A1* | 12/2021 | Busch | G09B 19/003 |

FOREIGN PATENT DOCUMENTS

| | | |
|---|---|---|
| JP | 2011-082333 | 4/2011 |
| JP | 2014-44961 | 3/2014 |
| JP | 201811050 | 1/2018 |
| KR | 10-2014-0112586 | 9/2014 |
| TW | 560228 B | 11/2003 |
| TW | I358764 B | 2/2012 |
| TW | I447802 B | 8/2014 |
| WO | 2010082327 | 7/2010 |

OTHER PUBLICATIONS

Young, Lee, "International Search Report and Written Opinion Regarding International Application No. PCT/US2019/052391", dated Dec. 31, 2019, pp. 11, Published in: US.

Sathiraju, Srinivas, "Office Action regardign U.S. Appl. No. 16/230,923", dated Dec. 9, 2019, pp. 25, Published in: US.

Japanese Official Action, dated Jun. 28, 2023, Japanese Patent Office.

* cited by examiner

Lossless filter prototype

Realized filter using lossy components

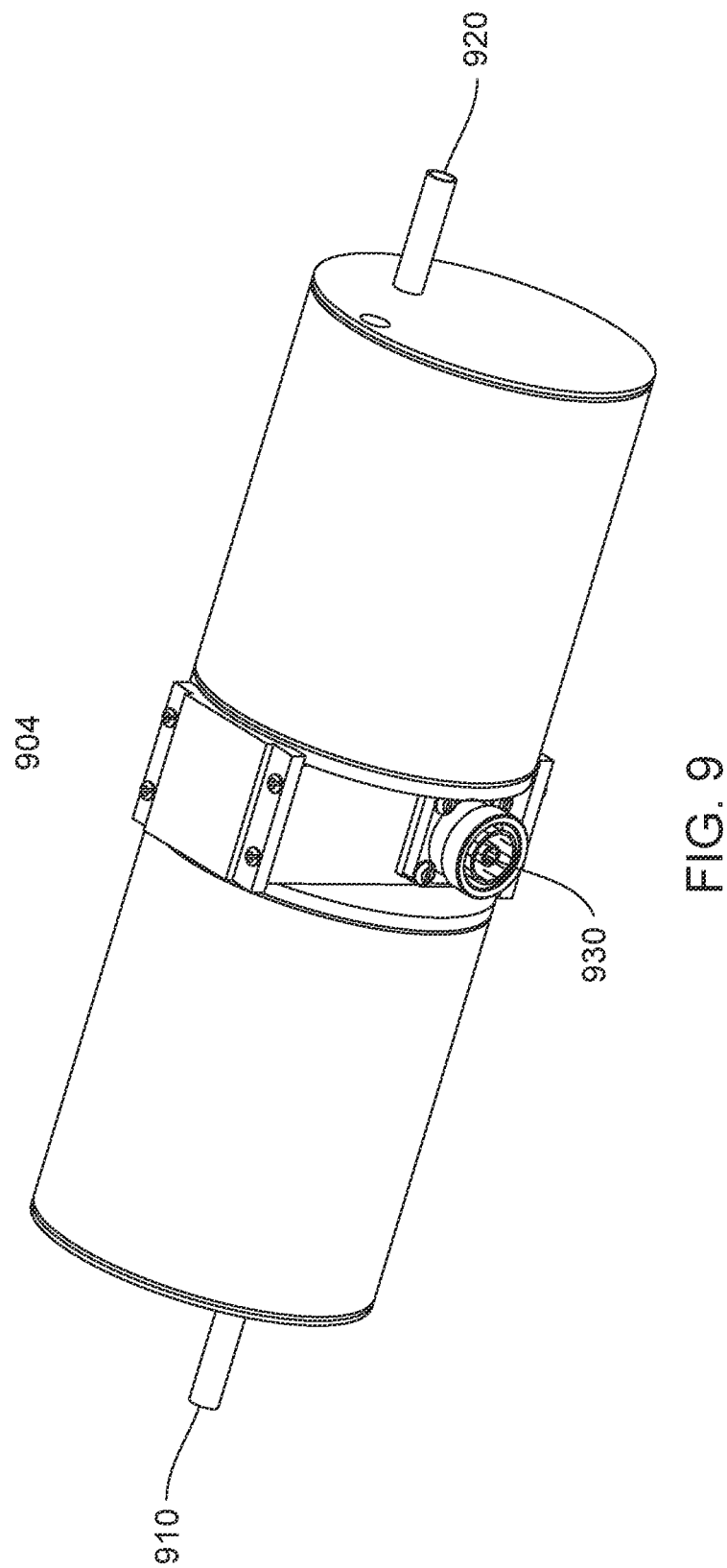

US 11,804,362 B2

FREQUENCY TUNING FOR MODULATED PLASMA SYSTEMS

CLAIM OF PRIORITY UNDER 35 U.S.C. § 120

The present application for Patent is a Continuation in Part of patent application Ser. No. 16/934,257 entitled "Apparatus and System for Modulated Plasma Systems," filed 21 Jul. 2020, which is a Continuation in Part of patent application Ser. No. 16/230,923 entitled "Plasma Delivery System for Modulated Plasma Systems" filed 21 Dec. 2018, and issued as U.S. Pat. No. 10,720,305 on Jul. 21, 2020, and all of the above-identified applications are assigned to the assignee hereof and hereby expressly incorporated by reference herein.

BACKGROUND

Field

The present disclosed embodiments relate generally to plasma processing systems, and more specifically to plasma processing systems with modulated plasma.

Background

Plasma processing systems for etching and deposition have been utilized for decades, but advancements in processing techniques and equipment technologies continue to create increasingly more complex systems. These increasingly complex systems lead to more problematic interactions between multiple generators driving the same plasma system.

SUMMARY

An aspect may be characterized as a power generation system comprising a high-frequency generator configured to apply power to a plasma chamber at a primary frequency and a filter configured to suppress mixing products to limit variation of a time-varying load reflection coefficient presented to the high-frequency generator. The power generation system also includes a frequency-tuning subsystem configured to apply, while the high-frequency generator is applying power at the primary frequency, a probe signal comprising one or more probe frequencies and adjust the primary frequency of the high-frequency generator in response to the one or more probe frequencies indicating an improved measure of performance.

Another aspect may be characterized as a method for automated frequency tuning of a power generation system comprising applying a primary power signal at a primary frequency to a plasma load with a high-frequency generator and applying a probe signal at one or more probe frequencies to the plasma load. Mixing products are suppressed with a filter to reduce variation of a time-varying load reflection coefficient presented to the high-frequency generator, and the primary frequency is adjusted based upon a measure of performance in response to probe signal.

Yet another aspect may be characterized as a plasma processing system comprising a plasma chamber, a high-frequency generator configured to apply power to a plasma chamber at a primary frequency, and a low-frequency generator to apply power to the plasma chamber at a low frequency. A filter in the system is configured to suppress mixing products of the primary frequency and the low frequency to limit variation of a time-varying load reflection coefficient presented to the high-frequency generator. And the system comprises means for frequency tuning the high-frequency generator using a probe signal that is concurrently applied with the power applied to the plasma chamber at the primary frequency.

BRIEF DESCRIPTION OF THE DRAWINGS

FIG. 9 is a perspective view of an exemplary water-cooled filter design with two parallel helical resonators;

DETAILED DESCRIPTION

Interaction between generators driving the same plasma where one of the generators modulates the load seen by another generator is becoming increasingly problematic as power levels are increased; thus, there is a need for new and improved methods and systems for dealing with this problem.

The word "exemplary" is used herein to mean "serving as an example, instance, or illustration." Any embodiment described herein as "exemplary" is not necessarily to be construed as preferred or advantageous over other embodiments.

Figure 1:
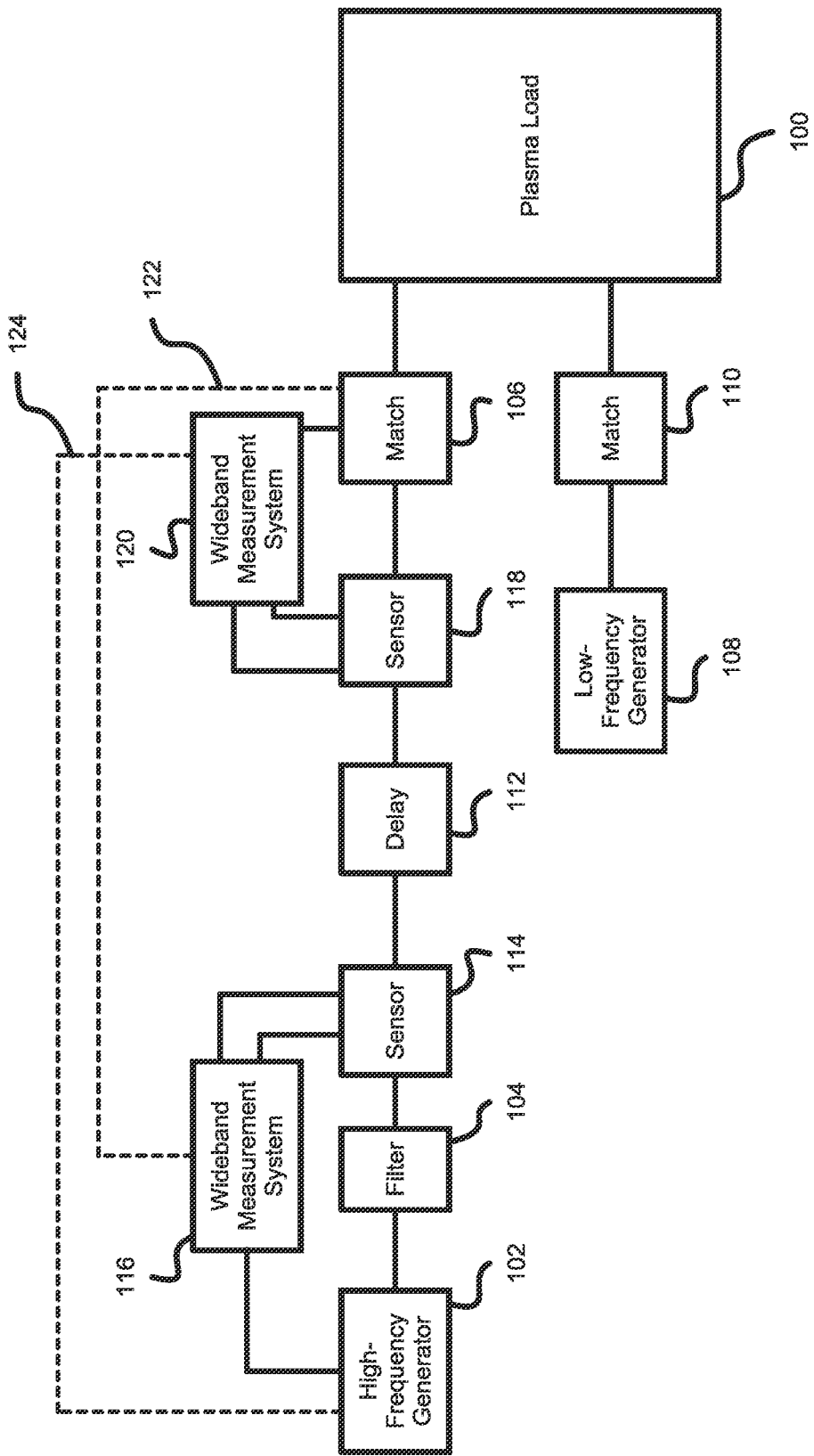
FIG. 1 is a block diagram depicting a power supply system and a plasma processing system.

Referring to FIG. 1, shown is a block diagram depicting an exemplary environment in which embodiments may be implemented. As shown, a plasma load of a plasma chamber 100 is coupled to a high-frequency generator 102 via a filter 104 and a matching network 106 (also referred to as a match 106). In addition, a low-frequency generator 108 is also coupled to the plasma load via match 110. In many applications the match 106 may be combined with the match 110. Also shown are optional wideband measurement components 114, 116, 118, and 120 and an optional delay element 112. The optional delay element 112 can be realized using a length of coaxial cable or a fixed or variable RLCM (i.e., a circuit containing resistors, inductors, capacitors and coupled inductors) circuit or a circuit containing distributed circuit elements (i.e. transmission line circuits). Also shown are optional connections 122 and 124 that allow one of the optional wideband measurement systems 116, 120 to take over functionality of the other if the optional delay element 112 is properly characterized.

Although the high-frequency generator 102 and the low frequency generator 108 may each operate over a range of frequencies, in general, the high-frequency generator 102 operates at a frequency that is higher than the low-frequency generator 108. In many embodiments, the high-frequency generator 102 may be a generator that delivers RF power to the plasma load in the plasma chamber 100 in the 10 MHz to 200 MHz frequency range, and the low frequency generator 108 may be, for example, in the 100 kHz to 2 MHz range. So, exemplary frequency ratios of the frequency of the low-frequency generator 108 to that of the high-frequency generator 102 are between 0.0005 and 0.2. In many embodiments for example, the frequency ratio of the frequency of the low-frequency generator 108 to that of the high-frequency generator 102 is less than 0.05, and in some embodiments the frequency ratio of the low-frequency generator 108 to the high-frequency generator 102 is less than 0.01. For example, the ratio may be 1:150 or about 0.0067.

In terms of applications, the high-frequency generator 102 may be used to ignite and sustain the plasma load in the plasma chamber 100, and the low-frequency generator 108 may be utilized to apply a periodic voltage function to a substrate support of the plasma chamber 100 to effectuate a desired distribution of ion energies at a surface of a substrate in the plasma chamber 100.

With respect to power levels, the low-frequency generator 108 may apply a relatively large amount of power (e.g., in the 10 kW to 30 kW range) to the plasma load of the plasma chamber 100. The large amount of power applied to the plasma at low frequency modulates the plasma impedance presented to a high-frequency generator 102.

Applicant has found that, in prior systems with a generator (e.g., the low-frequency generator 108) that modulates the plasma load, power is not measured at a sufficient number of mixing products generated by the system. And failure to do so is a problem that leads to errors on the order of 100% or more in power measurement. Typical approaches taken in the past (when there is low-frequency power perturbing the plasma) is to simply filter out the mixing frequency components that result from applying high-frequency power to a load that is modulated at a low frequency (e.g., filtering out 59.6 MHz and 60.4 MHz components when the low and high generator frequencies are 400 kHz and 60 MHz, respectively). But when a low pass filter is utilized, the apparent complex impedance trajectory collapses to a point, and misleadingly, it appears as though the high-frequency generator 102 is delivering power into 50 ohms.

Figure 2:
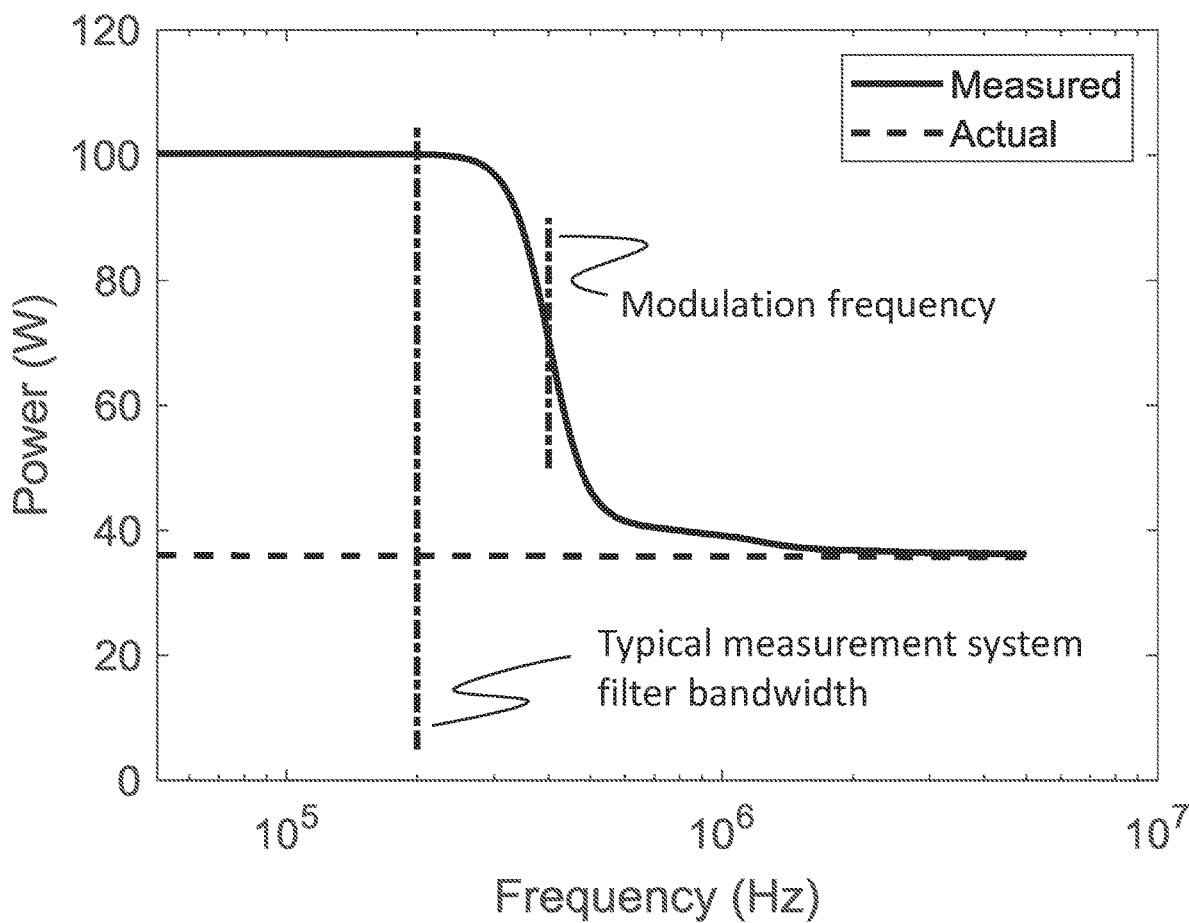
FIG. 2 is a graph depicting how power may be perceived by measuring power using different measurement-system-filter bandwidths.

Referring to FIG. 2, shown is a graph depicting how power may be perceived by measuring power using different measurement-system-filter bandwidths. The measurement system filtering is applied after down conversion or demodulation of the measured signal; thus, the measurement system filters frequency components centered on the generator output frequency. For example, a measurement system bandwidth of 100 kHz applied to a generator producing a 60 MHz output will suppress frequency components below 59.9 MHz and above 60.1 MHz. As shown, when the filter bandwidth of a measuring system is selected to be less than the modulation frequency of the plasma, then it appears as though there is much less reflected power than there actually is (so, it appears as though only forward power is going to the plasma load), but in reality, that is not what is happening.

In contrast, when power is measured with sufficient bandwidth (e.g., by one or both of the wideband measurement systems 116, 120), it is clear that only a fraction of the power (e.g., only half the power) is going to the plasma load. So, an aspect of the present disclosure comprises adjusting a measurement system so that its filter bandwidth exceeds the modulation frequency to capture mixing products at higher frequencies. U.S. Pat. No. 7,970,562 entitled System, Method, and Apparatus for Monitoring Power (which is incorporated herein by reference) discloses types of sensors (e.g., directional coupler or voltage/current (VI) sensor) that may be used to realize the sensors 114, 118 in addition to the sampling and processing techniques that may be utilized by the wideband measurement systems 116, 120 to achieve a filter bandwidth that is capable of capturing information about the mixing products at higher frequencies. It should be noted that the filter bandwidth if the measurement systems 116, 120 should not be confused with the filter 104.

Figure 3A:
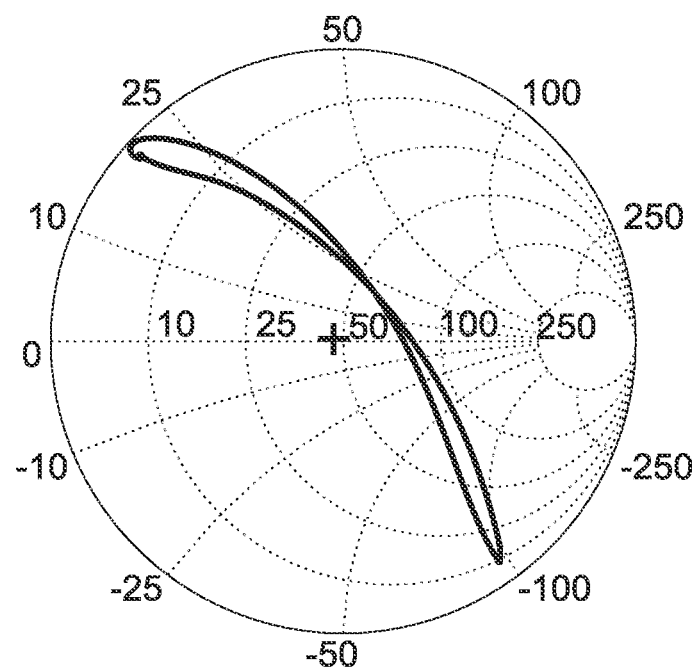
FIGS. 3A and 3B are graphs depicting modulation of load reflection coefficient.
Figure 3B:
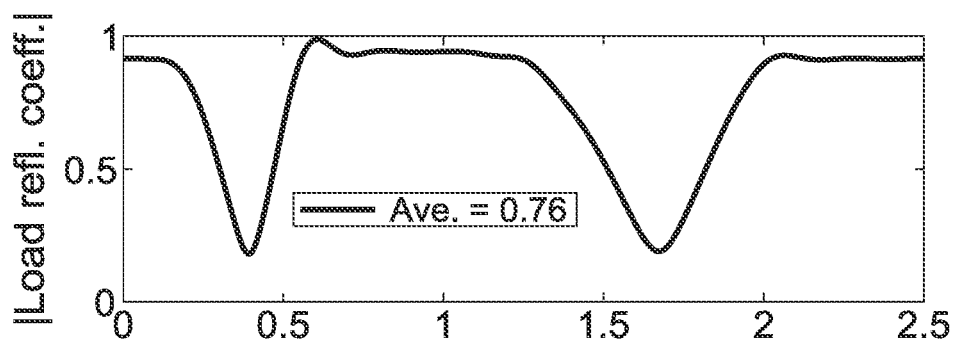
Figure 3C:
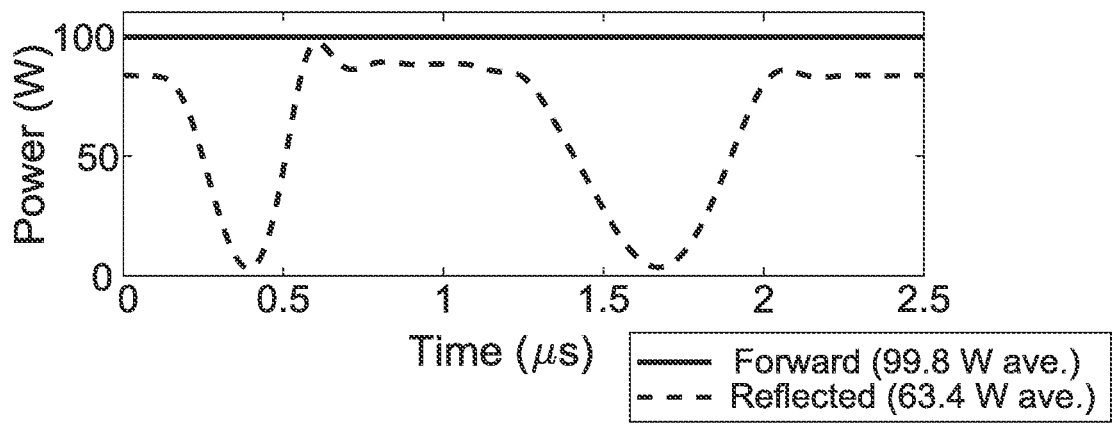
FIG. 3C is a graph depicting the resulting reflected power that may be seen by the high-frequency generator when the filter depicted in FIG. 1 is not utilized.

Another problem is that the high-frequency generator 102 needs to deliver power to a time varying load (the modulated plasma load) where the time-averaged load reflection coefficient magnitude is high. Referring to FIGS. 3A and 3B for example, shown are graphs depicting the load reflection coefficient that is seen by the high-frequency generator 102 over the time period of one cycle of the low frequency generator 108, and FIG. 3C is a graph depicting resulting reflected power that may be seen by the high-frequency generator 102 when the filter 104 depicted in FIG. 1 is not utilized. As shown, the peak load reflection coefficient magnitude seen by the high-frequency generator 102 may be close to 1 (and may even exceed 1 meaning net power is flowing from the plasma load to the high-frequency generator 102) while an average load reflection coefficient magnitude seen by the high-frequency generator 102 may be 0.76. The relatively high load reflection coefficient magnitude means that, in general, the high-frequency generator 102 may struggle to apply a desired level of power and be more susceptible to failure. Thus, the high-frequency generator 102 may require many more power devices (bipolar transistors, MOSFETS, etc.) than would normally be required to deliver the required amount of power to the plasma chamber 100.

Aspects of the disclosure herein are directed to solutions to remove or mitigate against the effects of plasma modulation. An aspect depicted in FIG. 1 is the depicted filter 104. As discussed above, absent the depicted filter 104, the modulated plasma load presents a time varying nonlinear load to the high-frequency generator 102, which presents challenging problems.

In many embodiments, the filter 104 depicted in FIG. 1 may be implemented as an extremely-narrow bandwidth, high-power filter that is disposed between the high-frequency generator 102 and the plasma chamber 100. The filter 104 may have reasonably low losses at the frequency of the high-frequency generator 102 and suppress the mixing products sufficiently to limit the variation in load reflection coefficient presented to the high-frequency generator 102 at the input to the filter 104 while being stable under application of high power. When implemented, the filter 104 may have a narrow bandwidth to filter the side-band frequencies. As used herein, bandwidth is defined as a frequency range that exists between a lower-cutoff frequency and a higher-cutoff frequency, wherein each of the cutoff frequencies is 3 dB below the maximum center or resonant peak while attenuating or weakening other frequencies outside of these two points by more than 3 dB.

In some embodiments for example, the low-frequency-generator 108 is realized by a 400 kHz generator and the high-frequency generator 102 is realized by a 60 MHz RF generator; thus, presenting a frequency ratio of 1 to 150. As a consequence, in these embodiments the filter 104 may suppress power at a frequency that is less than a percent away from a center frequency. As a specific example, the low-frequency generator 108 may be a bias supply that applies a voltage function to a substrate support and the high-frequency generator 102 is a source generator that ignites and sustains a plasma.

And in many embodiments, the suppression of power at the frequency of the high-frequency generator 102 is, at most, 2 dB, and the suppression of power at frequencies more than the frequency of the low-frequency generator 108 from the frequency of the high-frequency generator 102 is at least 2 dB higher than the suppression of power at the frequency of the high-frequency generator 102. In some implementations, the bandwidth of the filter 104 is 2% (or less) of the frequency of the high-frequency generator 102. If the high-frequency generator 102 is realized by a 60 MHz RF generator, for example, the bandwidth of the filter may be 1.2 MHz or less.

Figure 4A:
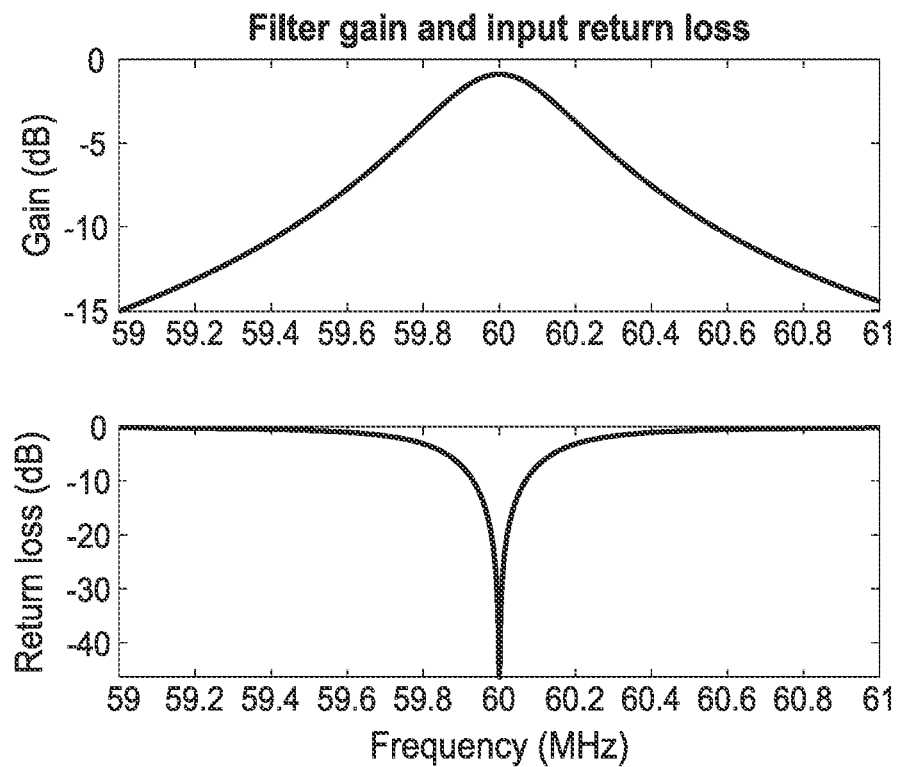
FIG. 4A comprises two graphs depicting performance aspects for an exemplary design of the filter depicted in FIG. 1.
Figure 4B:
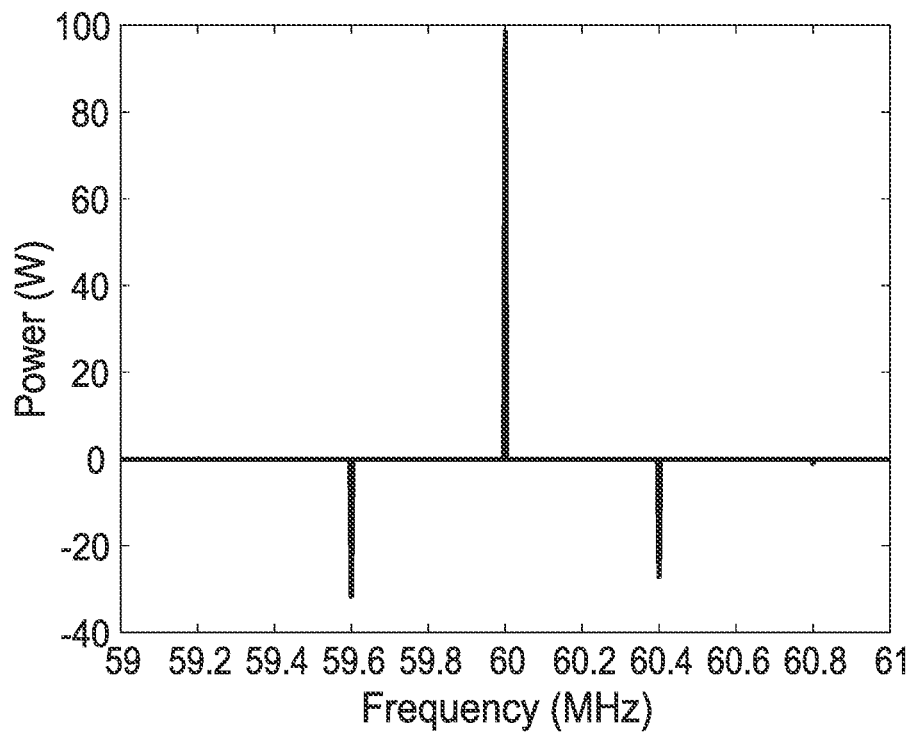
FIG. 4B is a graph depicting the net power that may be delivered to the plasma load by the high-frequency generator at the fundamental and mixing product frequencies when the filter depicted in FIG. 1 is not utilized.

Referring briefly to FIG. 4A, shown are graphs depicting performance aspects for exemplary designs of the filter 104. In FIG. 4A, a bandwidth of the filter 104 has a center frequency of about 60 MHz, and at a fraction of a megahertz away from the center frequency, power is suppressed by 8 dB. FIG. 4B shows the net power that may be delivered to the plasma load by the high-frequency generator when the filter depicted in FIG. 1 is not utilized. FIG. 4B shows that the filter with a response such as shown in FIG. 4A will allow power delivered to the plasma load at the fundamental frequency of 60 MHz to pass from the high-frequency generator 102 to the plasma load with relatively high efficiency and suppress the power reflected from the plasma load back to the high-frequency generator 102.

But those of ordinary skill in the art have not been led to implement the filter 104 with characteristics that are similar to the filter characteristics in FIG. 4A. A lack of awareness of the underlying problem of plasma modulation is one reason. But in addition, designing a filter with the characteristics depicted in FIG. 4A is challenging (even at low power levels). But in many embodiments the filter 104 handles high amounts of power (e.g., several kW of power), and the high-power and narrow-band combination is not a combination that those of skill in the art are likely to try.

Figure 5A:
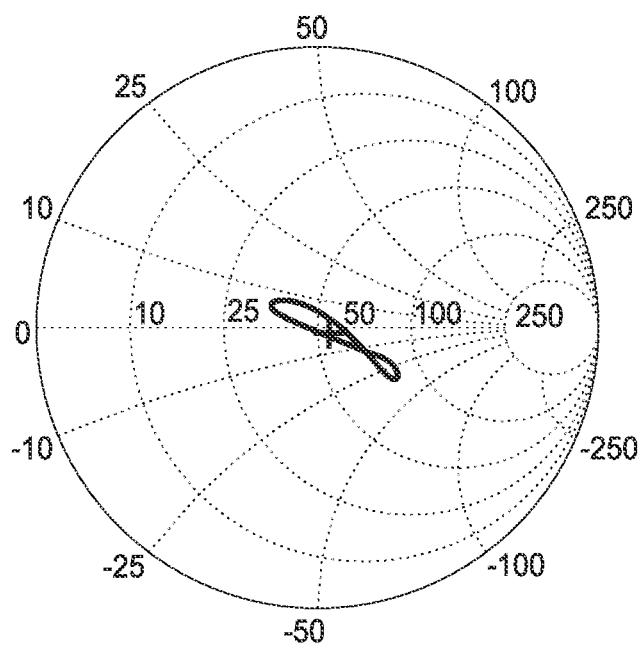
FIGS. 5A and 5B are graphs depicting modulation of load reflection coefficient.
Figure 5B:
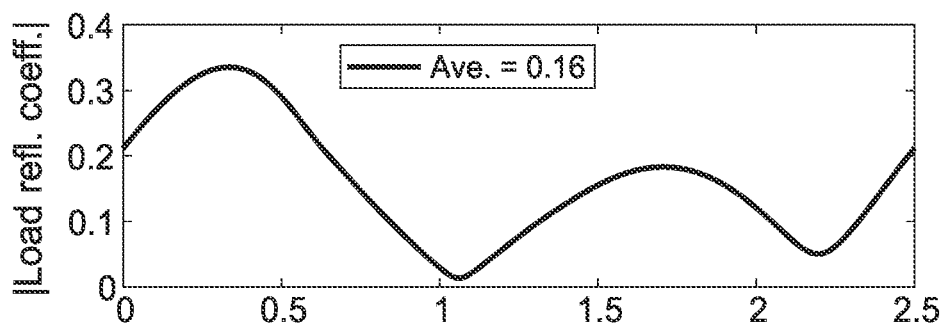

As discussed above, FIGS. 3A and 3B depict a load reflection coefficient as seen by the high-frequency generator when the filter 104 is not utilized. And FIGS. 5A and 5B depict a load reflection coefficient as seen by the high-frequency generator 102 when an exemplary filter 104 is implemented. As shown in FIG. 5A, when the filter 104 is deployed, the reflection coefficient is compressed to stay much closer to the center of the graph (as compared to the load reflection coefficient in FIG. 3A) over the cycle of the plasma's modulation.

Figure 5C:
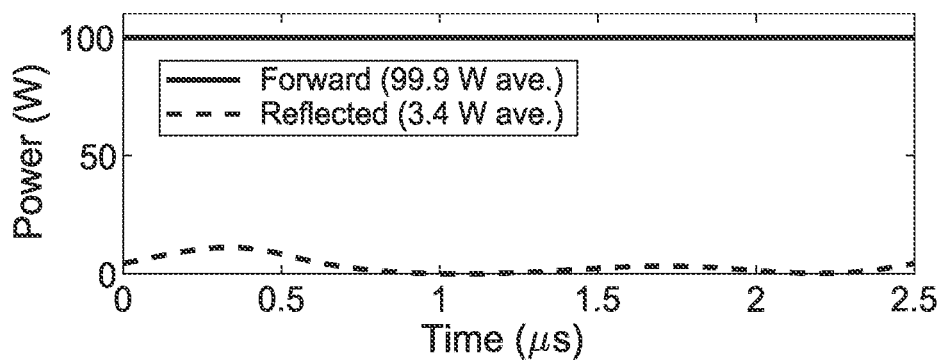
FIG. 5C is a graph depicting resulting reflected power that may be seen by the high-frequency generator when the filter depicted in FIG. 1 is utilized.

FIG. 3B depicts reflection coefficient magnitude in the time domain without the filter 104 being utilized. The corresponding level of forward power (close to 100 watts) depicted in FIG. 3C is much lower than the power utilized during plasma processing, but the reflection coefficient depicted in FIG. 3B, and relative magnitudes of forward and reflected power in FIG. 3C, is instructional. As shown, forward power is 99.8 watts and reflected power is 63.4 watts. In contrast, as shown in FIG. 5C, with the filter 104 in place, there are 99.9 watts of forward power and 3.4 watts of reflected power; thus, the high-frequency generator 102 is placed under much less stress. And on the load side of the filter 104, as shown in FIG. 6C, the filter 104 may increase the average forward power.

Figure 7:
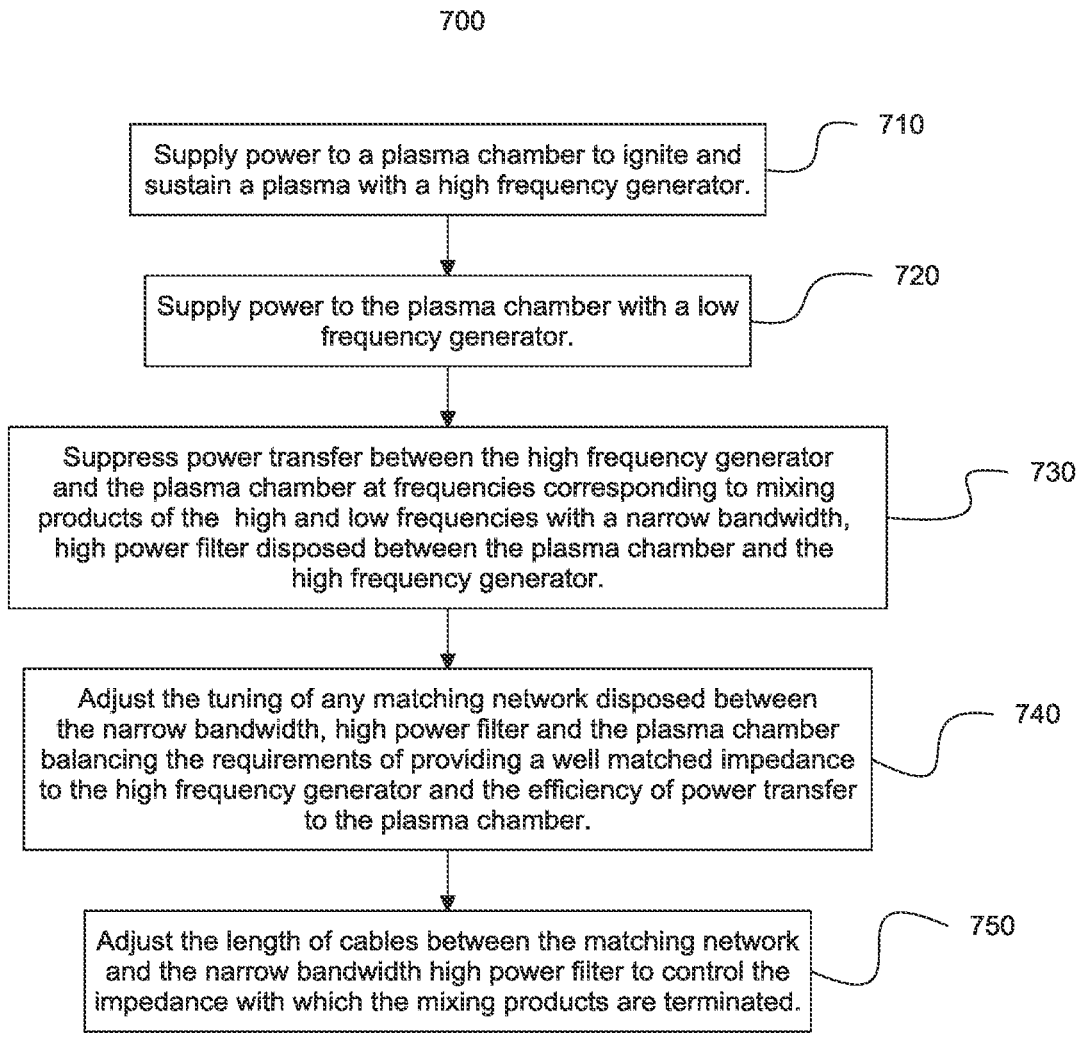
FIG. 7 is a flowchart depicting a method that may be traversed in connection with embodiments disclosed herein.

Referring to FIG. 7, shown is a flowchart 700 depicting a method for plasma processing in a modulated plasma system. As shown, power is supplied to the plasma chamber 100 with the high-frequency generator 102 to ignite and sustain a plasma (Block 710). In addition, power is supplied to the plasma chamber 100 with the low-frequency generator 108 (Block 720). Power transfer between the high-frequency generator 102 and the plasma chamber 100 is suppressed at frequencies corresponding to mixing products of the high and low frequencies with the filter 104 disposed between the plasma chamber 100 and the high-frequency generator (Block 730). The tuning of the matching network 106 may be adjusted (e.g., optimized) to balance the requirements of providing a well-matched impedance to the high-frequency generator 102 and the efficiency of power transfer to the plasma chamber 100 (Block 740).

Figure 6A:
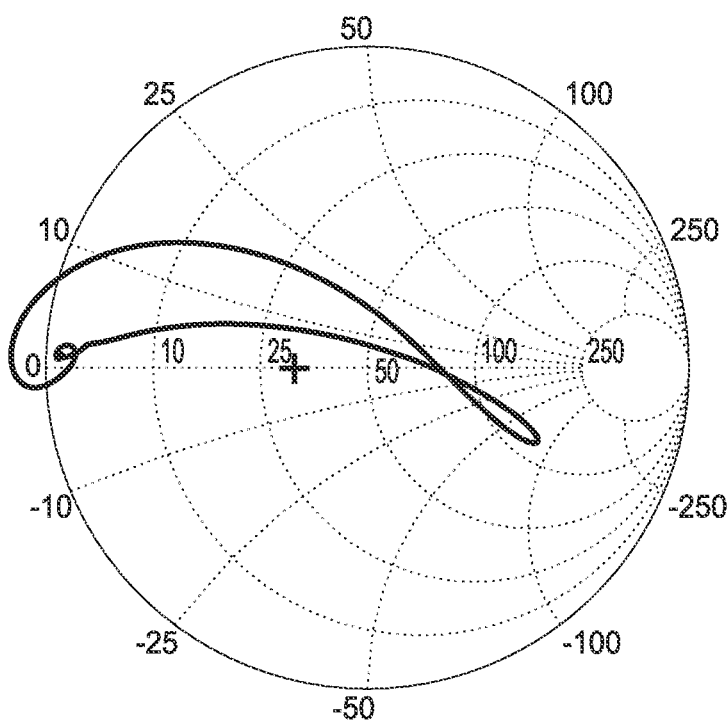
FIGS. 6A and 6B are graphs depicting modulation of load reflection coefficient.
Figure 6B:
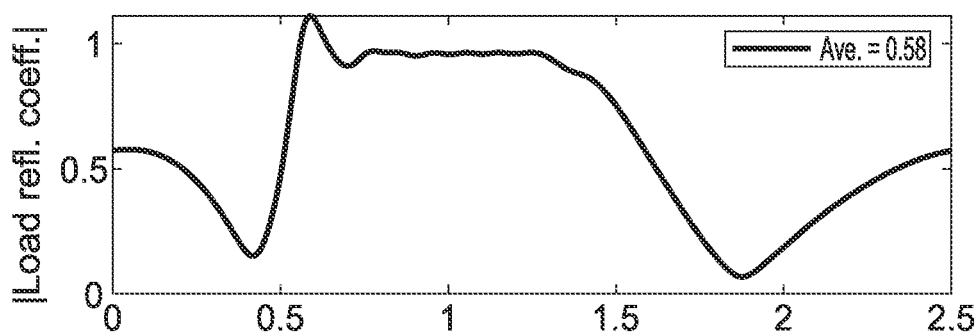
Figure 6C:
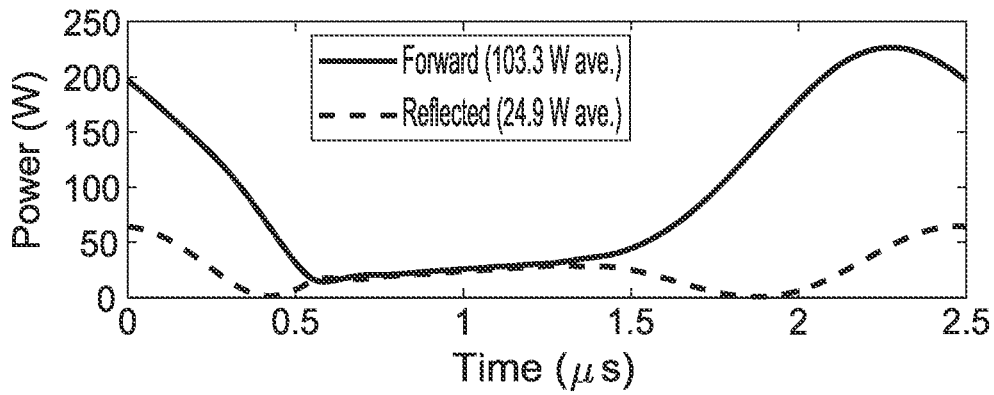
FIG. 6C is a graph depicting resulting reflected power that may be seen by the filter depicted in FIG. 1.

Referring briefly back to FIG. 6A, note that the trajectory of the load reflection coefficient is not symmetrical around the origin as is the case in FIG. 3A. This is a characteristic of the impedance required on the load side of the filter 104 in order to match the input of the filter 104 to a load reflection coefficient that is close to zero and get efficient power transfer from the high-frequency generator 102 to the plasma load. The average load reflection coefficient on the load side of the filter 104 is indicated with a "+" in FIG. 6A. The average value of the load reflection coefficient on the load side of the filter 104 as indicated in FIG. 6A is approximately −0.23−j0.00. The average value of the load reflection coefficient on the high-frequency generator 102 side of the filter 104 as indicated in FIG. 5A is approximately 0.04−j0.02. This illustrates an aspect of using this filter 104, namely that the load reflection coefficient on the load side of the filter 104 is not tuned to a matched load (50 ohm in most systems), but is typically set to achieve a low, time-averaged load reflection coefficient magnitude as measured by a wideband measurement system. As a consequence, in many implementations, the wideband measurement component 116 or 120 is utilized to capture at least the first order mixing products. The wideband measurement systems 116 or 120 may be implemented as an integral component of the matching network 106, the high-frequency generator 102, or may be implemented as a separate component. Thus, the step of adjusting the matching network at Block 740 is different from what is normally required of a matching network 106.

In many implementations, the impedance presented to the filter 104 by the plasma chamber 100 is adjusted to optimize efficiency of power transfer from the high-frequency generator 102 to the plasma chamber 100. For example, the time-average of an absolute value of the load reflection coefficient presented to the filter may be minimized, and the load reflection coefficient may be measured (e.g., by the wideband measurement system 116 or 120) using a bandwidth at least equal to the frequency of the low-frequency generator 108. It is also contemplated that a time-average of a load reflection coefficient is optimized away from 0+j0.

Referring again to FIG. 7, a length of cables between the matching network 106 and the filter 104 may be adjusted (e.g., optimized) to control the impedance with which the power mixing products are terminated (Block 750). Although cable lengths (between a match network and a plasma processing chamber) are adjusted in other plasma processing systems (e.g., for stability), when the filter 104 is used, there are additional considerations when choosing this cable length, namely: the termination impedance provided to the plasma system at the frequencies of the mixing products by the filter 104; cables connecting the filter 104 to the matching network 106; and the matching network 106. Changing the cable length changes the nature of the modulation on the load side of the filter 104. This cable length also affects frequency tuning in multi-state applications; thus, the choice of this cable length may be more complicated than in prior plasma processing systems.

Figure 8A:
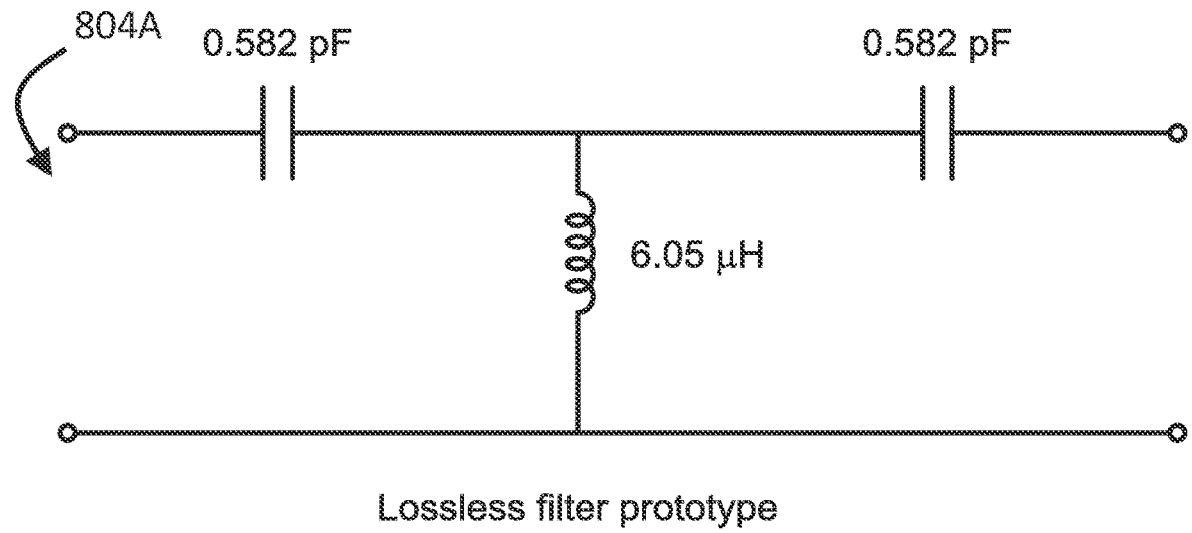
FIGS. 8A and 8B are diagrams depicting equivalent circuits of embodiments of the filter described with reference to FIG. 1.
Figure 8B:
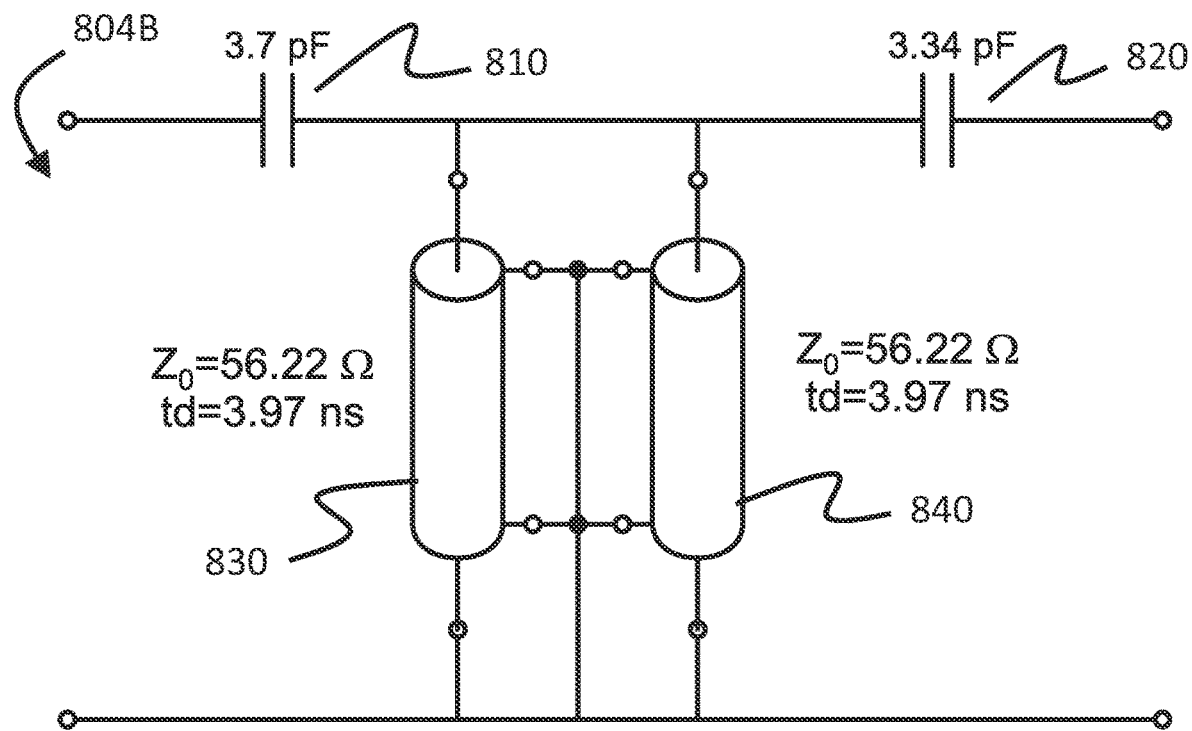

FIGS. 8A and 8B are equivalent circuits of embodiments of the filter 104 described with reference to FIG. 1. FIG. 8A shows the equivalent circuit of a lossless prototype, and FIG. 8B shows the equivalent circuit of the filter 104 when reduced to practice using realizable lossy components.

There are other ways of realizing such a narrowband, high power filter (for example using a large ring resonator or cavity), but in all cases careful attention must be paid to high voltages, high currents, and high-power dissipation present in such filters.

Referring next to FIG. 9, shown is a perspective view of the exterior of a water-cooled filter 904 designed with two parallel helical resonators. The filter contains two water connections 910 and 920 for passing water through the filter for cooling, an input connector 930, and an output connector (not visible in this view).

Figure 10:
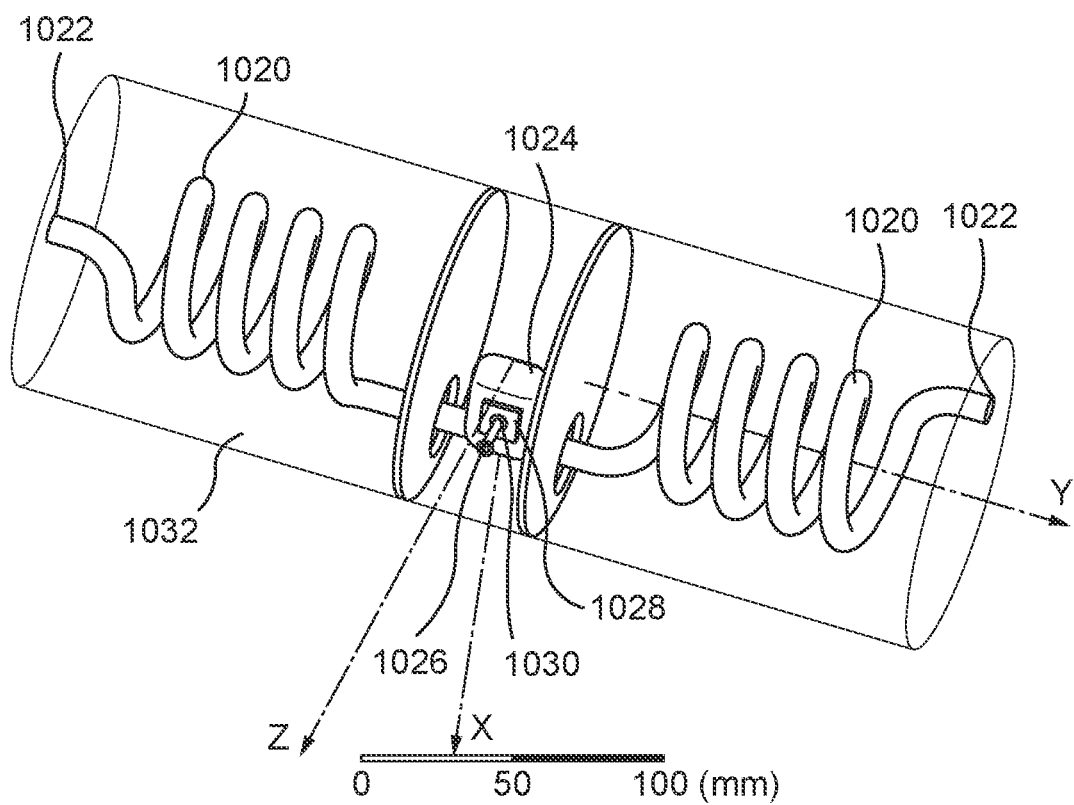
FIG. 10 is a view of the interior of a water-cooled filter design with two parallel helical resonators.

FIG. 10 is a view of the interior of the filter 904 design with two parallel helical resonators. As shown, each of the helical resonators comprises a hollow helical coil 1020, and each hollow helical coil 1020 is coupled to a copper block 1024. Extending from the copper block 1024 are copper straps 1026 and insulating the copper straps 1026 from the copper block 1024 are ceramic insulators 1028. In this implementation, metallization 1030 is disposed on the ceramic 1028 to form input and output capacitors 810 and 820. In addition, each hollow helical coil 1020 comprises a grounded end 1022. The filter 904 also comprises a potted cylindrical enclosure 1032 (represented transparently for purposes of viewing internal components of the filter 104) that surrounds the hollow helical coils 1020 and the copper block 1024.

Figure 11:
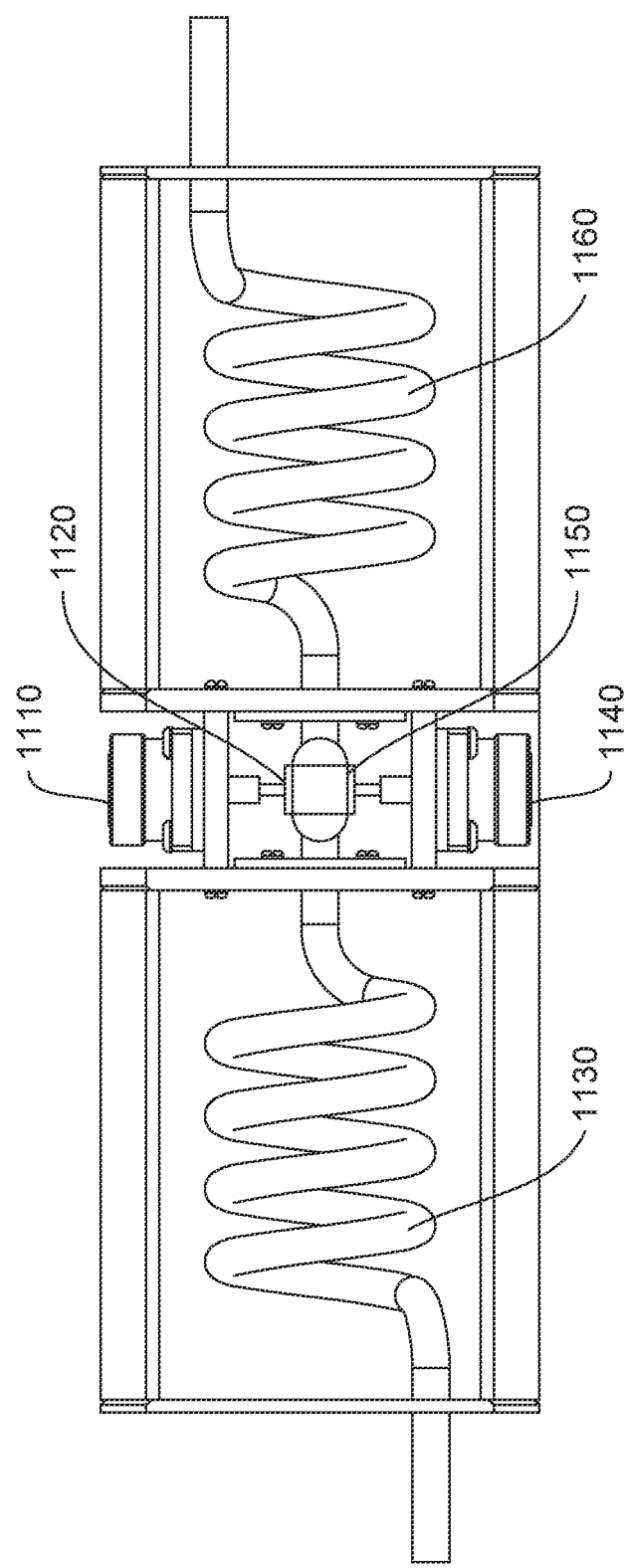
FIG. 11 is a cutaway view of a water-cooled filter design with two parallel helical resonators.

FIG. 11 shows a cutaway view of the filter 904. This view shows how the copper straps 1026 connect to the input and output connectors, 1110 and 1140, to the capacitors formed on the ceramic insulators 1120 and 1150. This view also shows how the hollow helical coils 1130 and 1160 connect to the copper block 1024.

Figure 12:
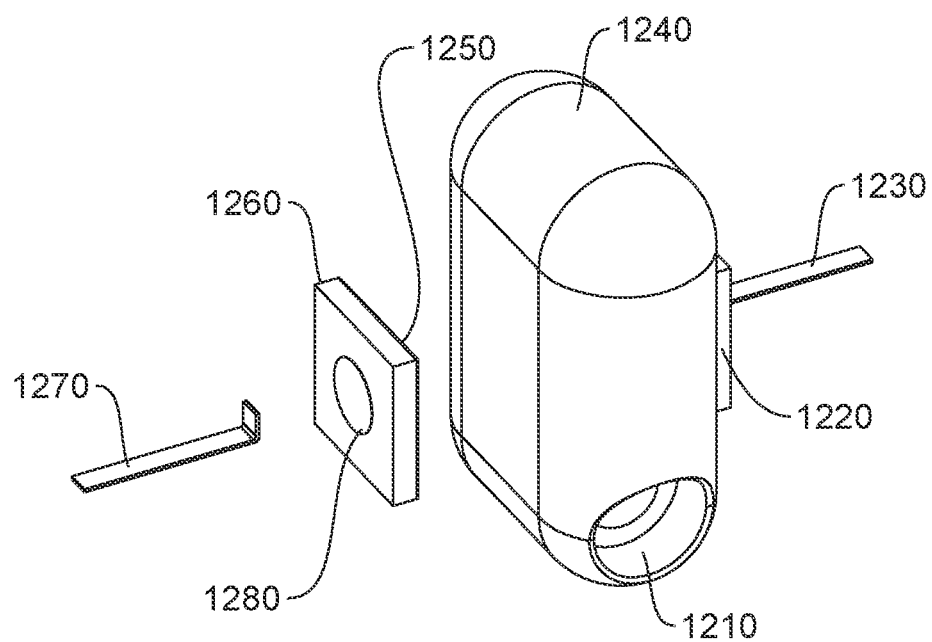
FIG. 12 is a detail view of the capacitor block of a water-cooled filter design with two parallel helical resonators.

FIG. 12 shows more detail of the copper block 1240 (1024 in FIG. 10). This assembly provides the required capacitive coupling from the input and output to the helical resonators. Due to the small value of the capacitors required, the high voltage the capacitors must withstand, and the power the capacitors must dissipate, implementing the capacitors on a ceramic substrate is used in the design of the filter. The copper block contains a water channel 1210 into which the hollow helical coils are attached (by e.g. soldering). The capacitors formed on the ceramic insulators 1220 and 1260 are thus water cooled. The ceramic insulators have front and back metallization 1280 and 1250, respectively. The size of the front metallization 1280 controls the capacitance realized by the assembly. The ceramic insulators can be attached to the copper block 1240 using electrically conductive epoxy. The straps 1270 and 1230 can be soldered to the front metallization and to the connectors 1110 and 1140.

Figure 13:
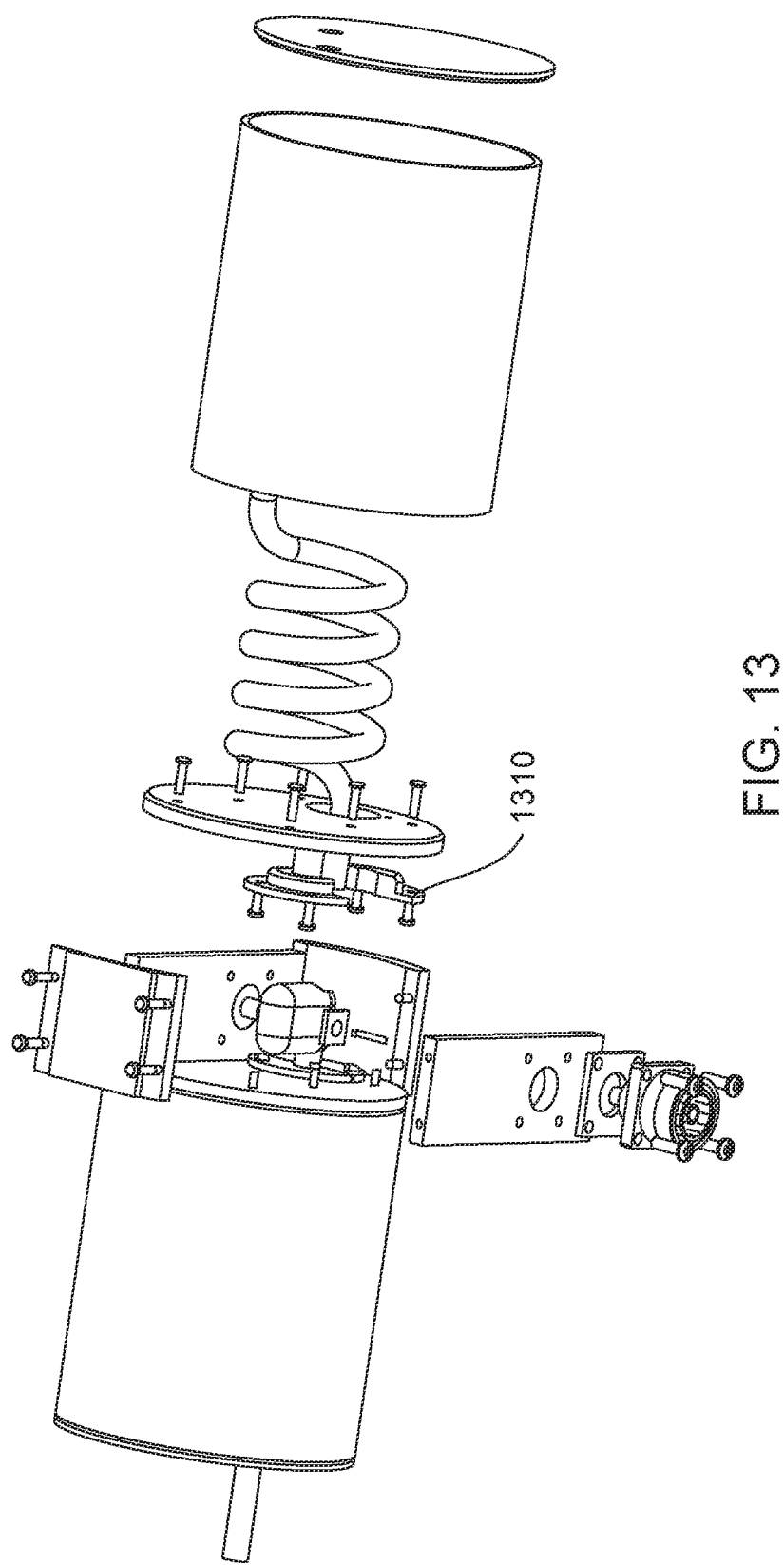
FIG. 13 is an exploded view of a water-cooled filter design with two parallel helical resonators.

FIG. 13 shows an exploded view of the filter 904. An insulating bracket 1310 holds the hollow helical coils in place and provides mechanical stability to the assembly. The bracket is made from a suitable low loss dielectric material, e.g. PTFE plastic or ceramic and contains holes to allow the potting material to flow through. Due to the high voltages that may be encountered in this design, the high voltage area of the filter is potted (e.g. using silicone dielectric gels) to reduce the risk of failure due to the breakdown of air. Alternatively, the entire assembly can be evacuated to a high vacuum, filled with a high-quality dielectric liquid, or filled with an insulating pressurized gas such as, but not limited to, sulfur hexafluoride (SF6).

It should be recognized that those of ordinary skill in the art, in view of the present disclosure, are able to design aspects of the helical coils 1020 (e.g., a number of turns, radius, length, pitch, inner and outer coil diameter, and outside diameter of coil) to achieve the desired bandwidth and heat dissipation. It should also be recognized that variations of the design of the filter 904 depicted in FIGS. 9-13 are certainly contemplated.

Using helical resonators close to resonance on the low frequency or inductive side of resonance rather than an inductor achieves a similar bandwidth as compared to a design using an inductor, but in contrast to a design with an inductor, the helical resonators provide a smaller effective inductance. In addition, using two resonators in parallel allows ground-connected water cooling of the entire assembly where the water system can remain grounded. More specifically, water provided from the ground-connected water system is fed through the hollow helical coils 1020 enabling a large amount of heat to be dissipated. For example, the filter 904 (and variations of the filter 904) may operate at relatively high-power levels (e.g., in the 1 kW to 30 kW power range). By virtue of its design, the filter 904 (and its variations) may operate at relatively high-power levels while operating at efficiencies of at least 75%.

Figure 14:
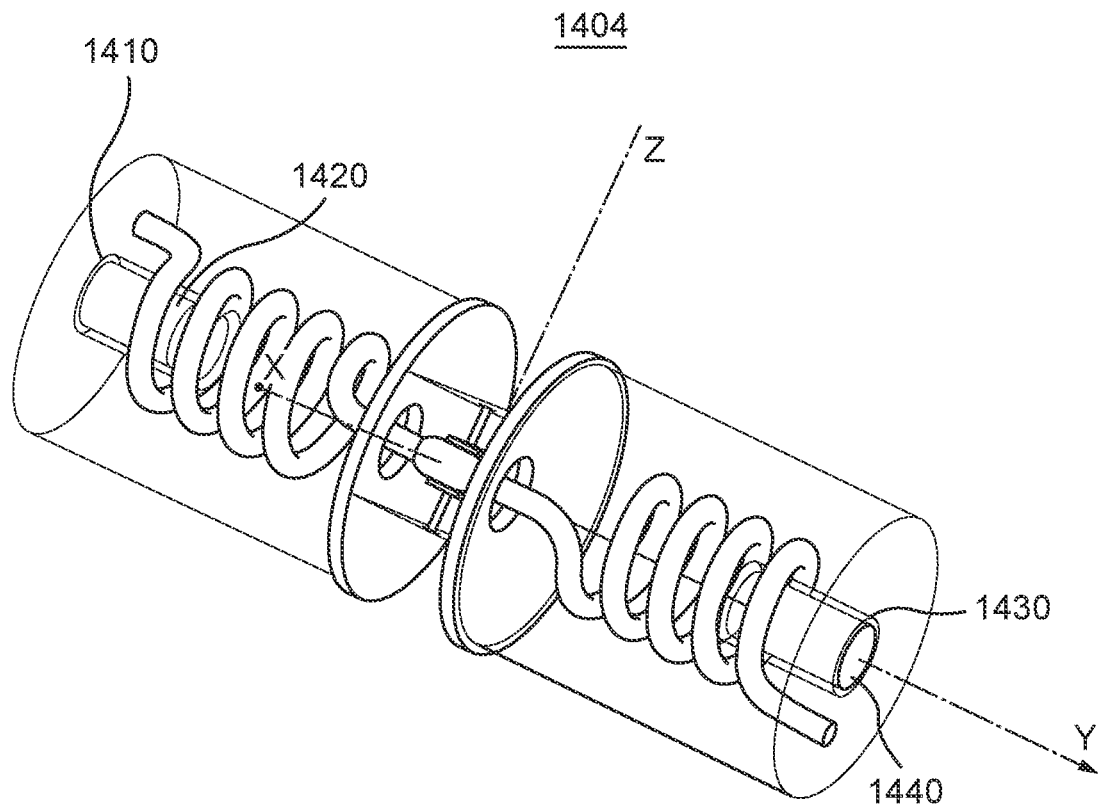
FIG. 14 is a view of a filter comprising provision to tune the filter.

FIG. 14 shows a filter 1404 with tuning slugs. Tuning may be required for setting the passband frequency of the filter due to component manufacturing tolerance but may also be actively adjusted to compensate for changes in component values due to, for example, self-heating of the filter 1404. The tuning slugs 1420 and 1440 may be, for example, ferrite rods that may be moved along the depicted Y axis within the hollow helical coils 1020, but more typically, the tuning slugs may be made of copper. Cups 1410 and 1430 made of suitable insulators (e.g. PTFE plastic) provide an area free of potting compound in which the tuning slugs can be moved.

The use of the filter 104, 804B, 904, 1404 compresses the frequency range over which frequency tuning (for impedance matching) can be done to a very small frequency range. This requires a different approach to deal with multi-state operation of the generator. An example of multi-state operation may be switching between multiple power levels in which each power level represents a state and in which the high-frequency generator 102 sees a different load impedance in each state due to the nonlinear nature of the plasma load and where the high-frequency generator 102 may operate at a different frequency in each state in order to improve impedance matching or stability for that state. To facilitate multi-state operation in a system using the filter 104, one may need to ensure that the impedances presented to the load side of the filter 104 for the different states lie along or close to the line of impedances that can be matched by frequency tuning the high-frequency generator 102 frequency. This can be done by adding a fixed or variable time-delay, such as delay element 112, on the load side of the filter.

Figure 15:
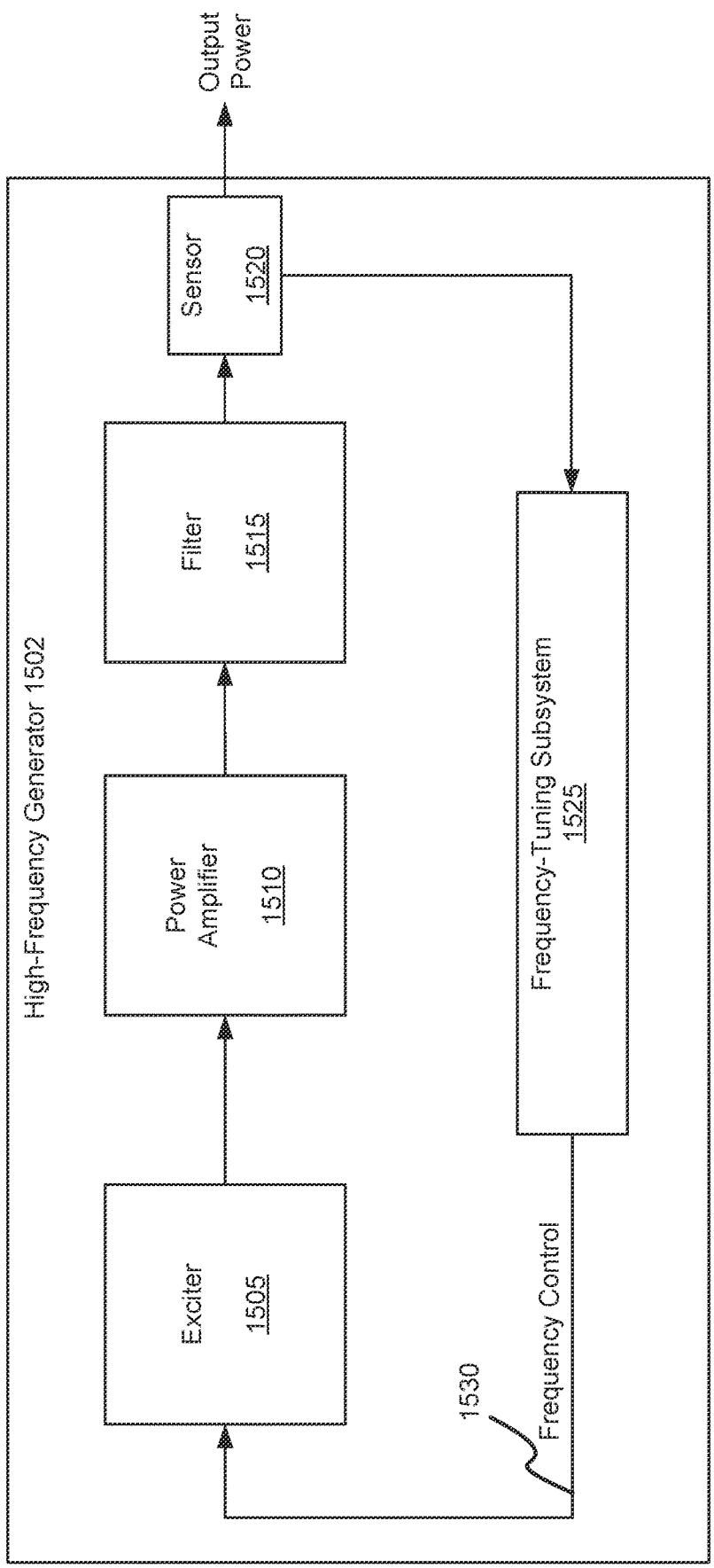
FIG. 15 is a block diagram depicting an exemplary high-frequency generator.

An aspect of the present disclosure is frequency tuning of the high-frequency generator 102 to adjust an impedance presented to the high-frequency generator 102. Referring to FIG. 15 for example, shown is a block diagram of a high-frequency generator 1502 that may be used to realize the high-frequency generator 102 described with reference to FIG. 1. As shown, the high-frequency generator 1502 comprises an exciter 1505, power amplifier 1510, filter 1515, sensor 1520, and frequency-tuning subsystem 1525. The exciter 1505 (which may include an oscillator) generates an oscillating signal at RF frequencies, typically in the form of a sinusoidal or square wave. Power amplifier 1510 amplifies the signal produced by exciter 1505 to produce an amplified oscillating signal. For example, the power amplifier 1510 may amplify an exciter output signal of 1 mW to 3 kW. Filter 1515 is optional (and distinct from filter 104)

and may filter the amplified oscillating signal to produce a signal composed of a single RF frequency (a sinusoid).

The sensor 1520 measures one or more parameters indicative of the plasma load in plasma chamber 100. In one embodiment, sensor 1520 measures power parameters indicative of the impedance, Z, of the plasma load. Depending on the particular embodiment, sensor 1520 can be, for example and without limitation, a VI sensor or a directional coupler.

A measure of how close the load impedance is to the desired impedance can take many forms, but typically it is expressed as a reflection coefficient $$\Gamma = \frac{Z - Z_0}{Z + Z_0}$$

where $\Gamma$ (gamma) is the reflection coefficient of the impedance Z with respect to the desired impedance $Z_0$. The magnitude of the reflection coefficient ($|\Gamma|$) is a very convenient way to express how close the impedance Z is to the desired impedance $Z_0$. Both Z and $Z_0$ are in general complex numbers.

In general, the frequency-tuning subsystem 1525 receives the measurements indicative of the impedance, Z, of the plasma load from sensor 1520 and processes those measurements to produce frequency adjustments that are fed to exciter 1505 via a frequency control line 1530 to adjust the frequency generated by exciter 1505.

As an alternative to sensor 1520 (as discussed below), the sensor 114 may be used to measure power parameters on a load side of the filter 104, and the wideband measurement system 116 may provide a signal to the frequency-tuning subsystem 1525 that is indicative of an impedance, Z, of the plasma load.

The frequency-tuning subsystem 1525 performs computations (based upon frequency tuning methodologies) to generate frequency adjustments (e.g., frequency steps) that are fed to exciter 1505 via frequency control line 1530. In some use cases, the objective is to adjust the frequency of exciter 1505, thereby changing the impedance of the plasma load, in a manner that minimizes $|\Gamma|$ (i.e., that achieves a $\Gamma$ as close to zero as possible). The frequency that achieves this minimum $|\Gamma|$ may be termed the target frequency. As those skilled in the art understand, an ideal complex reflection coefficient of zero corresponds to a matched condition in which the plasma-load impedance is perfectly matched to the desired impedance $Z_0$. In other embodiments, the objective is not minimum $|\Gamma|$. Instead, frequency-tuning subsystem 1525 intentionally tunes exciter 1505 to generate a frequency other than the frequency that produces minimum $|\Gamma|$. Such an embodiment may be termed a "detuned" implementation and the target frequency may not minimize $\Gamma$.

Figure 16:
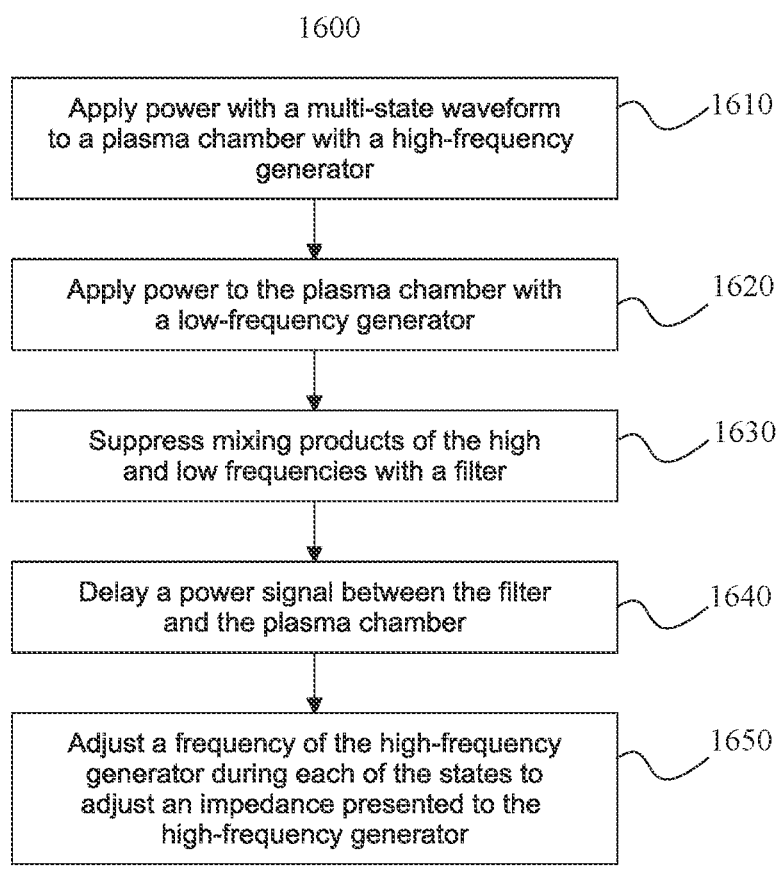
FIG. 16 is a flowchart depicting a method that may be traversed in connection with embodiments disclosed herein.

Referring next to FIG. 16, shown is a flowchart 1600 depicting a method that may be carried out in connection with embodiments disclosed herein. As shown, power with a multi-state waveform is applied to the plasma chamber 100 with the high-frequency generator 102, 1502 (Block 1610), and power is also applied to the plasma chamber 100 with a low frequency generator 108 (Block 1620). Mixing products of the high and low frequencies are suppressed with the filter 104 (Block 1630). And as shown, a power signal between the filter 104 and the plasma chamber 100 is delayed (Block 1640), and a frequency of the high-frequency generator 102 is adjusted during each of the states to adjust an impedance presented to the high-frequency generator (Block 1650).

Accurate power measurement may require measuring power on the load side of the filter 104 with a bandwidth sufficient to capture a sufficient number of mixing products. This is so because the efficiency of the filter 104 is dependent on the trajectory of the load impedance presented to the filter 104. Measuring on the high-frequency generator 102 side of the filter 104 may not provide an accurate measure of power delivered to the plasma load because it is difficult if not impossible to take into account the efficiency of the filter 104.

A variety of different frequency tuning methods may be used to adjust the frequency of the high-frequency generator 102 at Block 1650. In general, the frequency tuning methods determine which direction to adjust the frequency (whether to increase or decrease the frequency) and determine a magnitude of the frequency step used when a change is made to the frequency.

Assuming that a desirable frequency of operation is a frequency at which the magnitude of the load reflection coefficient is at or substantially close to its minimum, it is noted that the relationship between the controlled variable (frequency) and the error is not necessarily monotonic. Furthermore, the optimum point of operation is at a point where the gain (defined as change in error divided by change in frequency) is zero.

To add to the challenges, it is also possible that local minima may exist in an area which a control method can get trapped. In some special cases, where a priori information about the load is known, it is possible to arrange for an error function to be a monotonic function of frequency, so that a simple linear controller may be used. For example, such a system is disclosed in U.S. Pat. No. 6,472,822, entitled "Pulsed RF Power Delivery for Plasma Processing," issued to Chen et al., on Oct. 29, 2002. Such linear control is rarely applicable due to the non-monotonic relationship between frequency and error, except in those special cases where a priori information about the load is available.

It has been found that two common problems with plasma loads are: (1) the nonlinear nature of the load because the plasma load impedance is a function of power level; and (2) the load impedance changes over time because of changing chemistry, pressure, temperature and other physical characteristics of the non-linear plasma load. Another problem that is unique to plasma (or plasma-like) loads is that the plasma can extinguish if the delivered power to the plasma falls below a minimum value for a long enough time. Thus, a frequency where insufficient power is delivered to the plasma load cannot be applied for very long, or the plasma will extinguish.

Moreover, when the power (e.g., RF power) to the load is pulsed, frequency tuning becomes even more problematic. Due to the nonlinear nature of the load and the relatively high quality factor (ratio of stored energy to energy delivered per cycle (e.g., RF cycle), often denoted by "Q") that impedance matching networks employ, the load impedance changes very rapidly during the first few microseconds of the applied pulse (e.g., RF pulse).

U.S. Pat. No. 7,839,223 entitled "Method and Apparatus for Advanced Frequency Tuning," issued 23 Nov. 2010 to van Zyl, et al. (the '223 patent), which is incorporated by reference, discloses a variety of frequency tuning approaches that may be utilized in connection with embodiments disclosed herein. In one approach described in the '223 patent, the frequency step size is permitted to increase if the error (e.g., a difference between a desired value of gamma and an actual value of gamma) is decreasing step-over-step, and the frequency step may decrease (or stay constant) if the error is increasing step-over-step. This approach may be utilized in connection with embodiments disclosed herein to help keep up with a time-varying load (e.g., to limit or reduce variation of a time-varying load reflection coefficient).

One method for simultaneous application of a multi-state waveform (e.g., pulsing) and frequency tuning discards information at the start of the pulse while the impedance is still rapidly changing and effectively controls frequency using only information once the load impedance is stable. This approach avoids the need for tuning within the pulse but manages to obtain a good average frequency of operation.

To avoid aliasing affects, the measurement and control may be synchronized with the rising edge of the pulse. By delaying the start of the measurement and control cycle from the start of the pulse, reasonable operation on plasma-type loads is possible. Typically discarding the first 10 microseconds after the start of the pulse is sufficient to achieve reasonable results.

In some cases it is not possible to totally discard information at the start of a pulse, but it is undesirable to use intra-pulse information due to the danger of aliasing effects, or due to insufficient control bandwidth, or due to the risk of unstable operation due to the high bandwidth requirements placed on the frequency control system. By using memory, it is possible to design a system with similar performance to a true intra-pulse control system, but which is implemented using a lower speed stable controller controlling on inter-pulse information.

Figure 17:
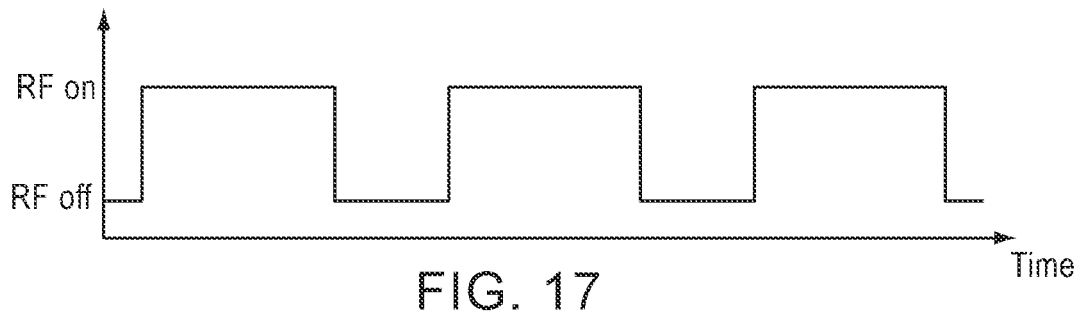
FIG. 17 is a graph depicting a multi-state waveform that may be applied by the high-frequency generators of FIGS. 1 and 15.
Figure 18:
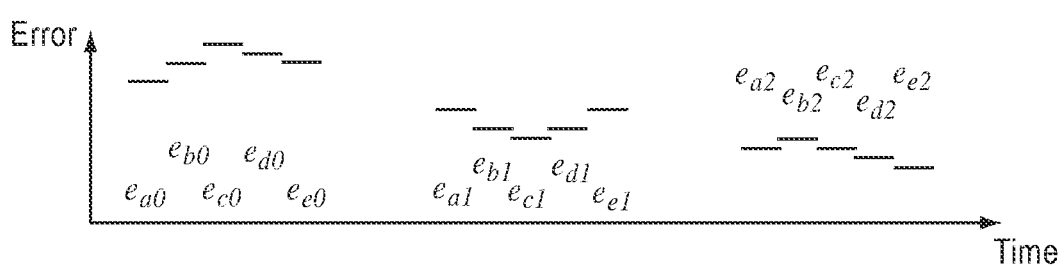
FIG. 18 is a graph depicting exemplary aspects of a frequency tuning method.
Figure 19:
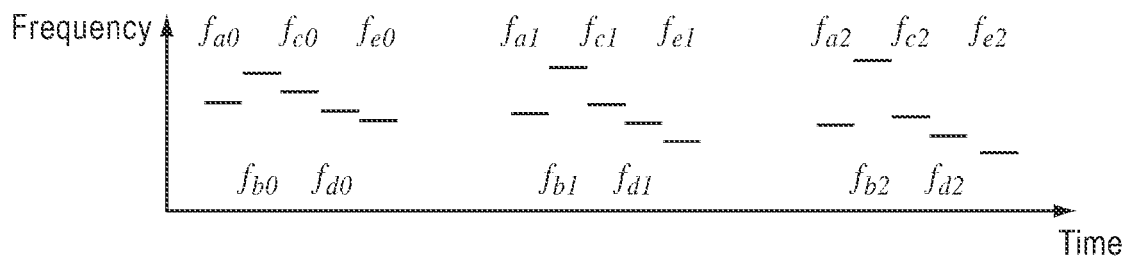
FIG. 19 is a graph depicting additional aspects of the frequency tuning method described with reference to FIG. 18.

Since the measurement and control cycle may be synchronized with the pulse, it is possible to use identical time slots in sequential pulses and a slower (than an intra-pulse controller) control system to control the frequency on an inter-pulse basis. In addition, measurements of identical timeslots of sequential pulses may be combined with measurements of time slots adjacent to those time slots. Not only the frequency, but also other control parameters may be stored and used by the control system to, for example, control delivered power to the load. Such other control parameters may comprise DC voltage supplied to the power devices, gate bias voltage in the case of MOSFETs (base emitter in case of bipolar devices) and RF drive level. Graphs depicting operation of an inter-pulse-controlled system for a high pulse repetition frequency are shown in FIGS. 17, 18, and 19. If the pulse on time becomes very long, it may be more advantageous to simply ignore information from the first few time slots, or switch to intra-pulse control at some time later in the pulse.

FIGS. 17, 18 and 19, viewed together, illustrate the disclosed inter-pulse frequency tuning. In this scheme, $f_{a2}$ is a function of only (or predominantly if adjacent time slots are also considered with some weighting) $e_{a0}$, $e_{a1}$ and $f_{a1}$. Similarly, $f_{b2}$ is a function of only (or predominantly) $e_{b0}$, $e_{b1}$ and $f_{b1}$, and so forth.

Another problem is getting trapped in local non-optimal minima Using the fact that there is a fixed time in which the plasma can operate with substantially reduced power without extinguishing, it is possible to sample and store information about operation at frequencies completely different from the current operating point. Assuming that the plasma will not extinguish if power is substantially reduced for a short enough time, T, the method works by operating, for example, 99% of the time at the optimum frequency (as determined by the frequency tuning method) and using the remaining 1% of the time in time slots not exceeding T in duration to explore operation at other frequencies. In some implementations, power may be delivered at a selected frequency for at least 90% of a total time and power may be delivered at a test frequency during test periods that are no longer than 10% of the total time.

In some implementations, a value of the test frequency may change from test period to test period. In other implementations, the same test frequency is visited multiple times, each time adjusting the power delivered to the plasma load towards a desired power level.

Although many variations are possible, the following method is exemplary and illustrative. Consider operating for a time equal to 99T at the optimum frequency and then switching to a different test frequency for a time of T. The entire frequency range from $f_{min}$ to $f_{max}$ can be divided into, for example, 16 equally spaced frequencies $f_0$ through $f_{15}$. The number of frequencies in which to divide the entire frequency range is a function of the known quality factor of the matching circuits employed. Sixteen is a typical number to make sure the true optimal point will not be missed in subsequent searches for the optimal frequency.

The method may start by sequentially searching $f_0$ through $f_{15}$ in the time slots of duration T to find a coarse optimum. The space may need to be searched a few times because the power control system may not be able to adjust the power correctly within the time T. Due to the nonlinear nature of the typical loads encountered, it is beneficial to measure the load reflection coefficient (or other error metric used by the method) at or close to a desired power level. By storing the control value and power level every time that a frequency is visited, the correct power level can be attained after a few visits to the same frequency.

Once the coarse optimum has been found, for example at $f_k$, where k is an integer from 0 to 15, then the method may start using the time slots of length T to find an optimum. One option is to go to $f_{16}=0.5(f_{k-1}+f_k)$ provided k>0 and $f_{17}=0.5(f_k+f_{k+1})$ provided k<15. The frequency at which the error is at a minimum between $f_{16}$, $f_k$ and $f_{17}$ then becomes the new desired frequency. The interval to the left and right of the new optimum is again split in two, and the minimum among the previous minimum and the two newly tested frequencies is selected. And when the minimum frequency happens to be $f_{min}$ or $f_{max}$, only one new frequency is generated. Due to the fact that the interval is split in half every time, the optimum frequency is found with sufficient accuracy within just a few iterations. And because the load is generally time-variant, once the optimum frequency has been found, the method generally has to start over to make sure conditions have not changed and a new global optimum has not been created.

Figure 20:
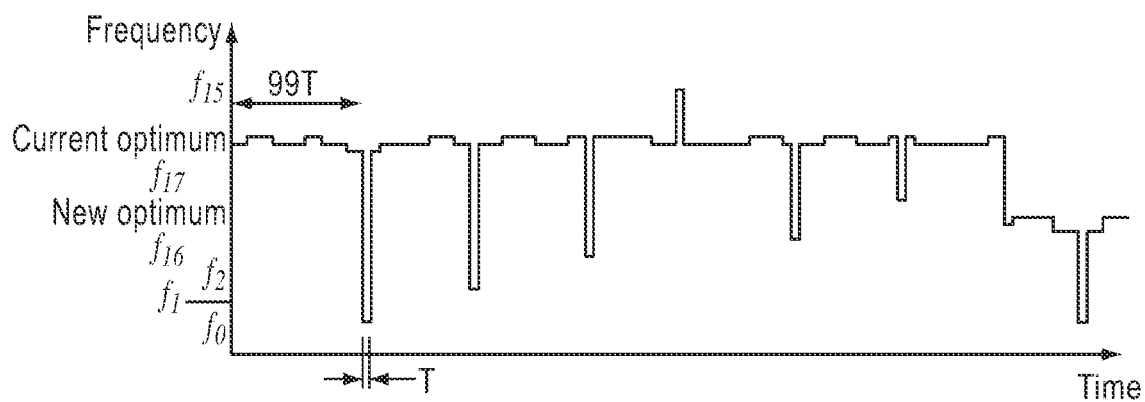
FIG. 20 is a graph depicting operational aspects of yet another frequency tuning method.

While this method to find the global optimum is being executed, the previously described local tuning method can be run during the 99T time slot to maintain operation at the current local minimum. And staying at the current optimum frequency 99% of the time ensures that the average delivered power to the load remains virtually unchanged. FIG. 20 graphically illustrates exemplary operating characteristics that may be associated with a method which uses a small percentage of the time with a maximum time slot T to search for a global optimum frequency.

Another approach to frequency tuning of the high-frequency generator 102 to adjust an impedance presented to the high-frequency generator 102 is described with reference to FIGS. 21-38. For example, in some implementations, the power source 2110, circuits 2114, sensor 2112, power generation system 2200, 2300, 2400, 2500, 2600, 2700 described further herein may be integrated with the high-frequency generator 102. In other implementations, the power source 2110, circuits 2114, sensor 2112, and one or more components of the power generation system 2200, 2300, 2400, 2500, 2600, 2700 may be distributed. For example, circuits (e.g., circuits 2114, 2214, 2314, 2414) and/or sensors (e.g., sensors 2112, 2312, 2412) may be implemented in a centralized controller that is housed separately from the high-frequency generator 102. As an additional example, circuits (e.g., circuits 2114, 2214, 2314, 2414) may be implemented as a part of the frequency-tuning subsystem 1525.

As described with reference to FIGS. 21-38 a plasma-sustaining power may be applied at a primary frequency while a secondary power signal (e.g., comprising one or more frequencies) that is much lower in power than the plasma-sustaining power is used to probe for an alternative primary frequency. Beneficially, the application of the secondary power signal enables one or more aspects of the plasma load to be monitored without adversely affecting the plasma load itself. In addition, when the plasma-sustaining power is applied to a plasma load via a match network, the application of the low level signal may be applied with one or more particular frequencies that result in detectable frequencies (e.g., mixing and intermodulation frequencies) that are passed by the narrow filtering band of the match network. Moreover, information obtained about the plasma load may be used to control one or more aspects of the generator.

In terms of generator control for example, automated frequency tuning may be performed using the information about the plasma load. For example, a global optimum of some measure of performance may be obtained, and the high-frequency generator 102 may be adjusted towards this global optimum frequency—without extinguishing the plasma. Exemplary approaches comprise processing noise generated by the primary operating frequency of a generator in order to effectively perform a low-power sampling sweep of an interested frequency range or generating a low power signal in addition to the primary power signal, where the low power signal is used to scout or probe for the global optimum.

In both cases, the low power nature of the noise or the probe signal enables exploration of a frequency range of one or more probe frequencies while the primary power signal of the generator remains at a frequency (e.g., at a local optimum of the measure of performance) where sufficient power can be delivered to the plasma load to sustain the plasma. For instance, the primary power signal can remain at or near a local optimum while the scouting signal or noise (both will be hereafter referred to as a "secondary power signal" or "probe signal") finds the global optimum thereby continuing to allow substantial power to reach the plasma load while the probing occurs.

In the case where the secondary power signal is noise, the noise can either be inherent noise generated as a result of the primary power signal, or the noise can be added to the primary power signal. The noise can occur at a plurality of secondary probe frequencies sometimes limited to a bandwidth governed by a filter applied to the primary power signal. Where the secondary power signal is a low-level signal, such a probe signal can be orders of magnitude lower than an amplitude of the primary power signal (e.g., −3 dB, −5 dB, −10 dB, −20 dB, −50 dB, −100 dB). The low-level signal can be sinusoidal or any other type of periodic signal and can be generated at RF or other frequencies. Signals that start at a finite time and eventually become sinusoidal or periodic are considered to be sinusoidal or periodic, respectively. The low-level probe signal can be swept across a fixed range of secondary probe frequencies. Alternatively, the low-level probe signal can 'hop' between secondary probe frequencies according to a tuning algorithm that searches for a global optimum.

A global optimum may be found by comparing the optimality of different frequencies and choosing the most optimal frequency. For example, if the measure of optimality is the smallest load reflection coefficient magnitude, then the estimated load reflection coefficient magnitude at the different frequencies scouted by secondary power signal source are compared and the frequency at which the load reflection coefficient is the smallest is chosen as the global optimum frequency. The measuring and comparing to find the optimum can occur sequentially or, e.g., in the case where noise is used as the secondary power signal, the optimality of different frequencies can be computed simultaneously and the most optimal frequency chosen after the computation at the different frequencies.

Once the global optimum has been found, the primary power signal can be shifted to a frequency of the global optimum. Such shifting can involve a sudden switch from one frequency to another or can involve a power to the secondary power signal being ramped up while power to the primary power signal is ramped down such that the secondary power signal becomes the primary power signal.

Once the primary power signal is operating at a frequency of the global optimum, further fine tuning can occur. For instance, the secondary power signal can again go out in search of the global optimum, either because the global optimum at the power level of the primary power signal is different than a global optimum for the lower power of the secondary power signal, or because the global optimum varies and has changed since the first iteration of tuning occurred.

For the purposes of this disclosure, a "low level signal" is one that is substantially lower than a primary signal being delivered to a plasma chamber, for instance at least an order of magnitude smaller.

For the purposes of this disclosure, a "circuit" can comprise any combination of electrical components that generate an output signal based on an input signal. A circuit can be digital, analog, or part of or comprising a processor or central processing unit (CPU). A circuit can comprise, or can read from, a non-transitory, tangible computer readable storage medium with processor readable instructions for performing the methods described below.

For the purposes of this disclosure, components can be in communication, which in some cases comprises electrical communication (e.g., able to send signals therebetween) However, one of skill in the art will recognize that communication can also comprise optical and wireless radio communications, to name two non-limiting examples.

For the purposes of this disclosure, a "global optimum" can comprise a minimum or maximum value for a characteristic as sampled across a range of frequencies. For instance, where reflected power is the characteristic, the global optimum can be a global minimum, while where delivered power is the characteristic, the global optimum can be a global maximum.

Figure 21:
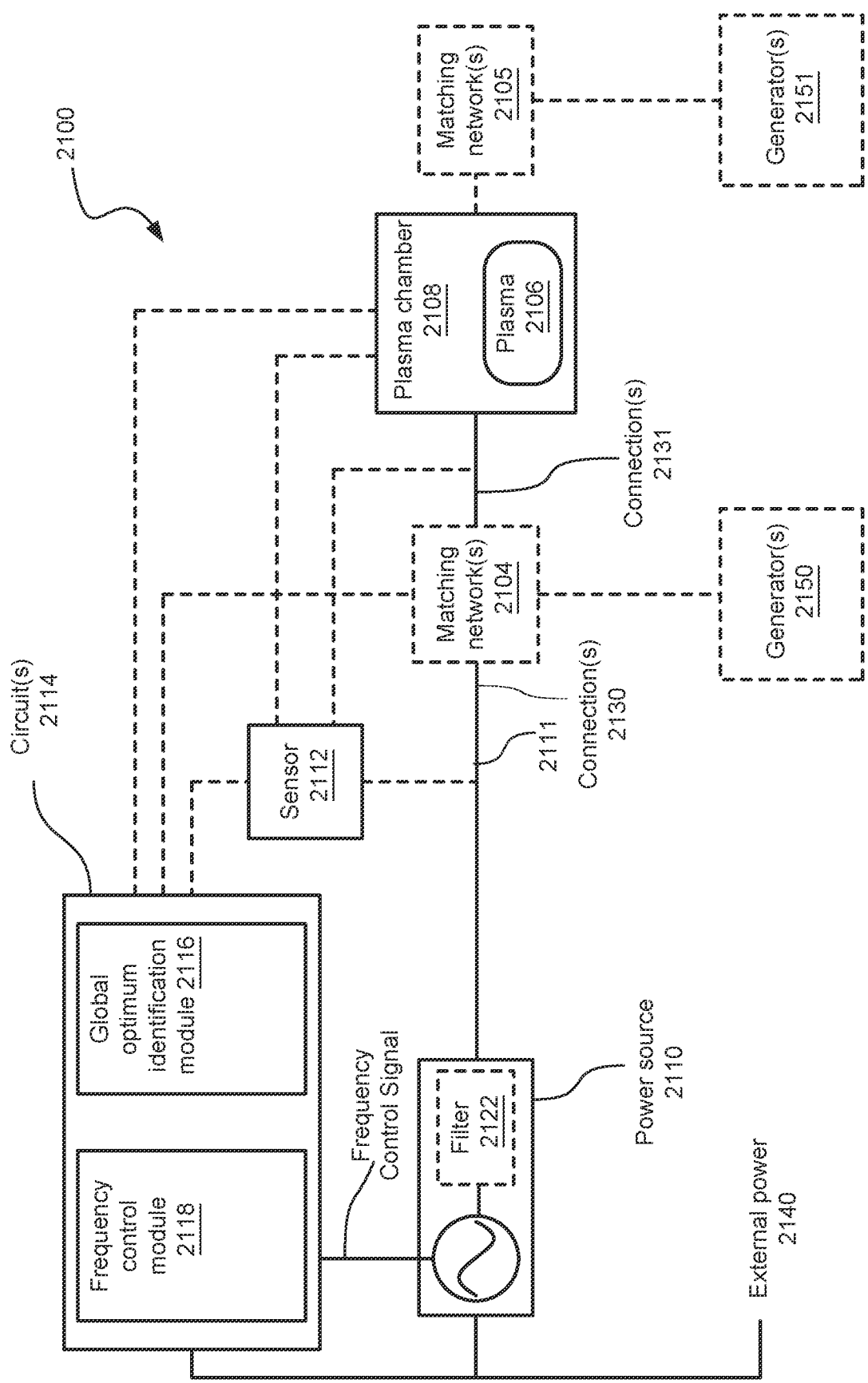
FIG. 21 illustrates a power generation system configured for automated frequency tuning of power delivered to a plasma load.

FIG. 21 illustrates a power supply system configured for automated frequency tuning of power delivered to a plasma load. The power generation system 2100 is configured to provide radio frequency (RF) power to the plasma 2106 or plasma load via RF impedance matching circuits which can be an optional filter 2122 internal to the power source 2110 and/or a matching network 2104 external to the power source 2110. Filtering and impedance matching are frequently done by the same physical network. Thus, a filter such as optional filter 2122 can perform the function of both filtering and impedance matching.

The power generation system 2100 can comprise a power source 2110 that converts external power 2140 to RF power and the power source 2110 may be a 13.56 MHz generator, but this is certainly not required. Other frequencies and other power sources are contemplated. The power generation system 2100 is configured to provide RF power (e.g., an RF voltage) at a sufficient level to ignite and sustain a plasma 2106 that is contained in the plasma chamber 2108. The plasma 2106 is generally used to process a work piece or substrate (not shown) but is well known to those skilled in the art.

The power source 2110 can apply a primary power signal primarily at a primary frequency to an output 2111. The output 2111 can be configured for coupling to an optional matching network 2104 and to a plasma chamber 2108. In particular, the primary power signal can be delivered to a plasma 2106 or to a load of the plasma 2106 (also known as the plasma load). The connection(s) 2130 from the power source 2110 to the optional matching network 2104 are frequently coaxial cables, although other cable types and connection types are also possible. The connections(s) 2131 from the matching network 2104 to the plasma chamber 2108 are frequently made via custom coaxial connectors, although other cable types and connection types are also possible. In some applications there is no matching network 2104 and the output 2111 of the power source 2110 is connected directly to the plasma chamber 2108. In this case RF impedance matching is done internal to the power source 2110 with the optional filter 2122.

In some applications, other optional RF or DC generators 2150 can be connected to the plasma chamber 2108 via the optional matching network 2104. And in some applications, other optional RF or DC generators 2151 (e.g., the low-frequency generator 108) can connect to the plasma chamber 2108 via other means, e.g., other optional matching networks 2105. The connection of other generators to the plasma load either via the matching network(s) 2104 or through other means (e.g. connected to a different electrode to deliver power to the same plasma) generally makes the frequency tuning problem more complicated. In the following descriptions the possibility of other optional generator(s) 2150 and 2151 and other means of connecting to the plasma (e.g. matching network(s) 2105) are not excluded, but for simplicity will not be illustrated or discussed further.

The sensor 2112 may monitor a characteristic indicative of generator-delivered power or delivered power capability, such as reflected power, delivered power or impedance mismatch, to name just three non-limiting examples. Further non-limiting examples of a characteristic indicative of delivered power or delivered power capability comprise power delivered to the matching network 2104, the power reflected from the matching network 2104, the power delivered to the plasma chamber 2108, the load impedance seen by the power generation system 2100, and a characteristic of the plasma chamber 2108 such as plasma density. The sensor 2112 can also monitor a characteristic indicative of stability of the plasma system such as fluctuations in load impedance. The sensor 2112 can also monitor a characteristic indicative of the nonlinear nature of the plasma load such as the generation of mixing and intermodulation products.

The use of a secondary signal source to implement frequency tuning of the generator has the additional benefit that measurements of the plasma properties can be made from the generator. The optional matching network(s) 2104 typically act as band pass filters. This property of the matching network(s) 2104 makes it difficult to make reliable measurements of the plasma at the harmonics of the generator output frequency although such information could be useful. However, the modulation of the plasma impedance can be characterized by observing the mixing and intermodulation products that are generated by the secondary signal source. For example, if the primary signal source is at 13.56 MHz and the secondary signal source is at 13.57 MHz, one expects a mixing product at 13.55 MHz and intermodulation products at 13.56 plus multiples of 10 kHz, e.g. at 13.53, 13.54, 13.58, etc. Measuring the amplitude and phase relationship of the mixing and intermodulation products and deducing e.g. the amount of amplitude and phase modulation present can provide information about the plasma properties. The processing of the information can be done in a number of ways, from simply analyzing the time series of measurements from the sensor and performing higher order statistics on the time series to using dedicated receivers tuned to the mixing and intermodulation product frequencies to extract the amplitude and phase relationships to using any number of mathematical transformations comprising but not limited to the discrete Fourier transform. Monitoring the mixing and intermodulation products and detecting changes in the characteristics of the plasma indicated by e.g. the amount of phase modulation to name but one property can be useful in e.g. end-point detection in e.g. etch operations in the manufacture of semiconductors.

The sensor 2112 can be a directional coupler, current-voltage sensor or other multi-port network and can monitor current and voltage or combinations of voltage and current (e.g. incident and reflected signals) between the power source 2110 and matching network 2104 or between the matching network 2104 and the plasma chamber 2108. In another non-limiting example, the sensor 2112 can be an optical detector directed into the plasma chamber 2108 to optically measure a density of the plasma 2106. These examples in no way describe the scope or limits of the sensor 2112 or the positions where the sensor 2112 can be arranged, but instead demonstrate that the sensor 2112 can take a variety of forms and can be coupled to the system in a variety of ways (see FIGS. 22-27 for various non-limiting examples). In addition, the sensor 2112 may be a sensor or sensors that already reside in the optional matching network(s) 2104 or plasma chamber 2108.

Signals from the sensor 2112 or sensors already residing in the matching network(s) 2104 and plasma chamber 2108 can be provided to the one or more circuits 2114 that are also in communication with, and control, the power source 2110. The one or more circuit(s) 2114 can use the information from the sensor 2112 and/or sensors already residing in the matching network(s) 2104 and plasma chamber 2108 to tune the primary and/or secondary probe frequencies that the power source 2110 operates at to optimize delivered power to the plasma 2106 or to optimize another measure of optimality such as plasma stability.

In some cases, such tuning results in operation at a local optimum (e.g., a local minimum of reflected power or a local maximum of delivered power, to name just two examples), so some tuning algorithms are able to further adjust the primary frequency in order to seek out the global optimum (e.g., via a series of fast frequency 'hops'). However, such searching can take the power through regions of the frequency spectrum that are poorly impedance matched (e.g., around fa in FIG. 28), and thus can cause delivered power to drop significantly, and in some cases can cause the plasma 2106 to be extinguished (e.g., at fa in FIG. 28).

To avoid this, such searching for the global optimum can be performed by one or more secondary signals, thus enabling the high powered primary power signal to remain at a frequency (e.g., at a local optimum) where sufficient power can be delivered to the plasma 2106 while the search for the global optimum proceeds. FIGS. 31-33 show plots of the monitored characteristic as a function of frequency and how a secondary power signal having substantially lower amplitude than a primary power signal can be used to search out the global optimum. These plots will be discussed in depth later once related systems and apparatuses have been described.

FIG. 21 illustrates a power generation system for automated frequency tuning of power delivered to a plasma load. A power source 2110 can provide a primary power signal to a plasma load of a plasma 2106 in a plasma chamber 2108 where the impedance seen by the power source 2110 is impedance matched by a matching network 2104 arranged between the power source 2110 and the plasma chamber 2108 and by frequency tuning of the power source 2110. The power source 2110 can be frequency tuned in order to find optimum frequencies, typically where delivered power is optimized, but other measures of optimality may be used. Such tuning can sometimes result in the primary power signal from the power source 2110 being tuned to a local optimum rather than a global optimum. In such cases, a probe signal comprising one or more probe frequencies can be generated by the power source 2110 and processed to identify a global optimum without having to use the primary power signal to scout out the global optimum.

Figure 24:
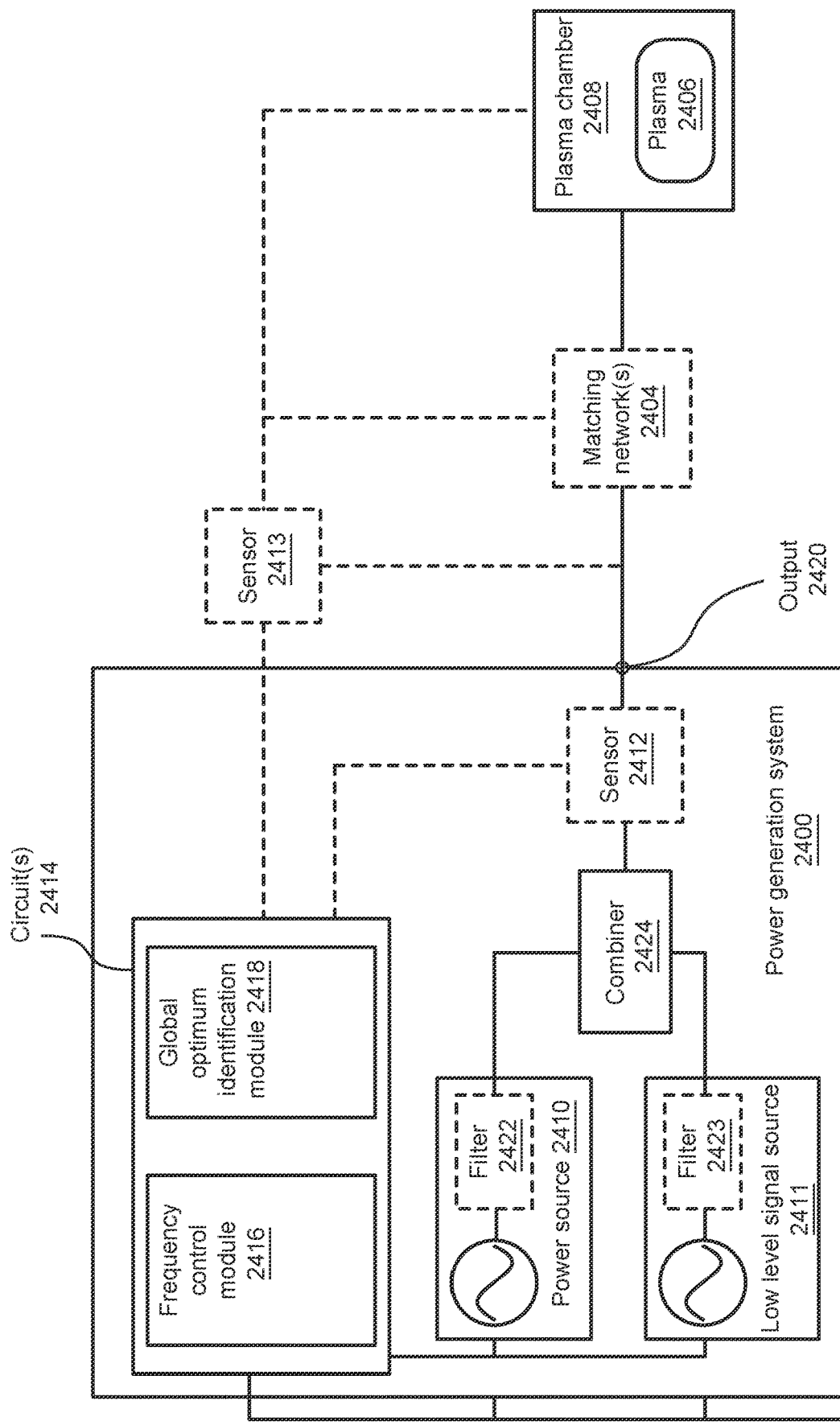
FIG. 24 illustrates a further embodiment of a power generation system.
Figure 26:
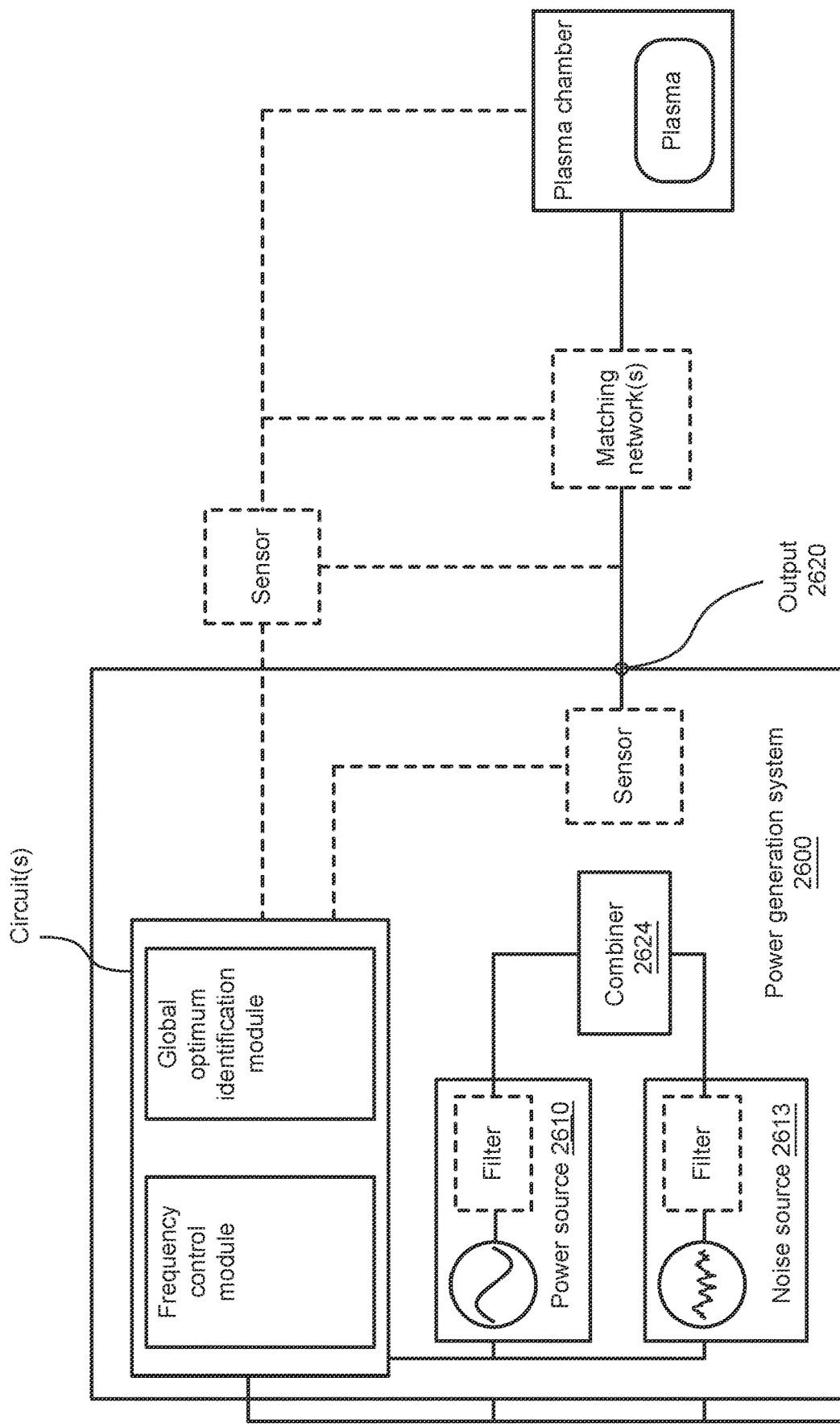
FIG. 26 illustrates an embodiment of a power generation system where the power source generates the primary power signal and a noise source generates the secondary power signal in the form of noise.

In other cases, a secondary power source can provide the secondary power signal (also referred to as the probe signal) (for example, see FIGS. 24 and 26). The one or more secondary power signals can be provided at an amplitude or power level below that of the primary power signal (or substantially below the primary power signal, a fraction of the primary power signal, or at such a substantially lower power level as to have a negligible effect on the plasma 2106 as compared to the primary power signal). The probe signal can comprise a plurality of secondary probe frequencies all generated at the same time (e.g., FIGS. 31-33). In an alternative, the one or more secondary power signals can be tuned to two or more different frequencies at different times (e.g., as depicted in FIGS. 31-33).

The one or more secondary power signals can be used to sample power delivery at frequencies other than that of the primary power signal without applying so much power at these secondary frequencies as to influence the plasma. In other words, the primary power signal can remain at a frequency where the plasma can be sustained (e.g. at or near a local optimum) while the one or more secondary power signals are used to search for the global optimum.

In particular, the sensor 2112, or two or more sensors, and/or sensors already present in other components of the power generation system 2100 can monitor a measure of performance at the frequency of the primary power signal as well as at the secondary frequencies. The one or more sensors (e.g., sensor 2112) can also measure at the frequencies of expected mixing and intermodulation products to extract information about the nonlinear characteristics of the plasma 2106. For instance, changes in the mixing and intermodulation products can be used to sense plasma ignition or end-point detection for plasma processes. The injection of a secondary frequency component or components and measurement of the properties of the mixing and intermodulation products can sense nonlinear characteristics of the plasma 2106 at harmonics of the primary power signal even though the match network(s) 2104 and the filter 2122 may not allow direct measurement of the harmonics.

For instance, the sensor 2112 can be a reflected power sensor or a delivered power sensor, and the characteristic can be reflected power or delivered power, respectively. Other characteristics can also be monitored and used to identify local and global optimums (e.g., load impedance seen by the power source 2110, voltage and current of power on a supply cable 2130 to the matching network(s) 2104, and plasma 2106 density, to name a few non-limiting examples). The sensor 2112, and/or other sensors can provide information describing the characteristic(s) to one or more circuits 2114 (e.g., logic circuits, digital circuits, analog circuits, non-transitory computer readable media, and combinations of the above). The one or more circuits 2114 can be in communication (e.g., electrical communication) with the sensor 2112 and the power source 2110. The one or more circuits 2114 can adjust the primary frequency of the power source 2110 in order to tune the power source 2110 to optimize delivered power to the plasma load.

In some embodiments, optimizing a measure of performance comprises controlling a feedback loop that uses a secondary power signal in order to scout out or search for a global optimum. In such a case, the one or more circuits 2114 can control the secondary power signal and its one or more secondary frequencies, based on feedback from the sensor 2112 (or two or more sensors, and/or sensors already present in other components of the power generation system 2100) regarding a measure of performance. For instance, a frequency of the secondary power signal can be swept across a fixed range of frequencies encompassing the primary frequency of the primary power signal, and the one or more circuits 2114 can monitor a measure of performance as a function of frequencies of the secondary power signal. Based on this sweep, the one or more circuits 2114 can identify a global optimum and then instruct the power source 2110 to adjust its primary frequency so as to move the primary power signal to the identified global optimum. Frequency hops or other tuning schemes can be used to find the global optimum via the one or more secondary power signals.

Figure 27:
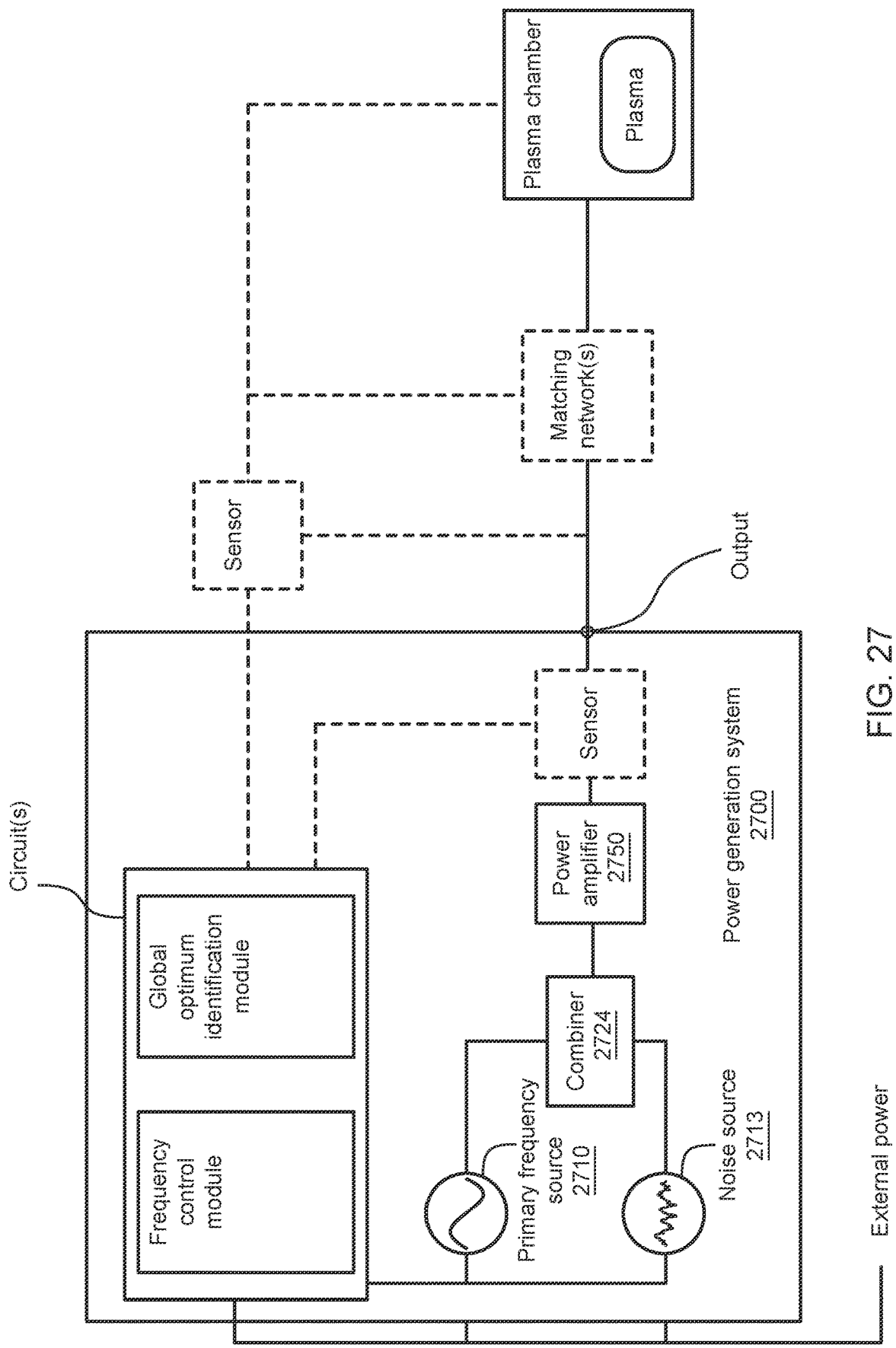
FIG. 27 illustrates an embodiment of a power generation system where the secondary signal is noise and the primary power signal and the secondary power signal are combined before amplification by a power amplifier.

The secondary power signal can take a number of different forms. In one case, the one or more circuits 2114 can instruct the power source 2110 to apply a secondary power signal in the form of a low level signal at the one (e.g., as depicted in FIG. 11) or more (e.g., as shown in FIG. 32) secondary frequencies, either applying a low level signal at those secondary frequencies in a particular order (e.g., FIG. 31), or according to an algorithm to optimize the measure of performance (e.g., FIG. 32). In another case, the one or more circuits 2114 can instruct the power source 2110 to apply a secondary power signal in the form of noise. This noise can be inherent to the primary power signal, in which case, the one or more circuits 2114 do not necessarily have to supply an instruction to the power source 2110, or can be non-inherent noise that is added to an output of the power source 2110 (e.g., as shown in FIGS. 26 and 27).

Whatever form the secondary power signal appears in, in many embodiments, its amplitude is one or more orders of magnitude lower than that of the primary power signal. For instance, the secondary power signal can be between 1 and 100 dB lower than the primary power signal. In other embodiments, the secondary power signal can be 1 dB, 5 dB, 10 dB, 20 dB, 50 dB, or 100 dB lower than the primary power signal.

As shown the one or more circuits 2114 may comprise a global optimum identification module 2116 and a frequency control module 2118. The global optimum identification module 2116 can analyze the information from the sensor 2112 at each of the one or more secondary frequencies and identify a frequency corresponding to a global optimum. This frequency can be referred to as an identified-global-optimum frequency and it corresponds to a global optimum of the characteristic of the generator-delivered power. The frequency control module 2118 can adjust the primary frequency of the primary power signal both during initial tuning of the primary power signal, which may result in identification of a local optimum, as well as adjustment of the primary frequency towards an identified global optimum frequency once a global optimum is identified by the global optimum identification module 2116.

In particular, once an identified-global-optimum frequency is identified, the frequency control module 2118 can instruct the power source 2110 to adjust the primary frequency to jump to the identified-global-optimum frequency, or to lower the amplitude of the primary frequency while increasing the amplitude of the secondary frequency at the identified-global-optimum frequency, so that the primary and secondary frequencies reverse roles. In this way, the primary frequency can be transitioned to a frequency corresponding to a global optimum of the power characteristic (e.g., low reflected power or low level of oscillations) without applying power in a region of the frequency spectrum that could inhibit or extinguish the plasma (e.g., around fa in FIGS. 28-33).

The operation of the global optimum identification module 2116 and the frequency control module 2118 can be cyclical to repeatedly improve an accuracy of adjusting the primary frequency toward a global optimum. For instance, where the characteristic (e.g., plasma impedance) being monitored is nonlinear, a global minimum for the characteristic may be found when the low level secondary power signal is applied, but when the much larger primary power signal is applied at the same frequency, a different global optimum frequency may exist for the higher powered signal. So, the secondary power signal can again be used to further hone in on a global optimum for the primary power signal and this can continue in a looping fashion for multiple iterations. Adjusting a frequency toward a global optimum can comprise changing the frequency to a frequency associated with the global optimum or merely changing the frequency to a frequency closer to the global optimum than to an original frequency.

In some embodiments, the primary frequency can be switched to one of the one or more secondary frequencies as soon as the one or more secondary frequencies begin to descend/ascend a steep enough portion of the frequency curves (e.g., between fa and f0 in FIGS. 28-34). When such a steep portion of the curve is identified, the global optimum identification module 2116 may determine that it is approaching a global optimum and thereby instruct the power source 2110 to switch the primary frequency to a frequency near that of the secondary power signal, thereby enabling the primary power signal to jump over and avoid regions of the frequency curve that could inhibit the plasma (e.g., around fa). Once the primary power signal switches frequency, the one or more secondary power signals can continue to hone in on the global optimum, or the primary power signal can be used to further hone in on the global optimum.

In many embodiments supply connection(s) 2130 can be realized by a pair of conductors, or a collection of two-conductor coaxial cables that connect the power source 2110 with the matching network 2104. In other embodiments, the cable 2130 is implemented with one or more twisted-pair cables. In yet other embodiments, the cable 2130 may be realized by any network of cable, comprising, but not limited to, a simple conductor hookup and quadrapole connections. The connection(s) 2131 is frequently implemented with a connector, but can also take a variety of forms comprising simple conductor hookup.

The matching network 2104 may be realized by a variety of match network architectures. As one of ordinary skill in the art will appreciate, the matching network 2104 can be used to match the load of the plasma 2106 to the power source 2110. By correct design of the matching network(s) 2104 or 2105, it is possible to transform the impedance of the load of the plasma 2106 to a value close to the desired load impedance of the power source 2110. Correct design of the matching network(s) 2104 or 2105 can comprise a matching network internal to the power source 2110 (e.g., via filter 2122) or a matching network external to the power source 2110 as seen in FIGS. 21-27.

The one or more circuits 2114 can be original equipment of the power generation system 2100, while in other embodiments, the one or more circuits 2114 can be retrofit components that can be added to a power generation system that was not originally capable of the herein described frequency tuning.

In an embodiment, the power generation system 2100 can comprise an optional filter 2122. The filter 2122 can be configured to attenuate portions of the primary power signal outside of a selected bandwidth and do additional impedance matching. For example, because 50 ohm is the dominant impedance for cables and connectors 2130, the desired impedance seen at the output of the power source 2110 is typically 50 ohm or some other convenient impedance. The impedance at the input (at the opposite side from the output of the power source 2110) of the filter 2122 provides the impedance desired by the active elements of the power source (e.g. MOSFETs) and is typically very different from 50 ohm, e.g. 5+j6 ohm is typical for a single MOSFET amplifier. For such a system the filter 2122 will then be designed to match 50 ohm at the output to 5+j6 ohm at the input. In addition to impedance matching the filter is also typically designed to limit harmonics generated by the active elements. E.g. the filter can be designed to match 50 ohm at the output to a value close to 5+j6 over the range of frequencies over which the generator is expected to operate, e.g. from 12.882 to 14.238 MHz and suppress signals at frequencies higher than 25 MHz by a certain amount, typically at least 20 dB at the second or third harmonic of the output.

The sensor 2112 can be arranged in a variety of locations, comprising those that are part of the power generation system 2100, and those that are external thereto. Where the sensor 2112 monitors a characteristic can also vary from embodiment to embodiment, as will be seen in FIGS. 22-27.

Figure 22:
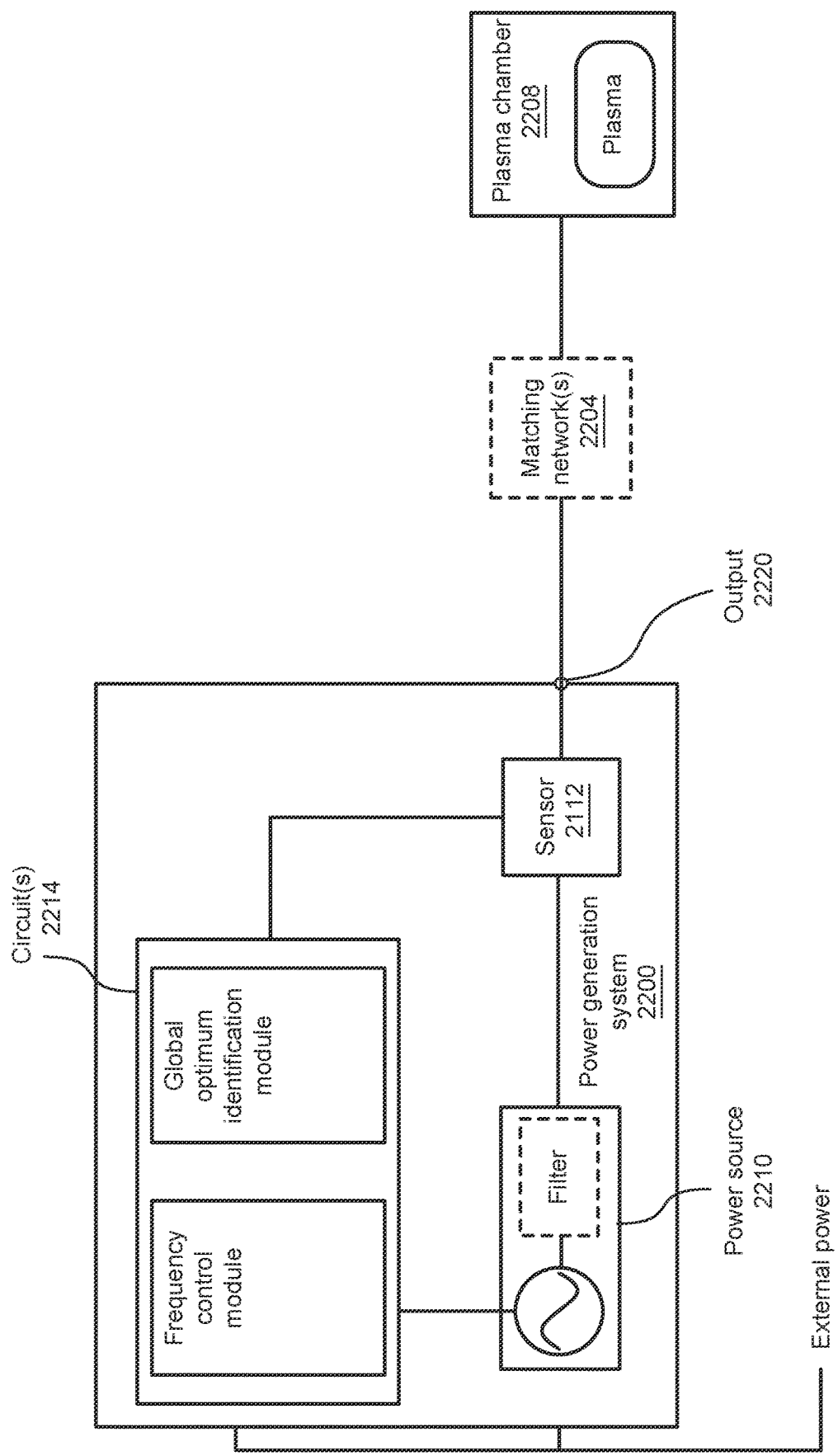
FIG. 22 illustrates one embodiment of a power generation system where the sensor resides within a power generation system along with a power source and one or more circuits.

FIG. 22 illustrates one embodiment of a power generation system 2200 where the sensor 2212 resides within a power generation system 2200 along with a power source 2210 and one or more circuits 2214. The power generation system 2200 comprises an output 2220 configured for coupling to the optional matching network(s) 2204 or directly to the plasma chamber 2208 if the matching network(s) 2204 is not present. Thus, the primary power signal and the one or more secondary power signals can be provided to the output 2220 and hence configured for delivery to the matching network(s) 2204.

Figure 23:
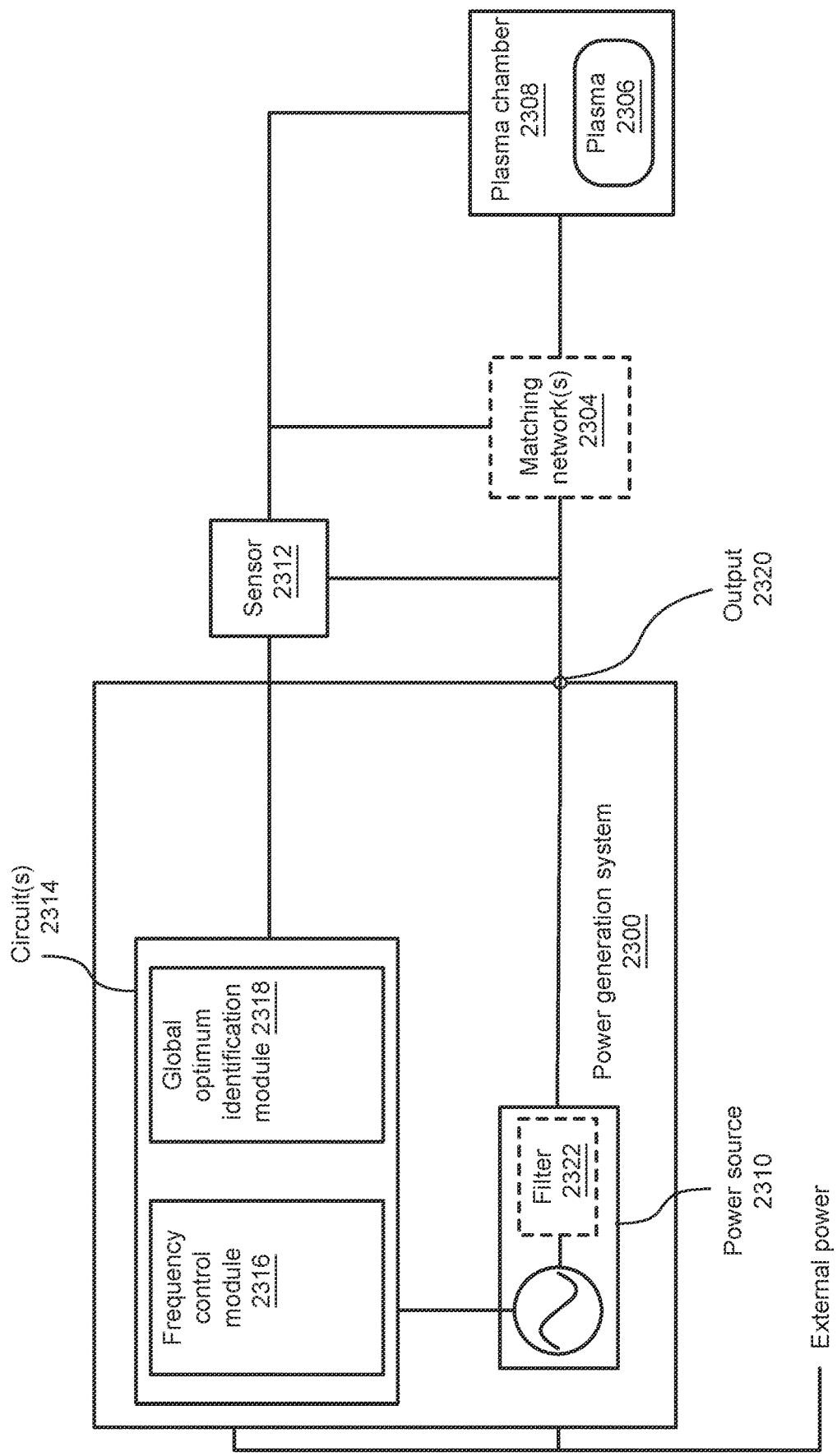
FIG. 23 illustrates one embodiment of a power generation system where a sensor resides outside the power generation system.

FIG. 23 illustrates one embodiment of a power generation system 2300 where a sensor 2312 resides outside the power generation system 2300. Here the power generation system 2300 comprises the power source 2310, one or more circuits 2314, an optional filter 2322, and an output 2320 to the power generation system 2300. The sensor 2312 is coupled to the one or more circuits 2314 and provides information describing a measure of performance (e.g. load reflection coefficient magnitude or plasma density). The sensor 2312 monitors the characteristic either between the power generation system 2300 and an optional matching network(s) 2304, between the matching network(s) 2304 and the plasma chamber 2308, or at the plasma chamber 2308, or between the power generation system 2300 and plasma chamber 2308 if the match network(s) 2304 is not present. The sensor 2312 could also perform monitoring at or within the matching network(s) 2304.

While FIGS. 21-23 illustrate a single power source 2110, 2210, 2310, one of skill in the art will recognize that this power source 2110, 2210, 2310 is capable of generating both the primary and secondary power signals concurrently. For instance, the power source 2110, 2210, 2310 can source both a high power primary power signal (e.g., using a primary oscillator) and a low level secondary power signal (e.g., using a secondary oscillator), or the power source 2110, 2210, 2310 can source a high power primary power signal (e.g., with a single oscillator-amplifier combination) and use the noise inherent to that primary power signal as the secondary power signal, to name two non-limiting examples. Alternatively, the power source 2110, 2210, 2310 can generate a primary power signal (e.g., with a single oscillator-amplifier combination) and combine this with generated or amplified noise. While each of these examples demonstrate how a single power source 2110, 2210, 2310 can produce both the primary power signal and the secondary power signal, FIGS. 24-27 will illustrate embodiments where a power source generates the primary power signal and a low level signal source generates the secondary power signal.

FIG. 24 illustrates an embodiment of a power generation system 2400 having a power source 2410, a low level signal source 2411, one or more circuits 2414, an optional sensor 2412 that can be arranged within the power generation system 2400 or an optional sensor 2413 that can be arranged outside the power generation system 2400, and a combiner 2424 that combines the outputs from the power source 2410 and low level signal source 2411. As one of ordinary skill in the art will appreciate, the combiner may be realized by a coupler known in the art.

Figure 25:
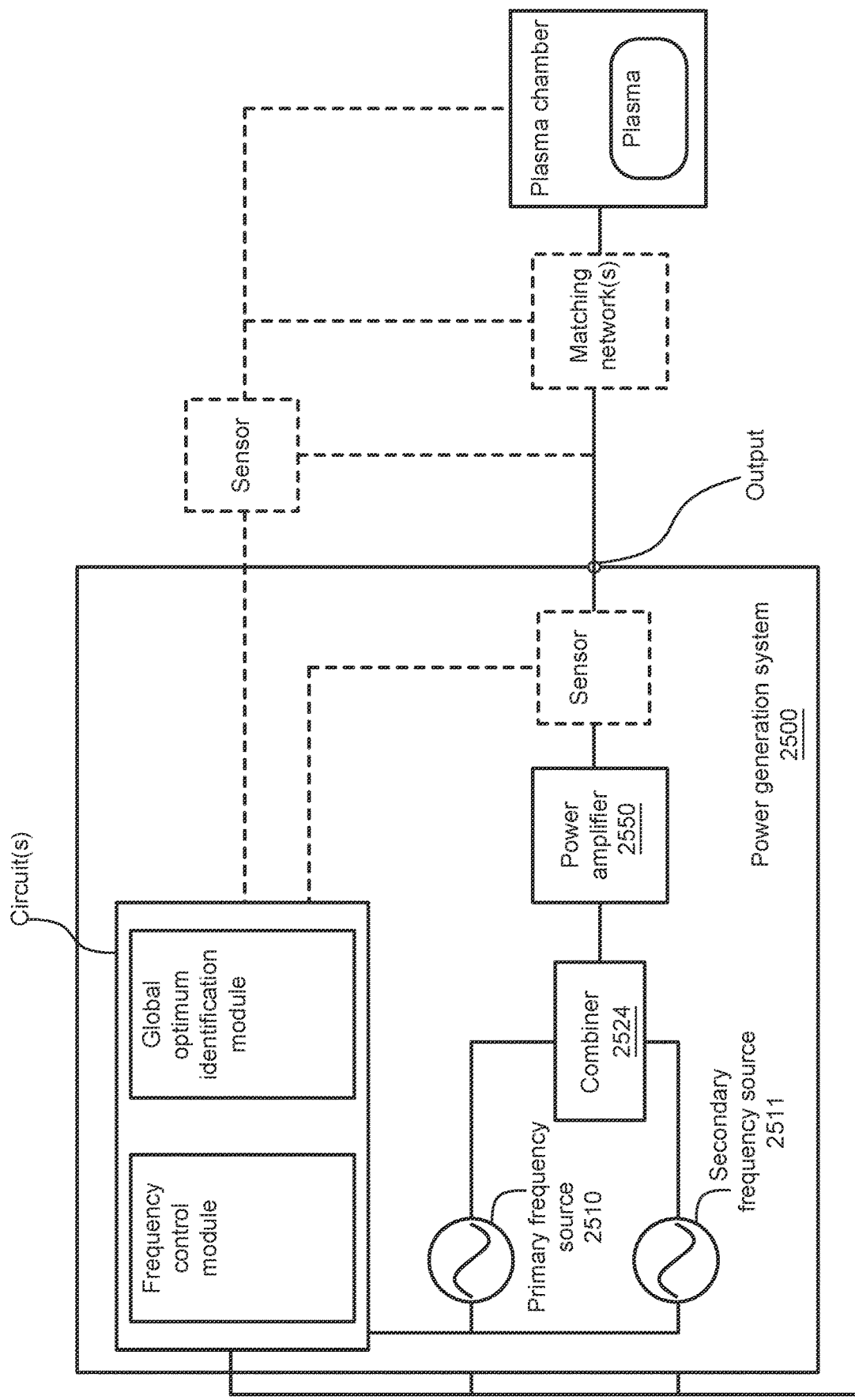
FIG. 25 illustrates an embodiment of a power generation system where the primary power signal and the secondary power signal are combined before amplification by a power amplifier.

FIG. 25 illustrates an embodiment of a power generation system 2500 where the primary and secondary signals are combined before being amplified by a power amplifier 2550.

FIG. 26 illustrates an embodiment of a power generation system 2600 where the power source 2610 generates the primary power signal and a noise source 2613 generates the secondary power signal in the form of noise. The primary power signal and the secondary power signal, or noise, can be combined in the power generation system 2600 and the combined signal can be provided to an output 2620 of the power generation system 2600. As one of ordinary skill in the art will appreciate the noise source 2613 may be realized by a variety of different types of devices comprise a noise diode. Beneficially, the noise source 2613 may generate a continuum of secondary frequencies, and the response of the secondary frequencies may be processed in parallel at a plurality of different frequencies (e.g., by a plurality of demodulating channels or fast Fourier transform module(s)). For example, a reflection coefficient at the plurality of frequencies may be arrived at in parallel to identify a frequency that provides a low reflection coefficient, a stable frequency, or a balance between stability and a low reflection coefficient.

FIG. 27 illustrates an embodiment of a power generation system 2700 where the primary and secondary signals are combined before being amplified by a power amplifier 2750. In this embodiment, the secondary signal is generated by a noise source 2713.

The systems illustrated in FIGS. 21-27 can be more easily understood with reference to the plots seen in FIGS. 28-35.

Figure 28:
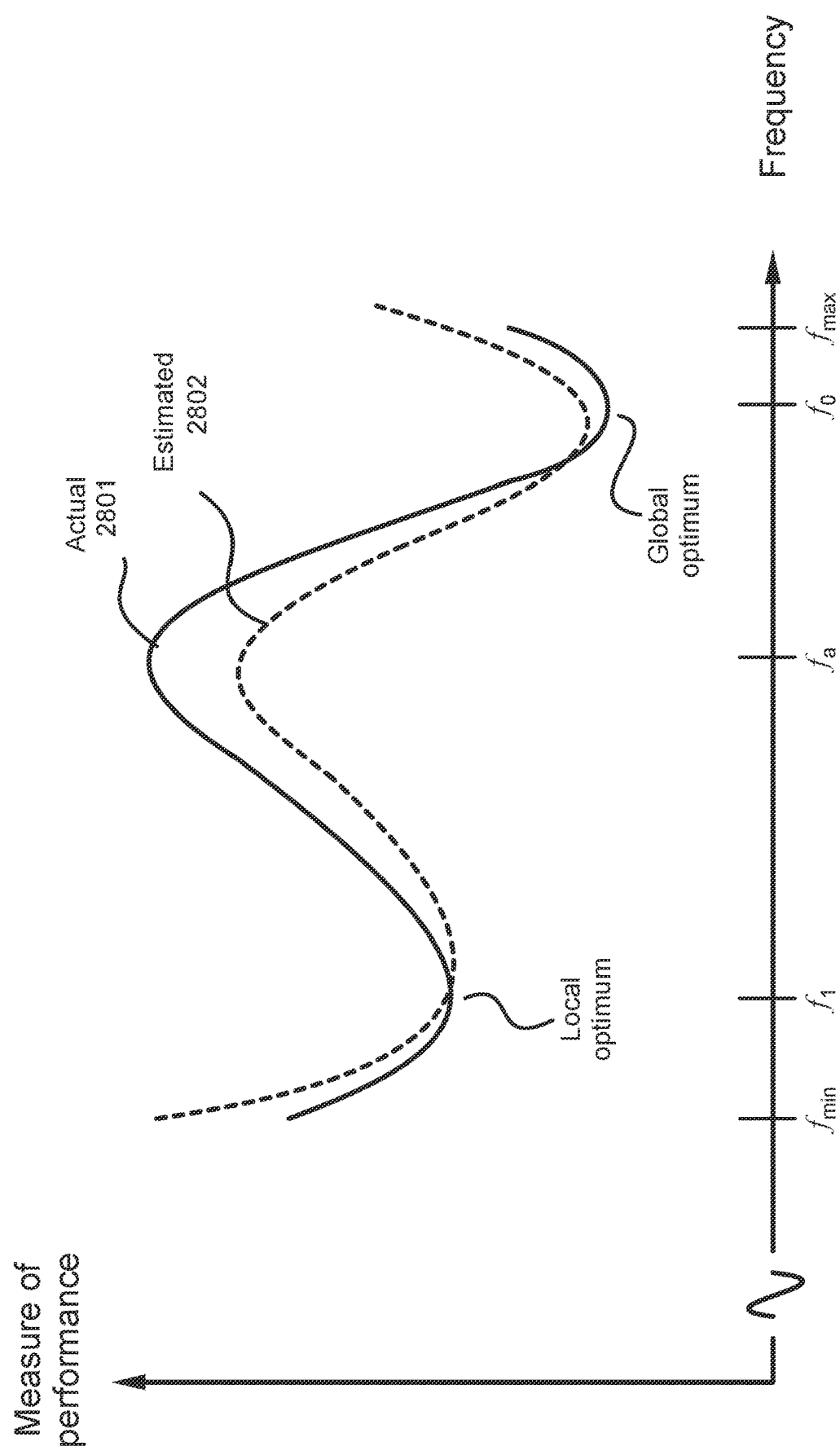
FIG. 28 shows a plot of a measure of performance as a function of frequency.

FIG. 28 shows a plot of a measure of performance as a function of the frequency. The solid line 2801 shows the actual measure of performance (e.g., load reflection coefficient magnitude) as a function of frequency that would result if the primary power signal were adjusted to each frequency and the measurement made. The dotted line, 2802, shows the estimated measure of performance obtained using a secondary power signal or signals while the primary power signal remains at a fixed frequency (e.g., f1).

As discussed, the power level of the primary frequency affects the measure of performance (e.g., load reflection coefficient); thus the measure of performance that is estimated using low-level power signals will differ from the measure of performance at the higher power of the primary signal. But as discussed further herein, the low level signals enable the desired primary frequency (e.g., that produces a low reflection coefficient and/or low instabilities) to be closely estimated. The frequency of the primary signal may then be fine-tuned at the higher power level without testing frequencies that may result in the plasma being extinguished.

Figure 29A:
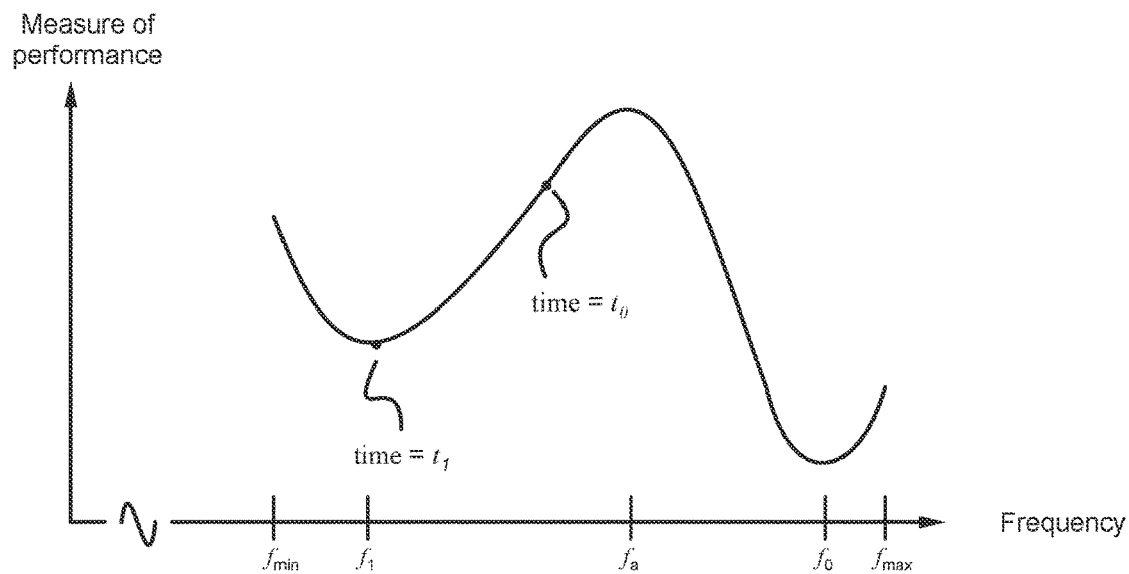
FIG. 29A is a graph depicting a measure of performance (e.g., reflection coefficient) as a function of frequency.
Figure 29B:
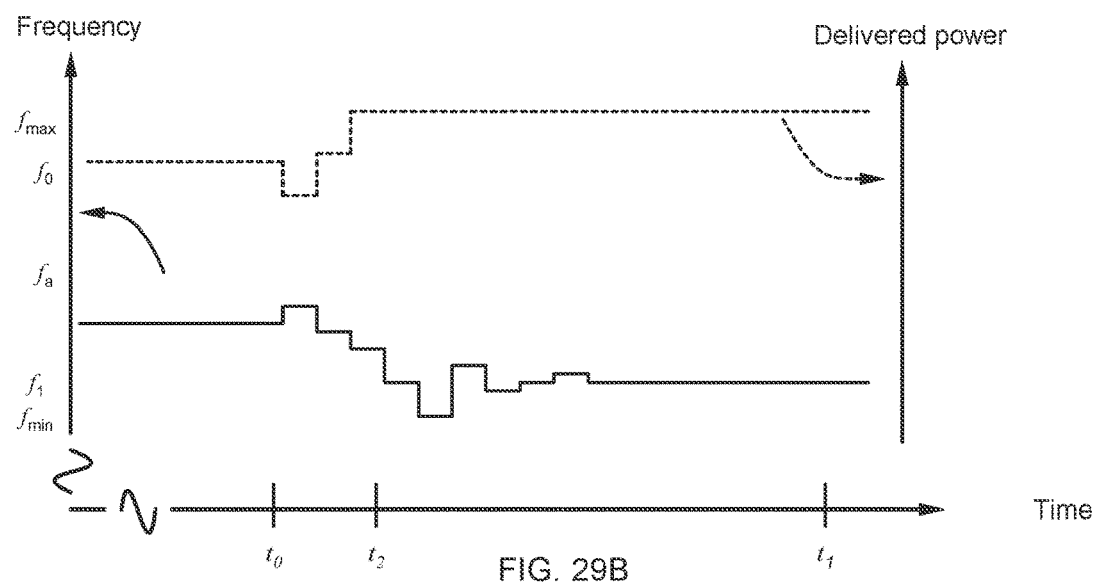
FIG. 29B is a graphical representation depicting how a primary power signal frequency may be adjusted to minimize the measure of performance depicted in FIG. 29A.
Figure 29C:
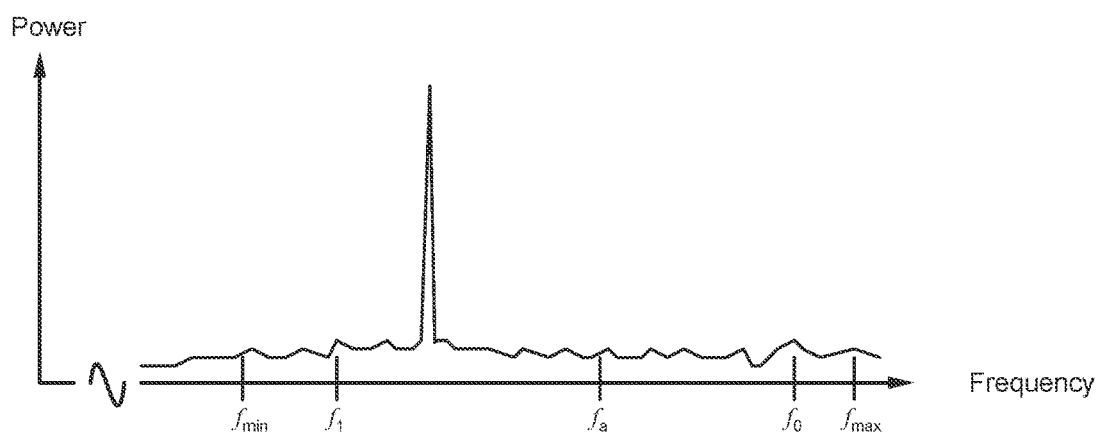
FIG. 29C depicts a spectrum (power per bandwidth, e.g., Watts per 3 kHz bandwidth) of the power generation system output at time t2 in FIG. 29B.

FIG. 29 depicts an aspect where an initial primary frequency may be applied between f1 and fa, and how a frequency tuning algorithm (that relies on sweeping and testing the frequency of the primary power) can become trapped in a local optimum of a measure of performance without the information provided by low power secondary signals. More specifically, a tuning algorithm can tune the primary frequency toward what is believed to be an optimum frequency at f1. In particular, FIG. 29A shows a measure of performance (e.g., reflection coefficient) as a function of frequency; the solid line of FIG. 29B shows how an algorithm using only the primary power could adjust the primary power signal frequency to minimize the measure of performance; and FIG. 29C shows the spectrum (power per bandwidth, e.g., Watt per 3 kHz bandwidth) of the power generation system output 2220, 2320, 2420, 2520, 2620 or 2720 at time t2 in FIG. 29B. As shown by the dotted line in FIG. 29B, a global optimum frequency could be identified using low level secondary signals.

Figure 30A:
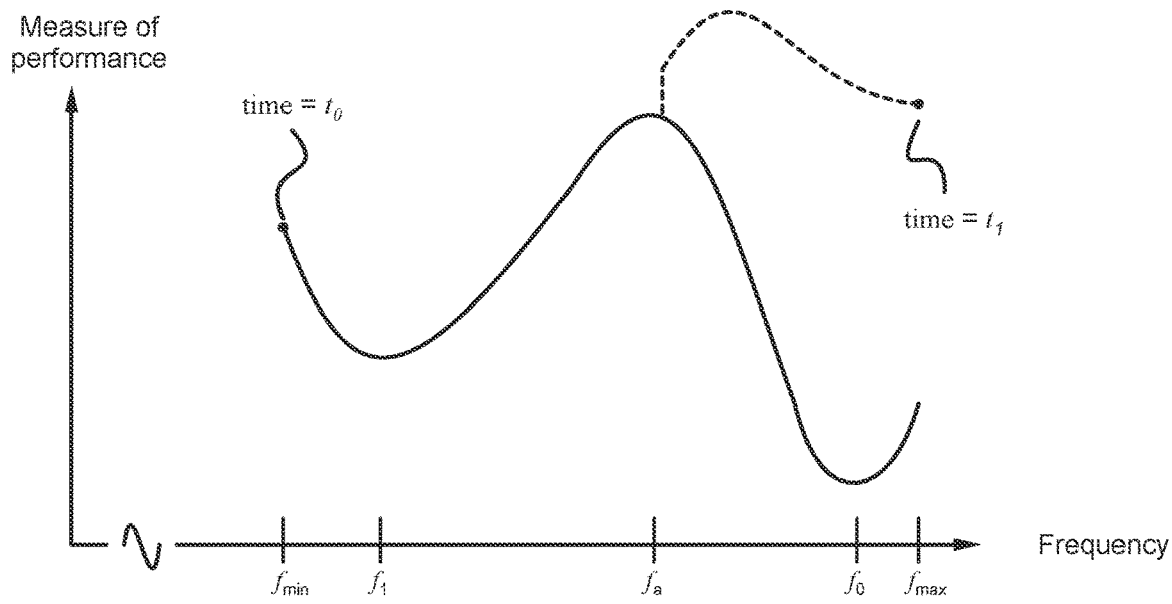
FIG. 30A is a graph depicting a measure of performance versus frequency.
Figure 30B:
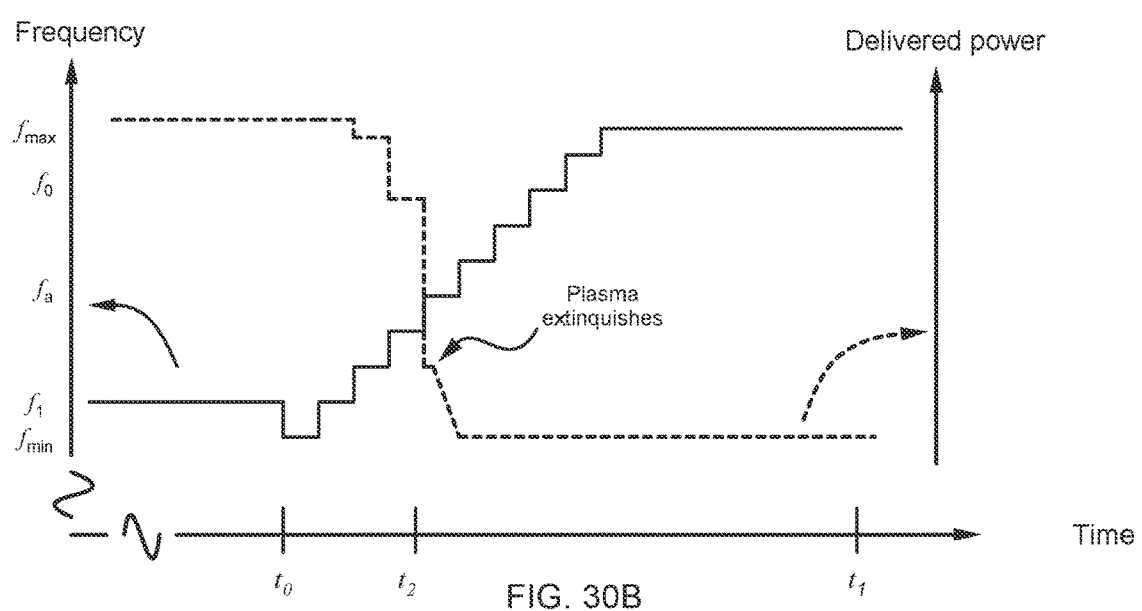
FIG. 30B is a plot depicting how a global search using the primary power signal can lead to an extinguished plasma.
Figure 30C:
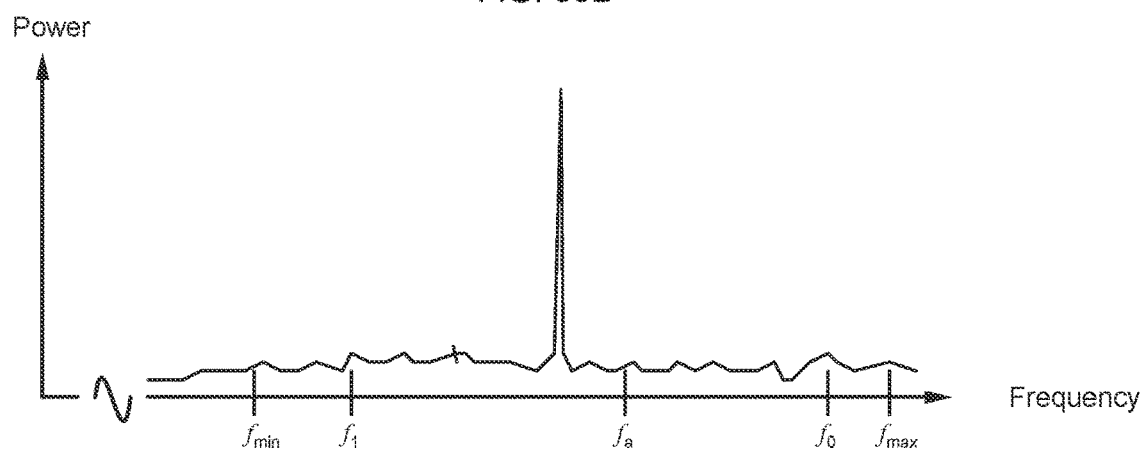
FIG. 30C is a graph showing a spectrum of the power generation system output at time t2 in FIG. 10B.

But as shown by the solid line, upon reaching that local optimum at f1, if the primary frequency is used to search out the global optimum, such attempts might lead to application of power around the frequency fa, which may result in extinguishing the plasma as seen in FIGS. 30A and 30B. FIG. 30A shows a measure of performance as a function of frequency. The solid line in FIG. 30A shows the measure of performance with a lit plasma, and the dotted line shows the measure of performance for an extinguished plasma. FIG. 30B shows how a global search using the primary power signal can lead to an extinguished plasma because not enough power can be delivered around fa to sustain the plasma. FIG. 30C shows the spectrum of the power generation system output at time t2 in FIG. 30B.

Instead, one or more secondary power signals can be used to search out the global optimum, as shown in FIG. 31 (showing one secondary power signal) and FIG. 32 (showing multiple secondary power signals), while the primary power signal remains at a fixed frequency (e.g., at or near a local optimum). In FIG. 31, shown is frequency tuning using a secondary power signal in the form of a low level signal at a single secondary frequency applied in a particular order. FIG. 32 shows frequency tuning using a secondary power signal in the form of a low level signal with spectral components at multiple secondary frequencies adjusted according to an algorithm to optimize a measure of performance.

As shown, the one or more secondary power signals can be applied at power levels far below that of the primary power signal and can be applied at one or more secondary frequencies. The secondary frequencies can be fixed frequencies with equal or unequal spacing, or can be variable frequencies as shown in FIG. 32. Further, the primary and secondary power signal(s) can be applied concurrently.

As illustrated in FIG. 31 the secondary signals (probe frequencies) can be applied continuously, or as illustrated in FIG. 32, only while searching for a global optimum. Further, while a single characteristic is shown in the plots of FIGS. 28-33, in other embodiments, multiple characteristics, e.g., load reflection coefficient magnitude together with plasma stability measured through (e.g., fluctuations in load impedance) can be simultaneously monitored and an analysis of all the monitored characteristics (or a plurality of the monitored characteristics) can be used to identify a global optimum. In this way, the global optimum is identified without applying the full power of the primary signal around fa or any frequencies that could extinguish the plasma.

In some modes of operation, the amplitude of the one or more secondary power signals applied at the one or more secondary probe frequencies is so small that it can be considered negligible in comparison to the primary power signal, and hence, does not have a significant influence on the plasma. In other applications, the amplitude of the secondary power signal or signals may be significant compared to the primary power signal if the goal is simply to not extinguish the plasma while searching for the global optimum. In such a case care must be taken not to exceed the voltage and current ratings of the plasma system because of high resulting amplitude at the beating frequencies.

FIG. 31 shows an embodiment where a single secondary probe frequency is continuously swept over a frequency range. The range over which the secondary probe frequency(s) is (are) swept would typically be the range of frequencies over which the power generation system is expected to operate (e.g. 12.882 to 14.238 MHz), but it does not have to be the case. Examples in which other frequency ranges can be considered comprise when information about the plasma condition is extracted using the secondary power signals by, for example, analyzing mixing and intermodulation products. In other cases as illustrated in FIG. 32, the secondary probe frequency or frequencies can be adjusted according to an algorithm to find the optimal frequency rather than sweep in a pre-determined pattern as shown in FIG. 31. Also as shown in FIG. 32, once a global optimum has been identified, the secondary power signals may be shut off rather than be applied continuously as shown in FIG. 31.

Figure 31A:
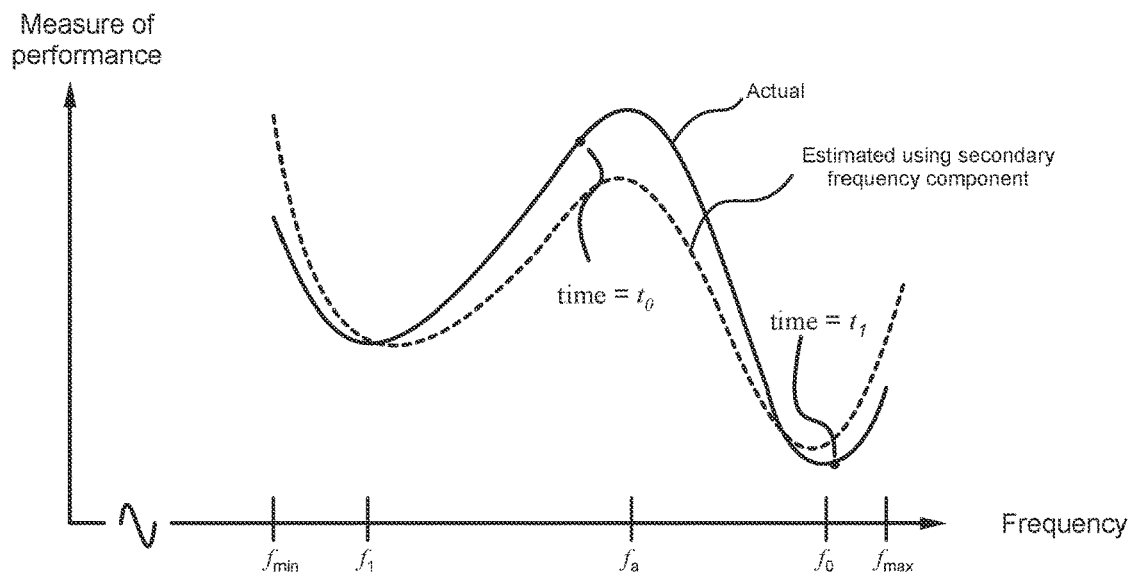
FIG. 31A is graph depicting an estimate of optimum frequency using a secondary power signal.
Figure 31B:
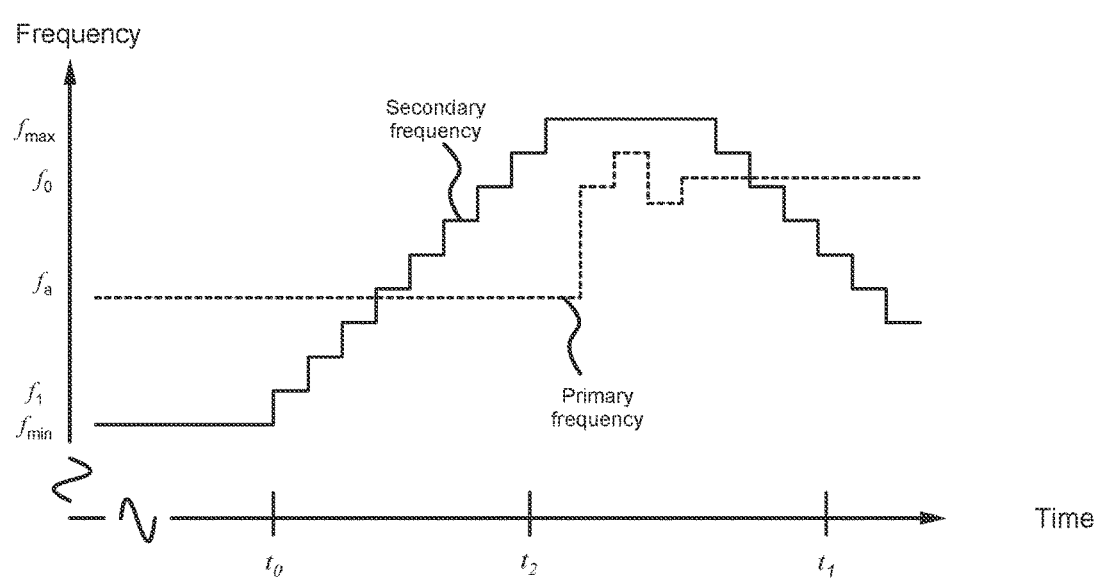
FIG. 31B is a graph depicting adjustment of a primary frequency after a determination of the desired frequency using a secondary power signals.
Figure 31C:
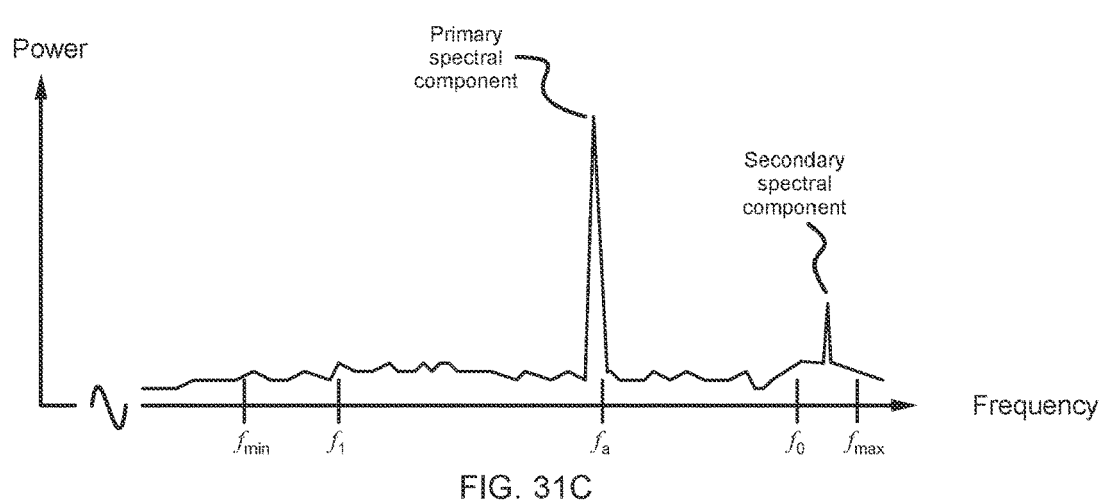
FIG. 31C is a graph showing spectral components of the power at the primary signal and the secondary signal of FIG. 31B.
Figure 32A:
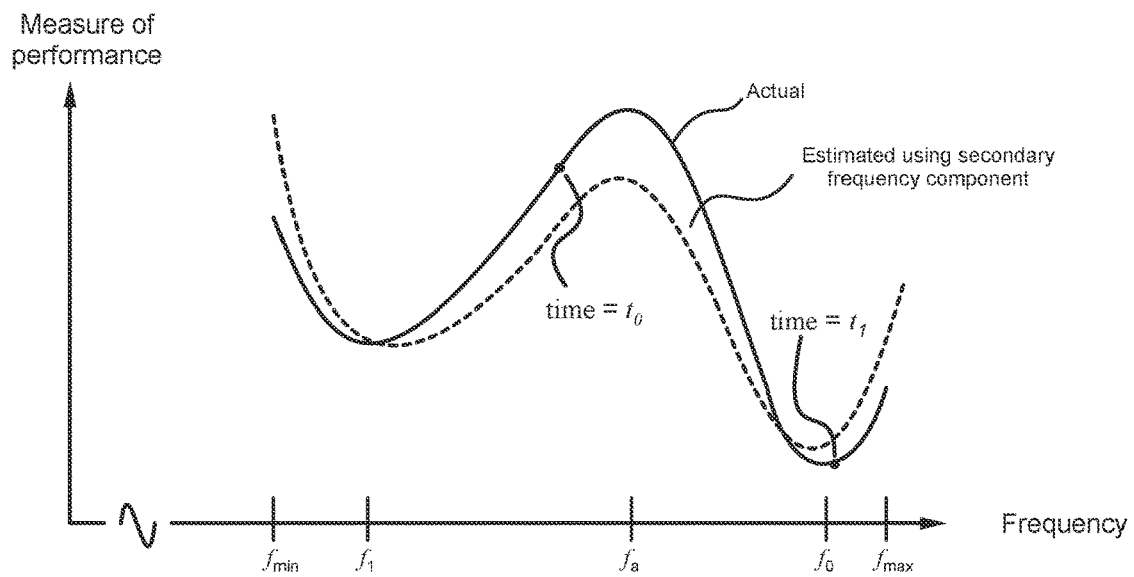
FIG. 32A is a graph depicting an estimate of optimum frequency using a secondary power signal.
Figure 32B:
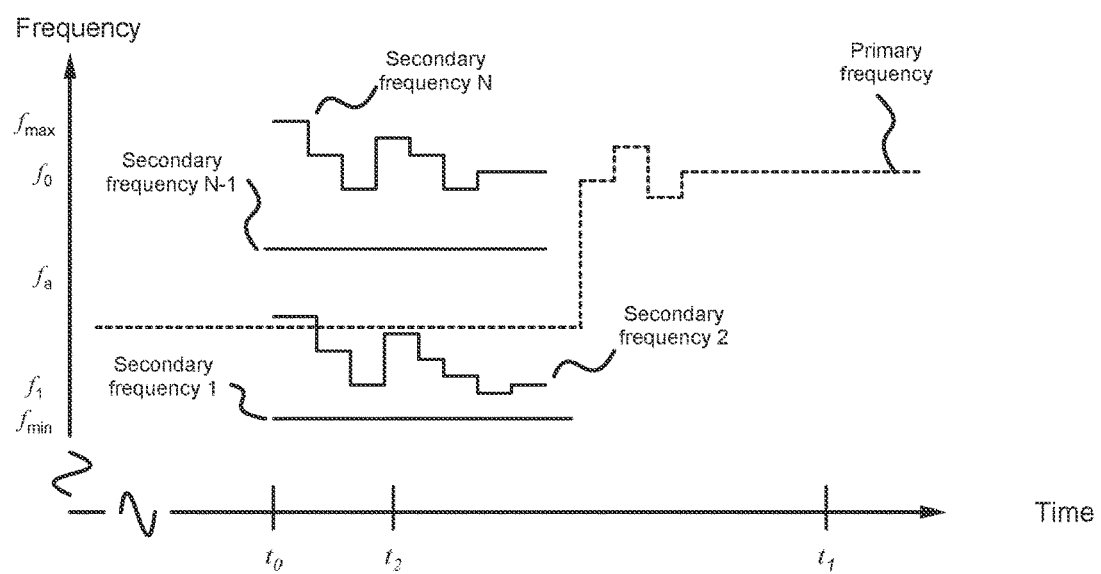
FIG. 32B is a graph depicting adjustment of a primary frequency after a determination of the desired frequency using secondary power signals.
Figure 32C:
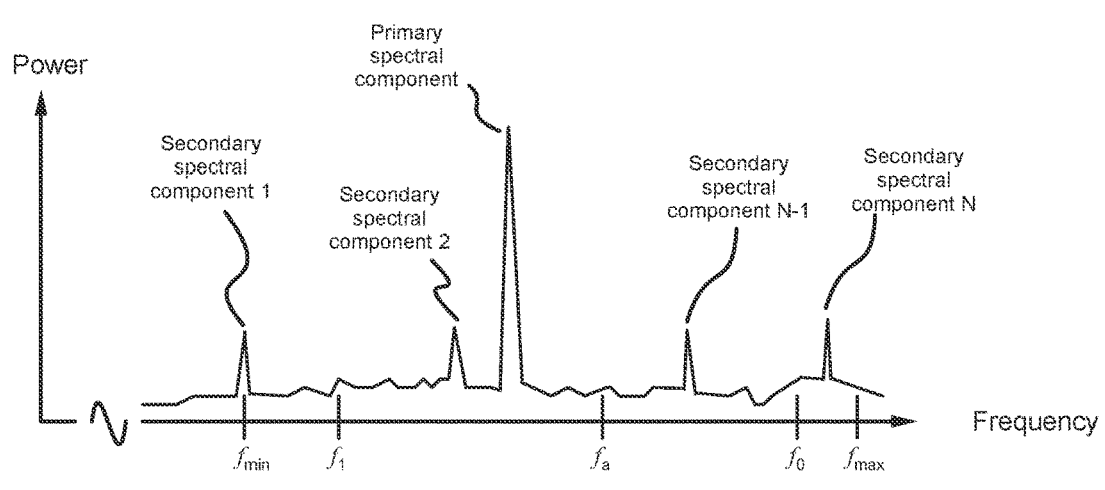
FIG. 32C is a graph depicting spectral components of the power at the primary signal and the secondary signals of FIG. 32B.

As illustrated in FIG. 31A and FIG. 32A, the estimate of optimum frequency using the secondary power signal or signals may not correspond exactly to the true optimum. Typically such discrepancy would result from the nonlinear nature of the plasma load. As illustrated in FIG. 31B and FIG. 32B, following a determination of the optimum frequency using the secondary power signals, the primary frequency may be adjusted to further optimize performance. FIGS. 31C and 32C depict spectral components of the primary and secondary probe frequencies of FIGS. 31B and 31C, respectively.

Figure 33A:
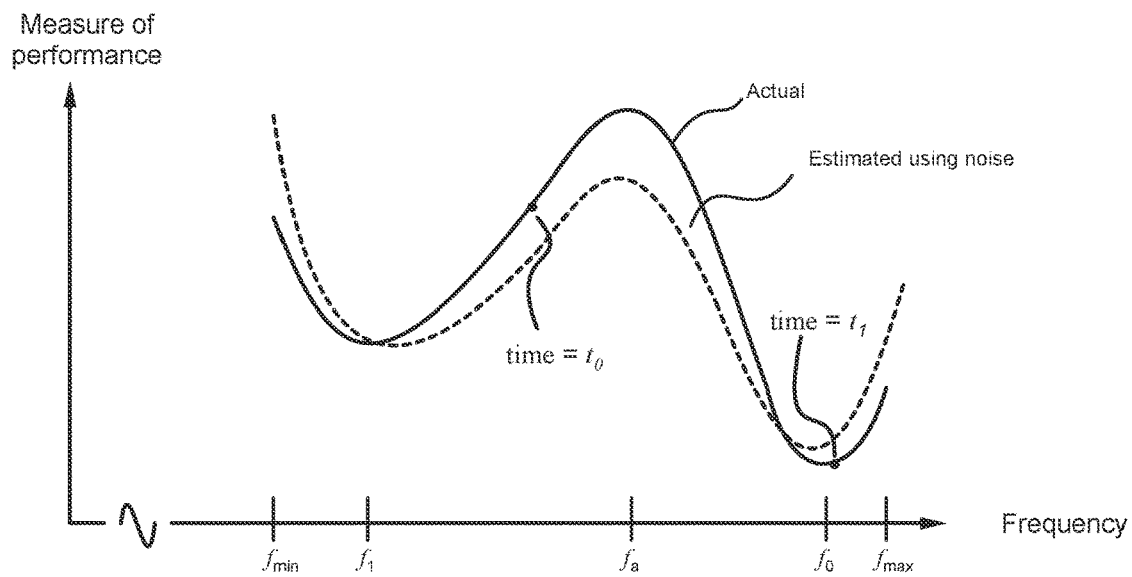
FIG. 33A is a graph depicting an estimate of optimum frequency using a secondary power signal.
Figure 33B:
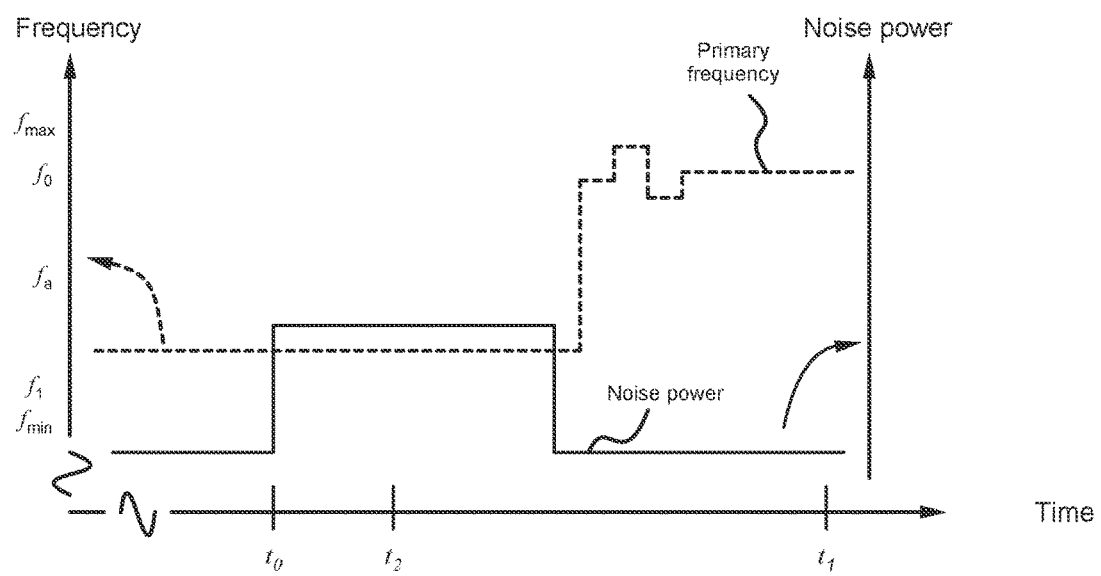
FIG. 33B is a graph depicting noise power as a function of time where noise is added to the power generation system output.
Figure 33C:
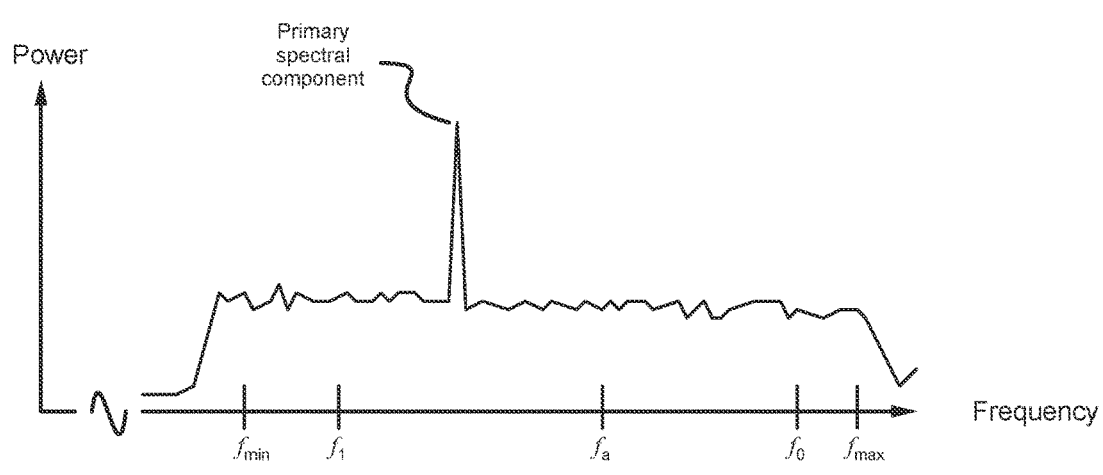
FIG. 33C is a graph depicting shows the spectrum of the power generation system output at time t2 in FIG. 33B.
Figure 34A:
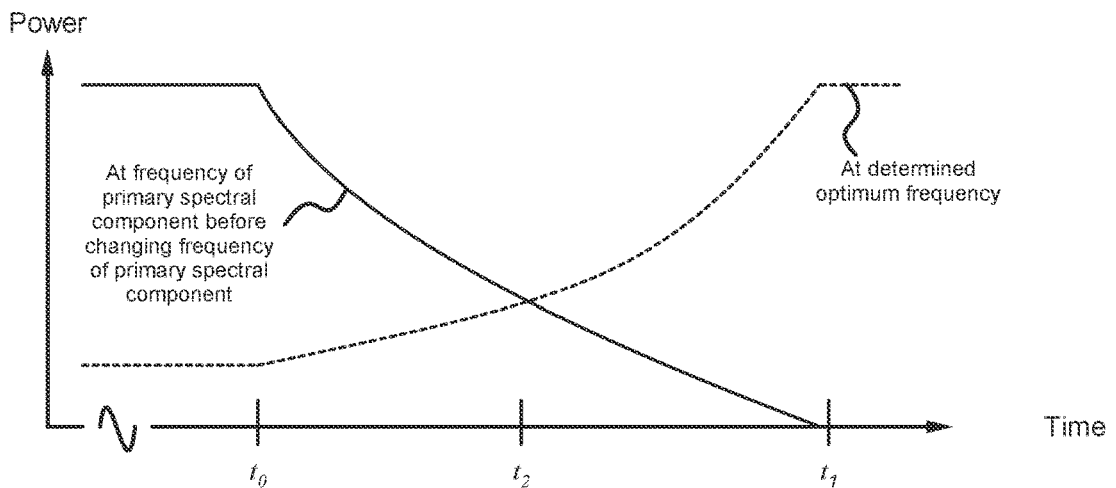
FIG. 34A is a graph depicting aspects of a method for frequency tuning.
Figure 34B:
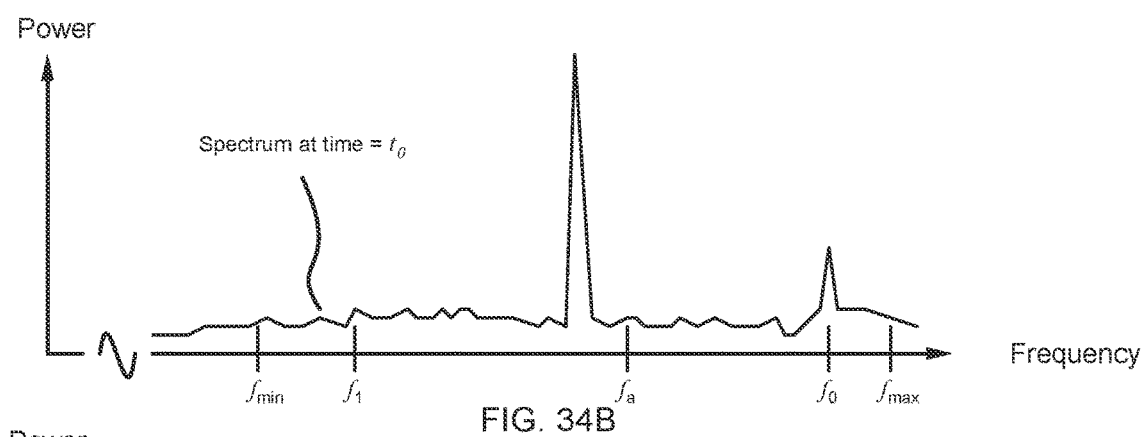
FIG. 34B is a graph depicting additional aspects of the method for frequency tuning shown in FIG. 34A.
Figure 34C:
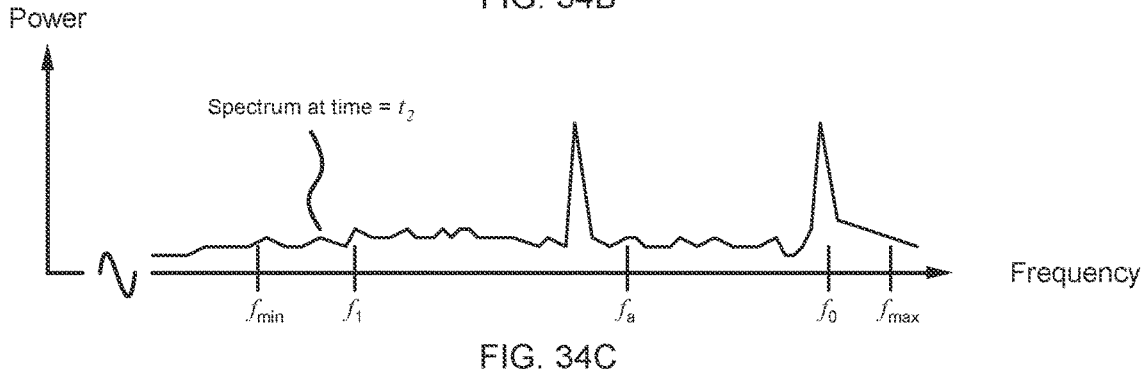
FIG. 34C is a graph depicting further aspects of the method for frequency tuning depicted in FIGS. 34A and 34B.
Figure 34D:
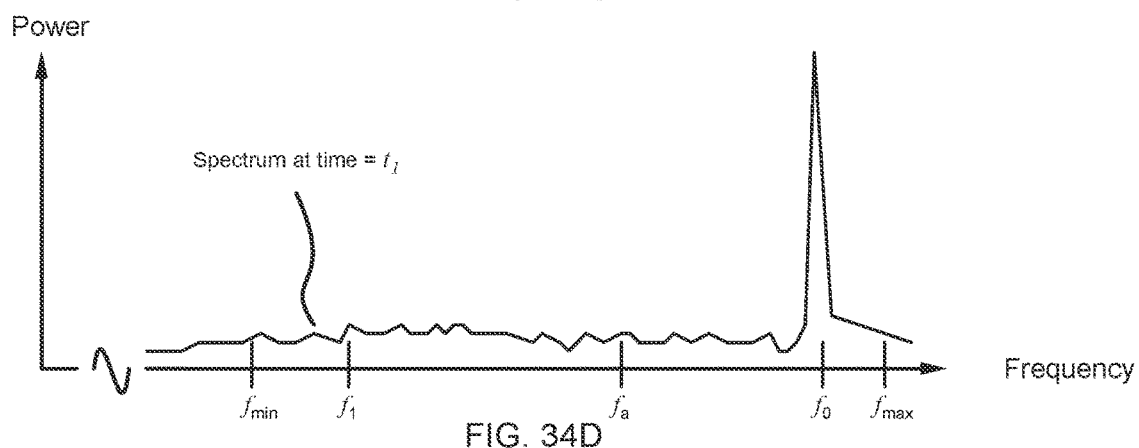
FIG. 34D is a graph depicting yet additional aspects of the method for frequency tuning depicted in FIGS. 34A, 34B, and 34C.

FIGS. 33A-33C show the case where the secondary power signal is noise. FIG. 33C shows the spectrum of the power generation system output at time t2 in FIG. 33B. The noise can either be inherent to the primary power signal or can be added to the power generation system output (e.g., see FIGS. 26 and 27). FIG. 33B shows noise power as a function of time assuming the case where noise is added to the power generation system output.

Figure 35A:
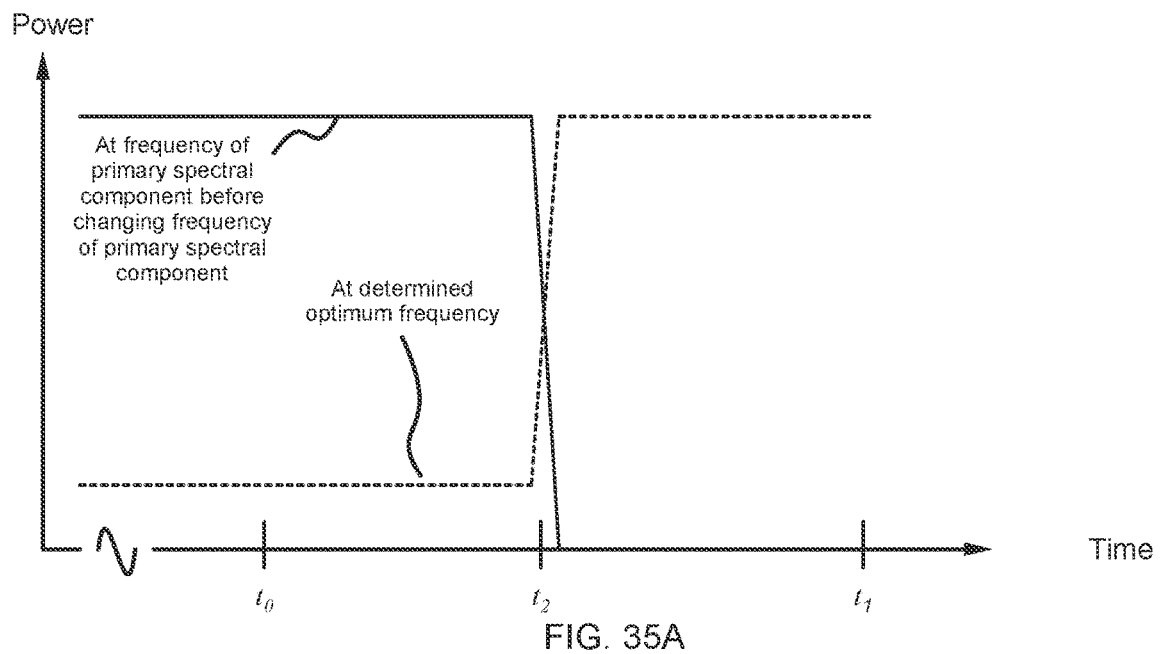
FIG. 35A is a graph depicting aspects of a method for frequency tuning.
Figure 35B:
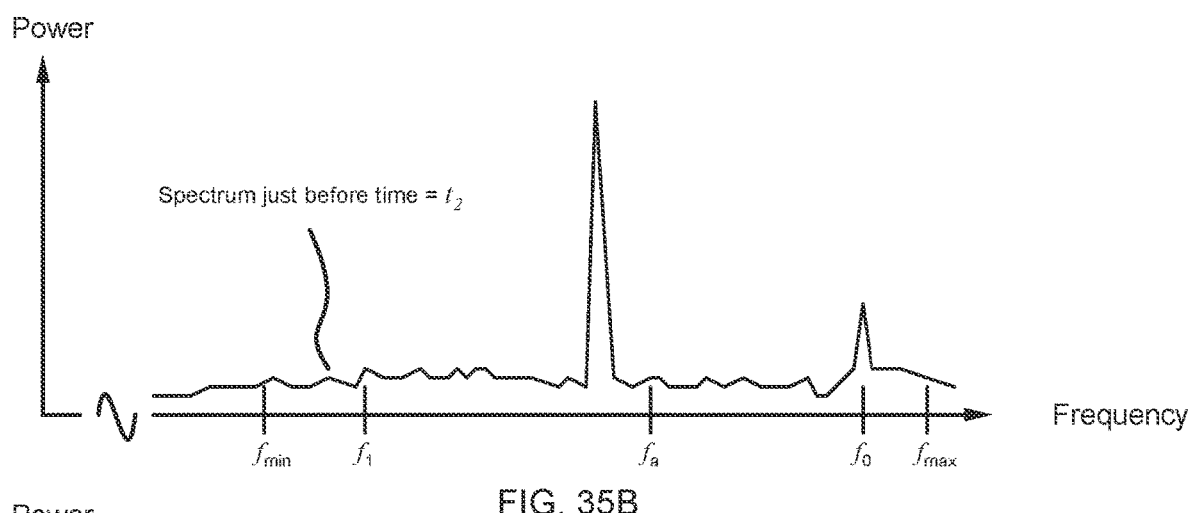
FIG. 35B is a graph depicting additional aspects of the method for frequency tuning depicted in FIG. 35A.
Figure 35C:
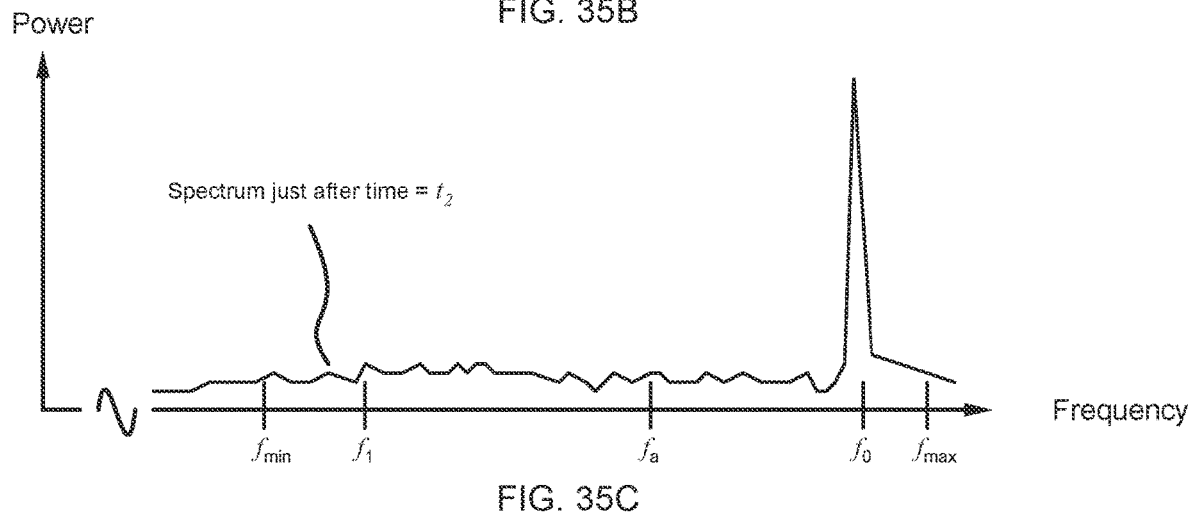
FIG. 35C is a graph depicting further aspects of the method for frequency tuning depicted in FIGS. 35A and 35B.

Once a global optimum has been identified, the primary power signal can be adjusted or switched to (or toward) the frequency corresponding to the global optimum without the primary power signal passing through regions of the frequency spectrum that could inhibit the plasma (e.g., near fa). For instance, in FIG. 14, the primary power signal amplitude is ramped down while an amplitude of the secondary frequency at the global optimum is ramped up. In this way, the primary power signal and the secondary power signal switch places. FIG. 35 shows another variation of switching the primary frequency toward the global optimum, in which the frequency of the primary power signal is changed abruptly to the identified global optimum frequency.

In some embodiments, the identified global optimum frequency can be selected from one of the secondary frequencies, but this is not necessary. For instance, the identified global optimum frequency may be between two of the two or more secondary frequencies. For instance, interpolation between ones of the secondary frequencies can be used to identify the identified global optimum frequency.

Figure 36:
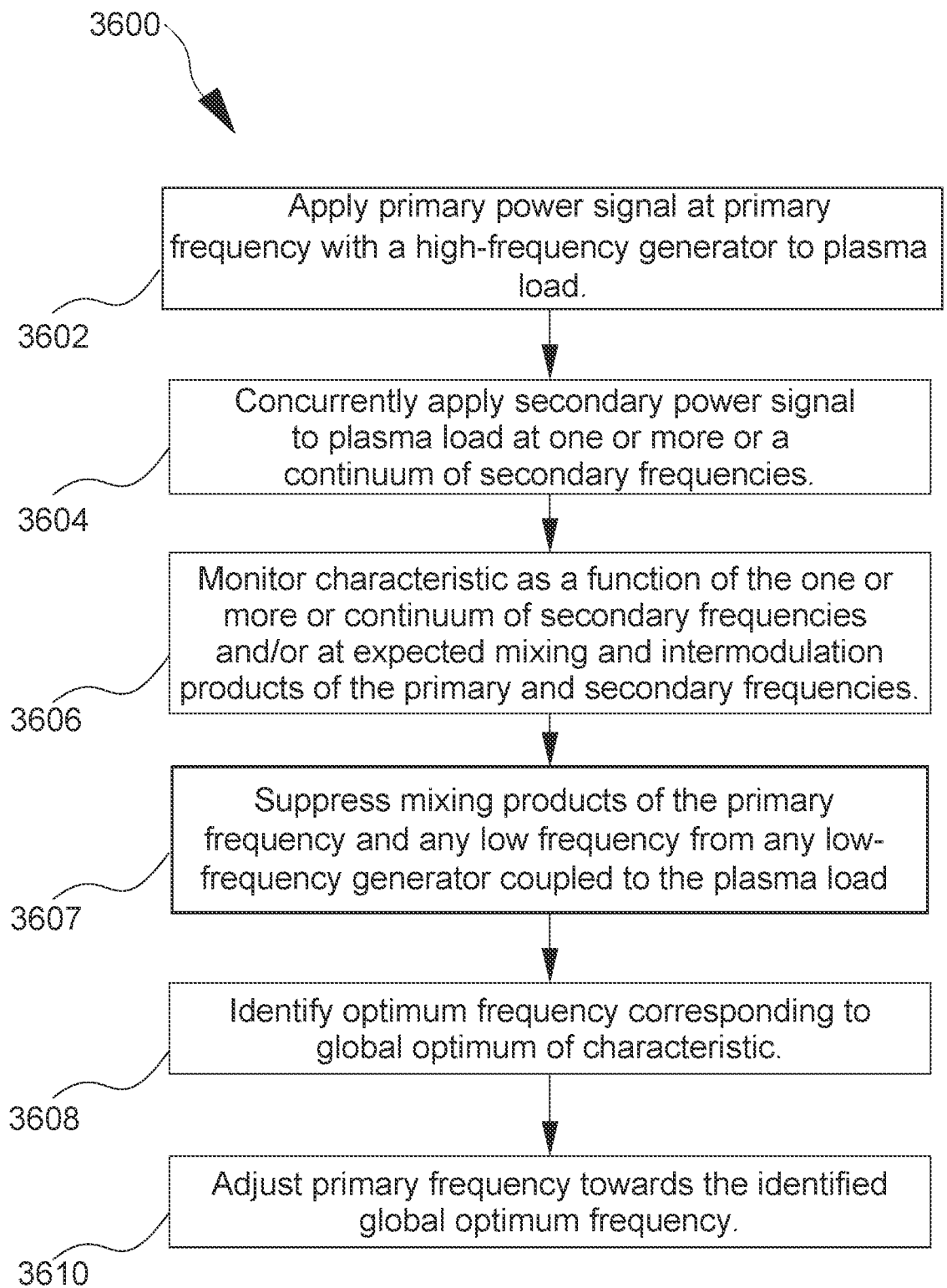
FIG. 36 illustrates a method for frequency tuning a power generation system that may be traversed in connection with embodiments described herein.

FIG. 36 illustrates a method for frequency tuning a power generation system to hone in on a global optimum of a measure of performance using a secondary probe signal to find the global optimum. The method 3600 applies a primary power signal (e.g., with the high-frequency generator 102) primarily at a primary frequency to a plasma system (e.g., matching network(s) 2104 connected to a plasma chamber 2108) (Block 3602). Concurrently, the method 3600 applies a low-level signal to the plasma system at one or more or a continuum (e.g., as in the case of noise) of secondary probe frequencies (Block 3604).

The low-level signal can be periodic or the sum of periodic signals, can be noise inherent to the primary power signal, or can be noise added to the primary power signal. The one or more secondary frequencies can be equally spaced in frequency or can have a varying spacing. The one or more secondary frequencies can be applied all at once or at separate times and can be adjusted over time. The one or more secondary frequencies can be swept across a fixed range of frequencies. Alternatively, the one or more secondary frequencies can be adjusted via feedback to probe for and hone in on a global optimum. The one or more secondary or continuum of secondary frequencies can be applied all the time or only while needed.

The method 3600 monitors a characteristic that is a measure of performance (e.g., load reflection coefficient magnitude) as a function of frequency, particularly at the one or more or continuum of secondary frequencies and/or at the primary frequency and/or at expected mixing and intermodulation products of the primary and secondary frequencies (Block 3606). As shown, mixing products of the primary frequency and any low frequency from any low-frequency generator (e.g., low frequency generator 108) are suppressed (e.g., with the filter 104)(Block 3607). The method 3600 then identifies an optimum frequency corresponding to a global optimum of the characteristic (Block 3608). This can be done via minimization and maximization algorithms familiar to those of skill in the art. Finally, the method 3600 adjusts the primary frequency of the primary power signal to the optimum frequency identified in the identifying operation (Block 3610). This adjustment can be made in a variety of ways. For instance, the adjustment may have to avoid applying primary power only in regions where reflected power approaches 100% (e.g., around fa in FIG. 28) for extended periods of time since this may extinguish the plasma (unless e.g. the plasma is sustained by another power source 2150 or 2151). So, the primary power signal can be switched to the optimum frequency or the power levels of the primary and secondary power signals can be gradually reversed such that the power signals reverse places, to name two non-limiting examples.

In some embodiments, the method 3600 ends when the primary power signal has been moved to a frequency identified as the global optimum using the secondary power signal or signals. But in other instances, the method 3600 can loop to further refine the optimization or to account for changes to the global optimum due to e.g. the nonlinear nature of the plasma load or parameters that may change over time (e.g., plasma chamber gas pressure).

The identifying of an optimum frequency (Block 3608) can occur in real time as samples are obtained from the monitoring (Block 3606) or the analysis can occur after a range of frequencies has been sampled. The moving of the primary frequency (Block 3610) can occur only once the global optimum has been identified (Block 3608) or it can occur as soon as a more optimal frequency than the current primary frequency is identified.

The method of using a secondary power signal to monitor characteristics can also be used for the purpose of identifying plasma characteristics or changes in plasma characteristics. Instead of identifying an optimum frequency and adjusting the primary frequency towards the identified global optimum, the output or monitoring a characteristic (Block 3608) can be used to identify the plasma characteristics or changes in plasma characteristics. Monitoring mixing and intermodulation products can be used to monitor the nonlinear behavior of the plasma or simply to detect whether or not the plasma is lit. Rather than looking at particular mixing and intermodulation produces, higher order statistics (e.g., the bispectrum) can be used to identify plasma characteristics or changes in plasma characteristics.

Figure 37A:
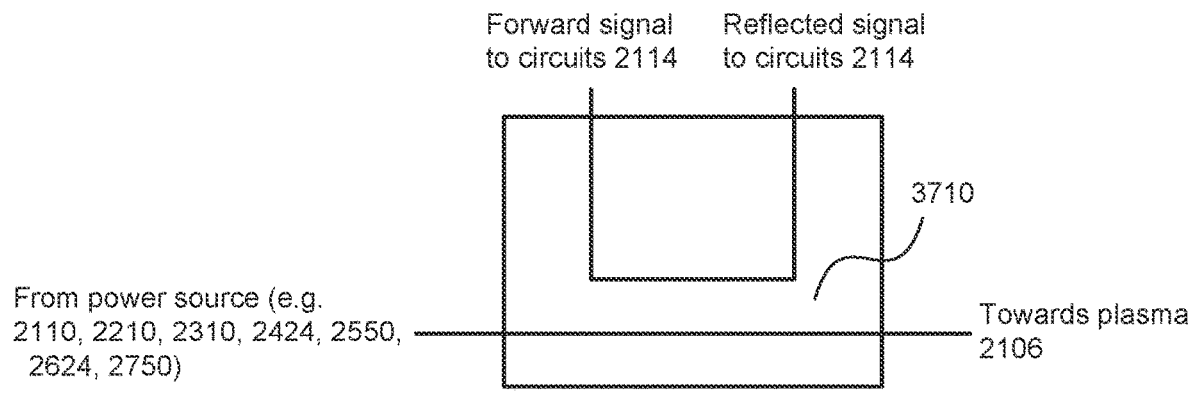
FIG. 37A is a diagram depicting an exemplary sensor.
Figure 37B:
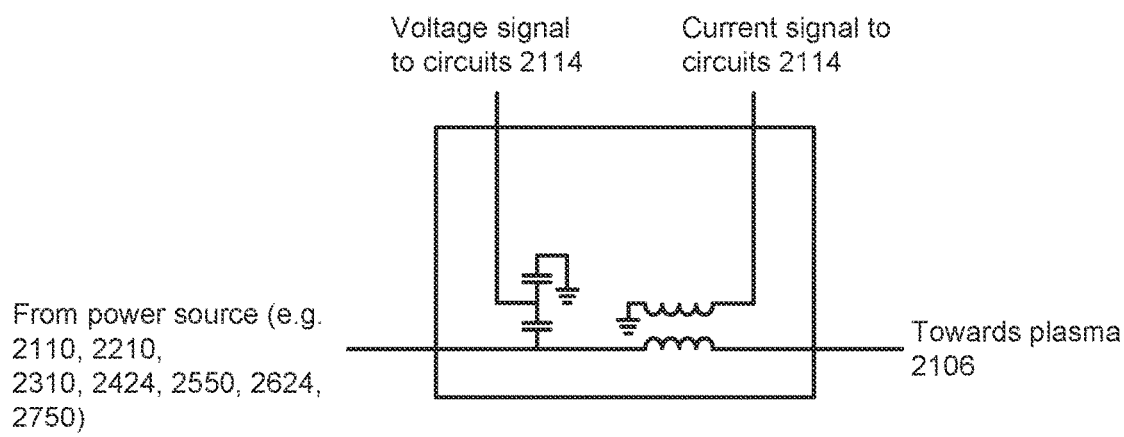
FIG. 37B is a diagram depicting another embodiment of a sensor.
Figure 37C:
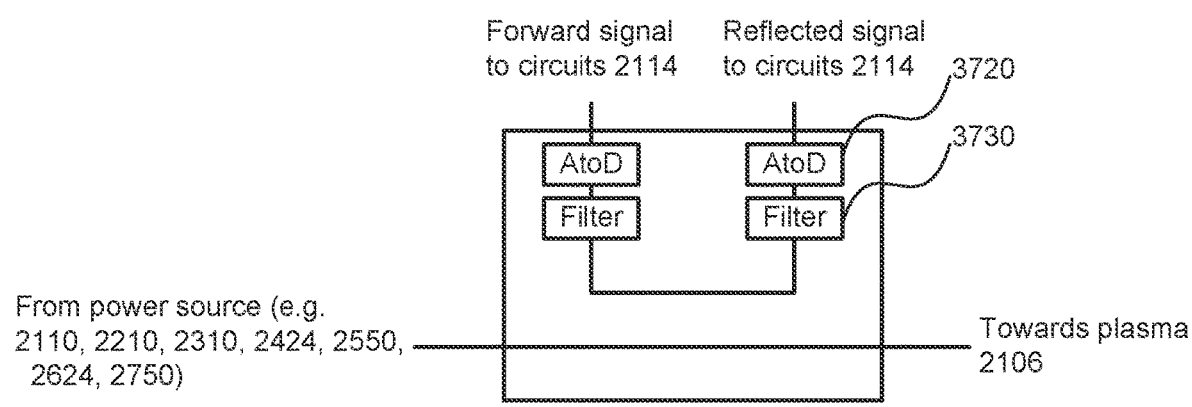
FIG. 37C is a diagram depicting yet another embodiment of a sensor.

FIG. 37 shows three exemplary implementations of the sensor e.g. sensor 2112 or 2412. The sensor can, e.g., be a directional coupler 3710 as shown in FIG. 37A or a voltage and current (VI) sensor as shown FIG. 37B, and either implementation can comprise a filter 3730 and analog to digital converter 3720 as shown FIG. 37C.

Figure 38:
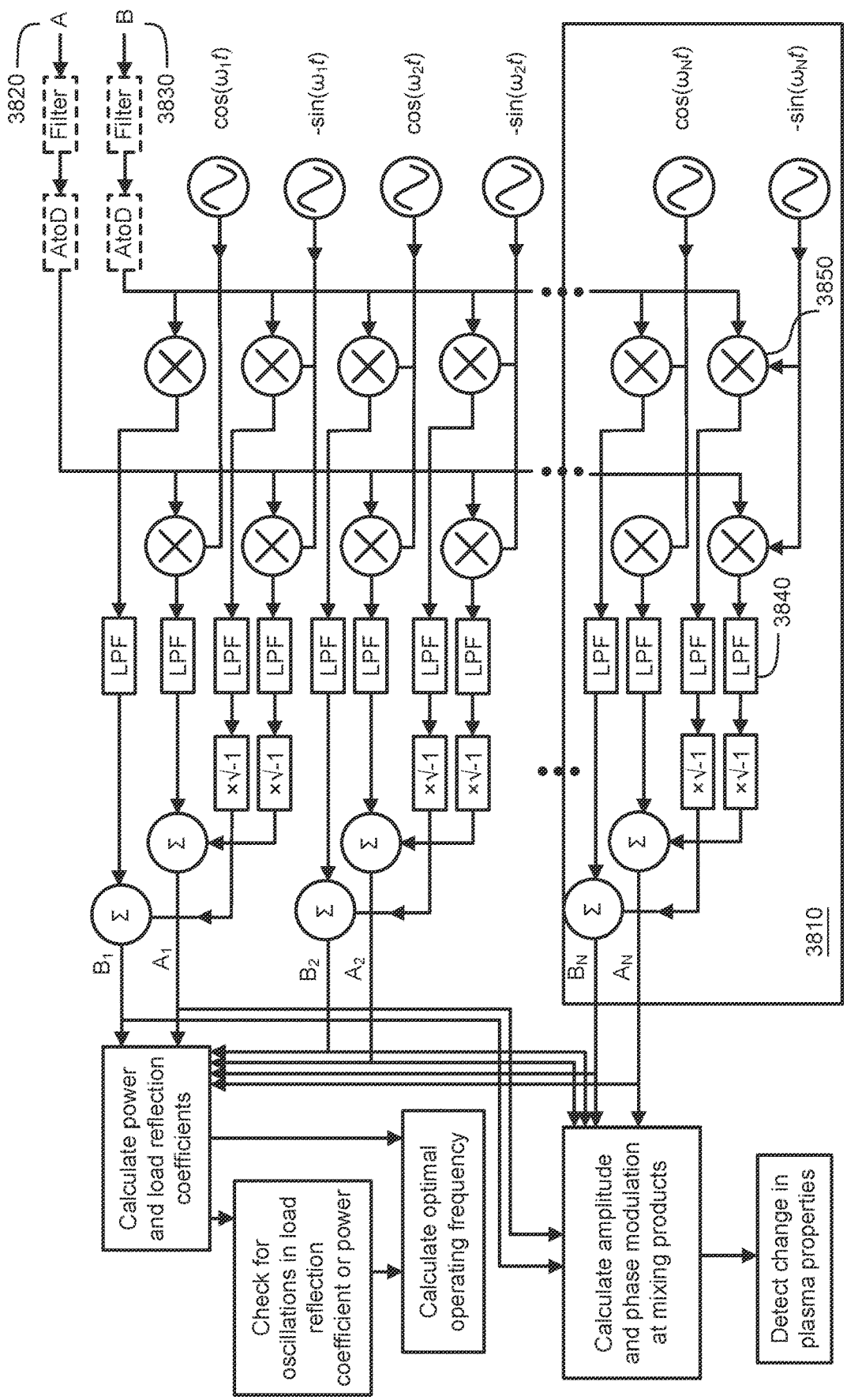
FIG. 38 is a diagram depicting aspects of an exemplary identification module.

FIG. 38 shows an exemplary implementation of the global optimum identification module (e.g., 2116 or 2418). Part of the functionality shown in FIG. 38 can also be part of the sensor. FIG. 38 shows an implementation using multiple demodulators 3810 allowing the processing of multiple frequency components at the same time. The signals 3820 (labeled A) and 3830 (labeled B) can, for example, be forward and reflected power or voltage and current or some other measurement of interest. After multiplication 3850 by cosine and sine functions and filtering 3840, complex vector representations of A and B at different frequencies labeled $A_1$, $B_1$ through $A_N$, $B_N$ are used in the calculation of power and load reflection coefficients at multiple frequencies. Typically one channel will be reserved for the primary frequency. The other channels can be set to the secondary frequency or frequencies or to expected mixing and intermodulation products. As noted before this is just one implementation and many other implementations using, for example, e.g., the discrete Fourier transform rather than dedicated demodulation channels are possible.

The illustrated arrangements of the components shown in FIGS. 21-27 are logical, the connections between the various components are exemplary only, and the depictions of these embodiments are not meant to be actual hardware diagrams; thus, the components can be combined or further separated in an actual implementation, and the components can be connected in a variety of ways without changing the basic operation of the systems.

Instead of a single secondary power source, as seen in FIGS. 24-27, two, three, four, or more secondary power sources could be used to generate two or more secondary power signals.

For the purposes of this disclosure, the secondary power signal can be periodic, for instance, an RF signal. However, in other embodiments, non-periodic power signals can be used (e.g., noise).

While this disclosure has repeatedly shown tuning for local and global minima, one of skill in the art will appreciate that tuning for local and global maxima is also envisioned and this disclosure can easily be applied to monitored characteristics where the primary frequency of the delivered power is optimized for a global maximum of a monitored characteristic. Moreover, the frequency tuning described herein need not be performed to arrive at local or global maxima/minima. Instead, applications where it is beneficial to arrive at a detuned frequency may be preferred in some instances, e.g., where a frequency of the high-frequency generator (e.g., high-frequency generator 102) that achieves a stable plasma is preferred over a minimum level of reflected power.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in non-transitory memory comprising RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 39:
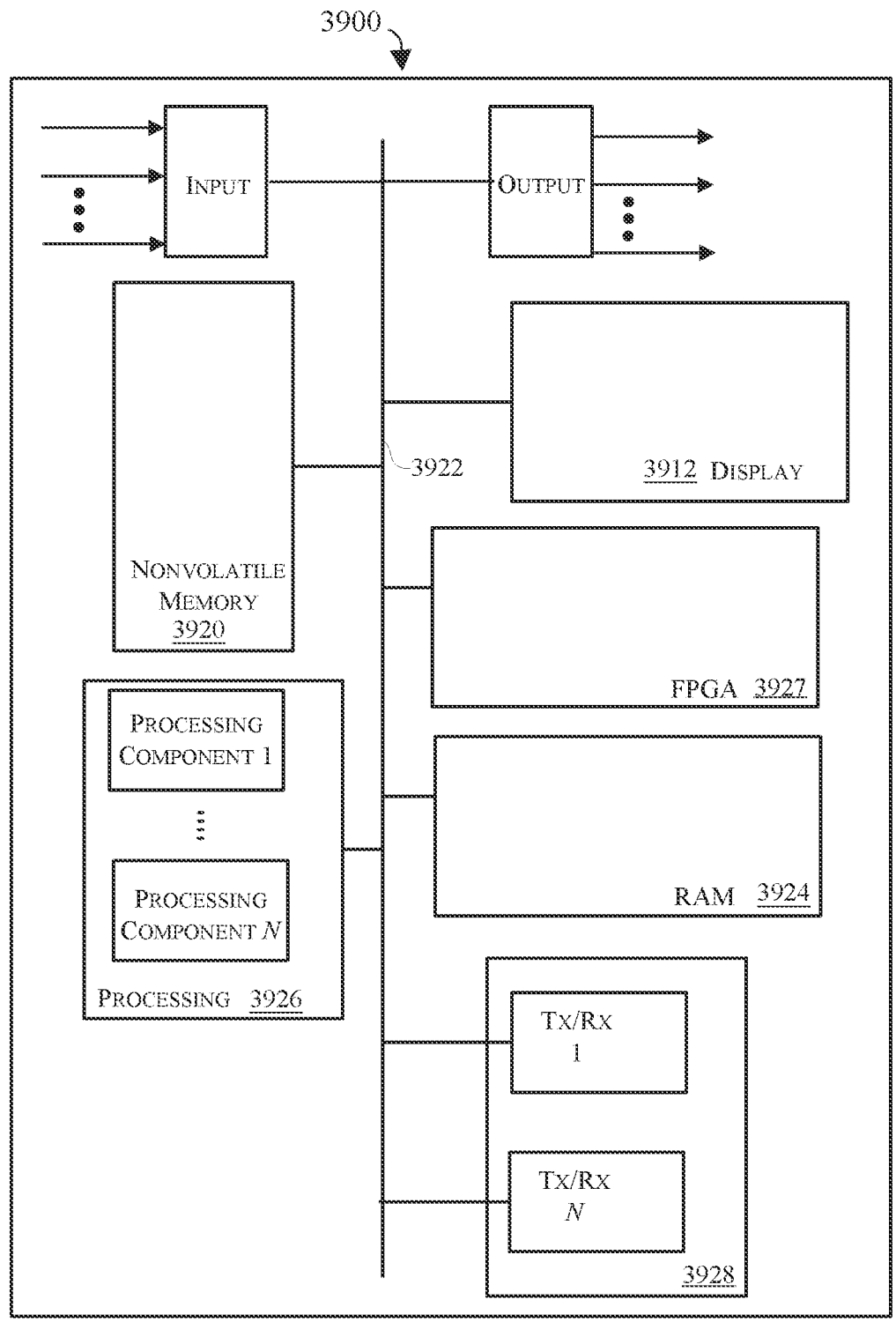
FIG. 39 is a block diagram depicting components that may be utilized to realize embodiments disclosed herein.

Referring to FIG. 39, shown is an example of a computing system 3900 that may be utilized in connection with the embodiments disclosed herein. As shown, a display 3912 and nonvolatile memory 3920 are coupled to a bus 3922 that is also coupled to random access memory ("RAM") 3924, a processing portion (which comprises N processing components) 3926, a field programmable gate array (FPGA) 3927, and a transceiver component 3928 that comprises N transceivers. Although the components depicted in FIG. 39 represent physical components, FIG. 39 is not intended to be a detailed hardware diagram; thus, many of the components depicted in FIG. 39 may be realized by common constructs or distributed among additional physical components. Moreover, it is contemplated that other existing and yet-to-be developed physical components and architectures may be utilized to implement the functional components described with reference to FIG. 39.

This display 3912 generally operates to provide a user interface for a user, and in several implementations, the display 3912 is realized by a touchscreen display. In general, the nonvolatile memory 3920 is non-transitory memory that functions to store (e.g., persistently store) data and machine readable (e.g., processor executable) code (comprising executable code that is associated with effectuating the methods described herein). In some embodiments for example, the nonvolatile memory 3920 comprises bootloader code, operating system code, file system code, and non-transitory processor-executable code to facilitate the execution of the methods described herein (including, but not limited to, the methods described with reference to flowcharts FIGS. 7, 16-20, and 36).

In many implementations, the nonvolatile memory 3920 is realized by flash memory (e.g., NAND or ONENAND memory), but it is contemplated that other memory types may be utilized as well. Although it may be possible to execute the code from the nonvolatile memory 3920, the executable code in the nonvolatile memory is typically loaded into RAM 3924 and executed by one or more of the N processing components in the processing portion 3926. The non-volatile memory 3920 or RAM 3924 may be utilized for storage of a frequency of the global optimum as described in FIGS. 28-34.

In operation, the N processing components in connection with RAM 3924 may generally operate to execute the instructions stored in nonvolatile memory 3920 to realize aspects of the wideband measurement system 116, 120, the frequency-tuning subsystem 1525, global optimum identification module 2116, the frequency control module 2118 the circuits 2114 and control aspects of the high-frequency generator 102, 1502 (e.g., frequency tuning aspects), the power source 2110 and match 106. For example, non-transitory processor-executable instructions to effectuate aspects of the methods described with reference to FIGS. 7, 16, and 16-20 may be persistently stored in nonvolatile memory 1620 and executed by the N processing components in connection with RAM 3924. As one of ordinarily skill in the art will appreciate, the processing portion 3926 may comprise a video processor, digital signal processor (DSP), graphics processing unit (GPU), and other processing components.

In addition, or in the alternative, the field programmable gate array (FPGA) 3927 may be configured to effectuate one or more aspects of the methodologies described herein (e.g., the methods described with reference to FIGS. 7, 16-20, and 36). For example, non-transitory FPGA-configuration-instructions may be persistently stored in nonvolatile memory 3920 and accessed by the FPGA 3927 (e.g., during boot up) to configure the FPGA 3927 to realize aspects of the wideband measurement system 116, 120 and control aspects of the high-frequency generator 102 (e.g., frequency tuning aspects) and match 106.

The input component may operate to receive signals (e.g., from sensors 114, 118, 1520, 2112, 2312, 2412, 2413) that are indicative of one or more aspects of power. The signals received at the input component may comprise, for example, voltage, current, forward power, reflected power and plasma load impedance. The output component generally operates to provide one or more analog or digital signals (e.g. frequency control signal on the frequency control line 1530) to effectuate operational aspects of the generators 102, 108, match 106, and/or wideband measurements systems 116, 120. For example, the output portion may provide control signals utilized by the oscillators and power amplifiers of generators 102, 108, match 106, and/or wideband measurements systems 116, 120.

The depicted transceiver component 3928 comprises N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. It should be recognized that the various depicted embodiments are not intended to be isolated embodiments. Instead, the several embodiments depicted herein should be viewed to convey several aspects that may be combined. For example, the probe signal and signal detection technologies described with reference to FIGS. 21-38 may be utilized in connection with the frequency tuning algorithms described with reference to FIGS. 1-20. As another example, the filter 104, 904, 1404 and wideband measurement systems 116, 118 may be utilized in connection with the embodiments described with reference to FIGS. 21-38. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power generation system comprising:
   a high-frequency generator configured to apply power to a plasma chamber at a primary frequency;
   a filter configured to couple to an output of the high-frequency generator to suppress mixing products to limit variation of a time-varying load reflection coefficient presented to the high-frequency generator; and
a frequency-tuning subsystem configured to:
apply, while the high-frequency generator is applying power at the primary frequency, a probe signal comprising one or more probe frequencies, wherein the one or more probe frequencies are different than the primary frequency, wherein power of the probe signal is lower than power produced at the primary frequency; and
adjust the primary frequency of the high-frequency generator in response to the one or more probe frequencies indicating an improved measure of performance.

2. The power generation system of claim 1, comprising a low-frequency generator to apply power to the plasma chamber at a low frequency, wherein the filter is configured to suppress mixing products of the primary frequency and the low frequency.

3. The power generation system of claim 2, wherein a frequency ratio of the low-frequency generator to that of the high-frequency generator is between 0.0005 and 0.2.

4. The power generation system of claim 1, wherein power produced at the probe frequencies is between 1 and 100 dB below the power at the primary frequency.

5. The power generation system of claim 1 comprising a delay element configured to couple between the filter and the plasma chamber.

6. The power generation system of claim 1, wherein the measure of performance is a measure of performance selected from the group consisting of: a reflected power; a measure of how far a load impedance seen by the high-frequency generator deviates from a desired impedance; and a measure of load reflection coefficient magnitude.

7. The power generation system of claim 1, wherein the one or more probe frequencies are noise.

8. The power generation system of claim 7 comprising a single oscillator-amplifier combination to produce the primary power signal, and the noise is inherent to the single oscillator-amplifier combination.

9. The power generation system of claim 1, comprising a primary oscillator to generate the primary power signal and a secondary oscillator to generate the one or more probe frequencies.

10. A method for automated frequency tuning of a power generation system, the method comprising:
applying a primary power signal at a primary frequency to a plasma load with a high-frequency generator, either directly or through a matching network;
applying a probe signal at one or more probe frequencies to the plasma load, wherein the one or more probe frequencies are different than the primary frequency, and wherein power produced at the probe frequencies is lower than power produced at the primary frequency;
suppressing mixing products with a filter that is separate from the high-frequency generator to reduce variation of a time-varying load reflection coefficient presented to the high-frequency generator; and
adjusting the primary frequency based upon a measure of performance in response to probe signal.

11. The method of claim 10, wherein the application of the probe signal and the adjustment of the primary frequency are performed cyclically in order to repeatedly improve an accuracy of adjusting the primary frequency towards a global optimum.

12. The method of claim 10, wherein the probe signal is periodic or a sum of periodic signals.

13. The method of claim 10, wherein applying the probe signal comprises sweeping the one or more probe frequencies across a fixed frequency range.

14. The method of claim 10, wherein applying the probe signal comprises tuning a probe signal to a single one of a plurality of different probe frequencies at different times.

15. A plasma processing system comprising:
a plasma chamber;
a high-frequency generator configured to apply power to a plasma chamber at a primary frequency;
a low-frequency generator to apply power to the plasma chamber at a low frequency;
a filter coupled between the high-frequency generator and the plasma chamber that is configured to suppress mixing products of the primary frequency and the low frequency to limit variation of a time-varying load reflection coefficient presented to the high-frequency generator; and
means for frequency tuning the high-frequency generator using a probe signal that is concurrently applied with the power applied to the plasma chamber at the primary frequency wherein the probe signal comprises one or more probe frequencies that are different than the primary frequency.

16. The plasma processing system of claim 15 comprising a match network coupled between the high-frequency generator and the plasma chamber.

17. The plasma processing system of claim 15, wherein a frequency ratio of the low-frequency generator to that of the high-frequency generator is between 0.0005 and 0.2.

18. The plasma processing system of claim 15, wherein power produced at one or more probe frequencies of the probe signal is between 1 and 100 dB below the power at the primary frequency.

19. The plasma processing system of claim 15 wherein the means for frequency tuning comprises means for frequency tuning with a probe signal that comprises noise.

20. The plasma processing system of claim 15, wherein the means for frequency tuning comprises a secondary oscillator, and wherein the high-frequency generator comprises a primary oscillator to generate the primary frequency and the secondary oscillator to generate the probe signal.

* * * * *